(12) United States Patent
Zhao et al.

(10) Patent No.: US 10,700,056 B2
(45) Date of Patent: Jun. 30, 2020

(54) APPARATUS FOR AUTOMOTIVE AND COMMUNICATION SYSTEMS TRANSCEIVER INTERFACES

(71) Applicant: ANALOG DEVICES, INC., Norwood, MA (US)

(72) Inventors: James Zhao, San Francisco, CA (US); Javier Alejandro Salcedo, North Billerica, MA (US); Srivatsan Parthasarathy, Acton, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/125,319

(22) Filed: Sep. 7, 2018

(65) Prior Publication Data

US 2020/0083212 A1   Mar. 12, 2020

(51) Int. Cl.

| H01L 27/02 | (2006.01) |
|---|---|
| H01L 29/417 | (2006.01) |
| H01L 27/06 | (2006.01) |
| H01L 29/08 | (2006.01) |
| H01L 29/06 | (2006.01) |

(Continued)

(52) U.S. Cl.
CPC ........ *H01L 27/0262* (2013.01); *B60R 16/023* (2013.01); *H01L 27/0647* (2013.01); *H01L 29/0649* (2013.01); *H01L 29/0834* (2013.01); *H01L 29/41716* (2013.01); *H01L 29/7412* (2013.01); *H02H 9/045* (2013.01)

(58) Field of Classification Search
None
See application file for complete search history.

(56) References Cited

U.S. PATENT DOCUMENTS

| 3,436,667 A | 4/1969 | Leonard |
|---|---|---|
| 4,331,884 A | 5/1982 | Svedberg |

(Continued)

FOREIGN PATENT DOCUMENTS

| DE | 10 2007 040 875 A1 | 3/2009 |
|---|---|---|
| DE | 10 2013 101 326 A1 | 8/2013 |

(Continued)

OTHER PUBLICATIONS

Taiwanese Office Action dated May 6, 2019 in Taiwanese Patent Application No. 10820425550; 5 pages.

(Continued)

*Primary Examiner* — Sonya D. McCall-Shepard
(74) *Attorney, Agent, or Firm* — Knobbe, Martens, Olson & Bear, LLP

(57) ABSTRACT

A communication interface protection device includes a first electrical overstress (EOS) protection switch electrically connected to a first terminal and a second EOS protection switch electrically connected to a second terminal. Each of the first and second EOS protection switches includes a first semiconductor-controlled rectifier (SCR) and a second SCR and a first diode having a cathode electrically connected to an anode of the first SCR and a second diode having a cathode electrically connected to an anode of the second SCR. The first EOS protection device is configured to be activated in response to an EOS condition that causes a first bias between the first and second terminals, and wherein the second EOS protection device is configured to be activated in response to an EOS condition that causes a second bias between the first and second terminals.

22 Claims, 49 Drawing Sheets

(51) Int. Cl.
    *H01L 29/74* (2006.01)
    *H02H 9/04* (2006.01)
    *B60R 16/023* (2006.01)

(56) References Cited

U.S. PATENT DOCUMENTS

| | | |
|---|---|---|
| 4,633,283 A | 12/1986 | Avery |
| 5,061,652 A | 10/1991 | Bendernagel et al. |
| 5,182,220 A | 1/1993 | Ker et al. |
| 5,276,582 A | 1/1994 | Merrill et al. |
| 5,341,005 A | 8/1994 | Canclini |
| 5,343,053 A | 8/1994 | Avery |
| 5,369,041 A | 11/1994 | Duvvury |
| 5,541,801 A | 7/1996 | Lee et al. |
| 5,576,557 A | 11/1996 | Ker et al. |
| 5,615,074 A | 3/1997 | Avery |
| 5,652,689 A | 7/1997 | Yuan |
| 5,663,860 A | 9/1997 | Swonger |
| 5,742,084 A | 4/1998 | Yu |
| 5,745,323 A | 4/1998 | English et al. |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,840 A | 4/1999 | Ohuchi et al. |
| 5,895,940 A | 4/1999 | Kim |
| 5,998,813 A | 12/1999 | Bernier |
| 6,097,068 A | 8/2000 | Brown et al. |
| 6,104,589 A | 8/2000 | Williamson |
| 6,137,140 A | 10/2000 | Efland et al. |
| 6,144,542 A | 11/2000 | Ker et al. |
| 6,172,403 B1 | 1/2001 | Chen |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,538,266 B2 | 3/2003 | Lee et al. |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,784,489 B1 | 8/2004 | Menegoli |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,217,461 B1 | 7/2012 | Chu et al. |
| 8,218,276 B2 | 7/2012 | Mallikarjunaswamy |
| 8,222,698 B2 | 7/2012 | Salcedo et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,686,470 B2 | 4/2014 | Ritter |
| 8,772,091 B2 | 7/2014 | Salcedo et al. |
| 8,796,729 B2 | 8/2014 | Clarke et al. |
| 8,829,570 B2 | 9/2014 | Salcedo et al. |
| 8,860,080 B2 | 10/2014 | Salcedo et al. |
| 8,890,248 B2 | 11/2014 | Pauletti et al. |
| 8,946,822 B2 | 2/2015 | Salcedo et al. |
| 8,947,841 B2 | 2/2015 | Salcedo et al. |
| 8,963,200 B2 | 2/2015 | Lee et al. |
| 9,006,781 B2 | 4/2015 | Salcedo et al. |
| 9,006,782 B2 | 4/2015 | Salcedo |
| 9,831,233 B2 | 11/2017 | Salcedo |
| 9,831,666 B2 | 11/2017 | Parthasaraathy et al. |
| 9,871,373 B2 | 1/2018 | O'Donnell et al. |
| 9,929,142 B2 | 3/2018 | Ivanov et al. |
| 9,954,356 B2 | 4/2018 | Parthasarathy et al. |
| 10,008,490 B2 | 6/2018 | Salcedo et al. |
| 2001/0040254 A1 | 11/2001 | Takiguchi |
| 2002/0021538 A1 | 2/2002 | Chen et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2004/0135229 A1 | 7/2004 | Sasahara |
| 2004/0164351 A1 | 8/2004 | Petruzzello et al. |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0173727 A1 | 8/2005 | Manna et al. |
| 2005/0195540 A1 | 9/2005 | Streibl et al. |
| 2005/0269641 A1 | 12/2005 | Lai et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0151836 A1 | 7/2006 | Salcedo et al. |
| 2006/0186467 A1 | 8/2006 | Pendharkar et al. |
| 2007/0007545 A1 | 1/2007 | Salcedo et al. |
| 2007/0034956 A1 | 2/2007 | Lee et al. |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2009/0032838 A1 | 2/2009 | Tseng et al. |
| 2009/0034137 A1 | 2/2009 | Disney et al. |
| 2009/0045457 A1 | 2/2009 | Bodbe |
| 2009/0057715 A1 | 3/2009 | Ryu et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |

(56) References Cited

U.S. PATENT DOCUMENTS

| | | | |
|---|---|---|---|
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1 | 1/2012 | Salcedo |
| 2012/0199874 A1 | 8/2012 | Salcedo et al. |
| 2012/0205714 A1 | 8/2012 | Salcedo et al. |
| 2012/0211869 A1 | 8/2012 | Lee et al. |
| 2012/0293904 A1 | 11/2012 | Salcedo et al. |
| 2013/0032882 A1 | 2/2013 | Salcedo et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0339601 A1 | 11/2014 | Salcedo et al. |
| 2014/0346563 A1 | 11/2014 | Salcedo |
| 2015/0076557 A1 | 3/2015 | Salcedo et al. |
| 2016/0141358 A1 | 5/2016 | Salcedo et al. |
| 2016/0204096 A1 | 7/2016 | Zhao et al. |
| 2016/0300830 A1 | 10/2016 | Salcedo |
| 2017/0317070 A1 | 11/2017 | Salcedo |
| 2017/0366002 A1 | 12/2017 | Zhao et al. |
| 2018/0026440 A1 | 1/2018 | Zhao et al. |
| 2018/0158814 A1 | 6/2018 | Salcedo et al. |
| 2018/0211951 A1 | 7/2018 | Luo et al. |
| 2018/0226788 A1 | 8/2018 | Salcedo et al. |
| 2019/0051646 A1 | 2/2019 | Salcedo et al. |
| 2019/0131787 A1 | 5/2019 | He et al. |

FOREIGN PATENT DOCUMENTS

| | | |
|---|---|---|
| EP | 0 168 678 A2 | 1/1986 |
| EP | 0 915 508 A1 | 5/1999 |
| EP | 1 703 560 A2 | 9/2006 |
| JP | 2007-012864 | 1/2007 |
| JP | 2007-129163 | 5/2007 |
| JP | 2010-153798 | 7/2010 |
| KR | 10-2005-0098458 A | 10/2005 |
| KR | 10-2006-0067100 | 2/2006 |
| KR | 10-2009-0123683 | 12/2009 |
| KR | 10-2010-0003569 | 1/2010 |
| WO | WO 2012/005936 A1 | 1/2012 |

OTHER PUBLICATIONS

Anderson et al., ESD Protection under Wire Bonding Pads, EOS/ESD Symposium 99-88, pp. 2A.4.1-2A.4.7 (1999).

Betak, Petr, "An Advanced SCR Protective Structure Against ESD Stress". Proceedings of the 13th Conference Student EEICT 2007, vol. 4, Jan. 2007, pp. 286-290.

Chang et al., High-k Metal Gate-bounded Silicon Controlled Rectifier for ESD Protection, 34th Electrical Overstress/Electrostatic Discharge Symposium, Sep. 2012, 7 pages.

Chia-Tsen Dai, Ming-Dou Ker, IEEE International Conference on Microelectronic Test Structures (ICMTS), 4 pages, Mar. 2013.

European Examination Report dated Sep. 27, 2016 for Application No. 14167969.6 in 6 pages.

European Patent Office Search Report for Application No. EP 14 16 7869 dated Oct. 24, 2014 10 pages.

Jang, Sheng "Novel diode-chain Triggering SCR circuits for ESD protection" Solid-State Elec vol. 44, Iss.7 Jul. 1, 2000 pp. 1297-1303.

Luh et al. A Zener-Diode-Activated ESD Protection Circuit for Sub-Micron CMOS Processes, Circuits and Systems, IEEE International Symposium, May 28-31, 2000, Geneva, Switzerland, 4 pages.

Parthasarathy, S., Salcedo, J.A., Hajjar, J., Analog Devices, Wilmington, MA, USA, Design of SCR Devices for SiGe BiCOMS Applications, Bipolar/BiCOMS Circuits and Technology Meeting (BCTM), 2011 IEEE, p. 235-238.

R. Rudolf, C. Wagner, L. O'Riain, K. Gebhardt, B. Kuhn-Heinrich, B. von Ehrenwall, A. von Ehrenwall, M. Strasser, M. Stecher, U. Glaser, S. Aresu, P. Kuepper, A. Mayerhofer, IEEE International Symposium on Power Semiconductor Devices and ICs, 4 pages, May 2011.

Salcedo et al., "Bidirectional Devices for Automotive-Grade Electrostatic Discharge Applications", IEEE Electron Device Letters, vol. 33, No. 6, Jun. 2012, 3 pages.

Salcedo et al., Electrostatic Discharge Protection Framework for Mixed-Signal High Voltage CMOS Applications, IEEE Xplore, downloaded Feb. 23, 2010 at 12:53 EST, 4 pages.

Salcedo et al., On-Chip Protection for Automotive Integrated Circuits Robustness, 2012 8th International Caribbean Conference on Devices, Circuits and Systems (ICCDCS), 5 pages, Mar. 2012.

Xi et al. "Design and Characterization of ESD Solutions with EMC Robustness for Automotive Applications", Microelectronics Reliability 55 (2015) 2236-2246.

Office Action dated Aug. 5, 2019 in Japanese Patent Application No. 2018-150118; 4 pages.

Office Action dated Jan. 14, 2020 in Japanese Patent Application No. 2018-150118; 3 pages.

Office Action dated May 6, 2019 in Taiwan Patent Application No. 107126640; 9pages.

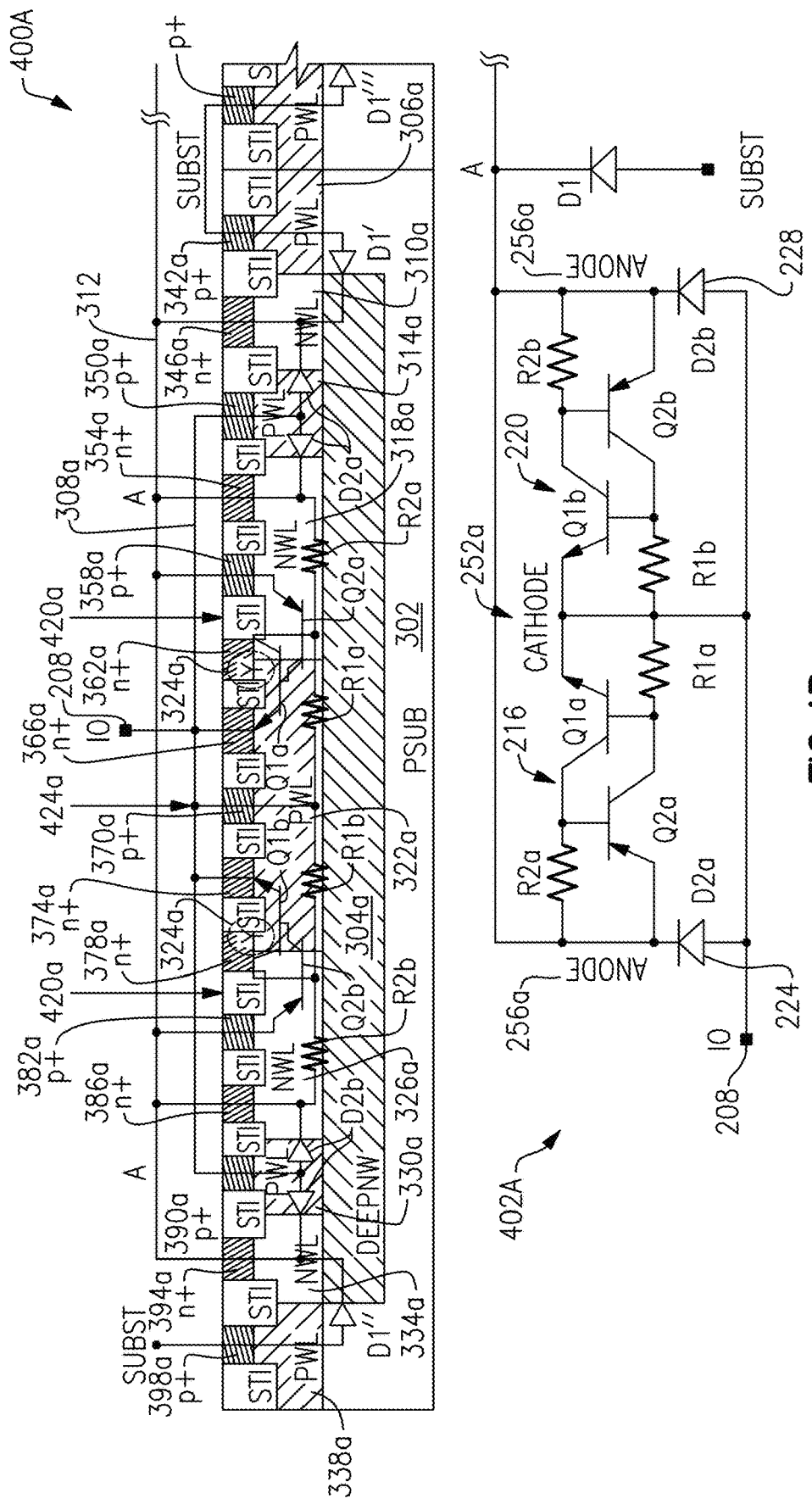

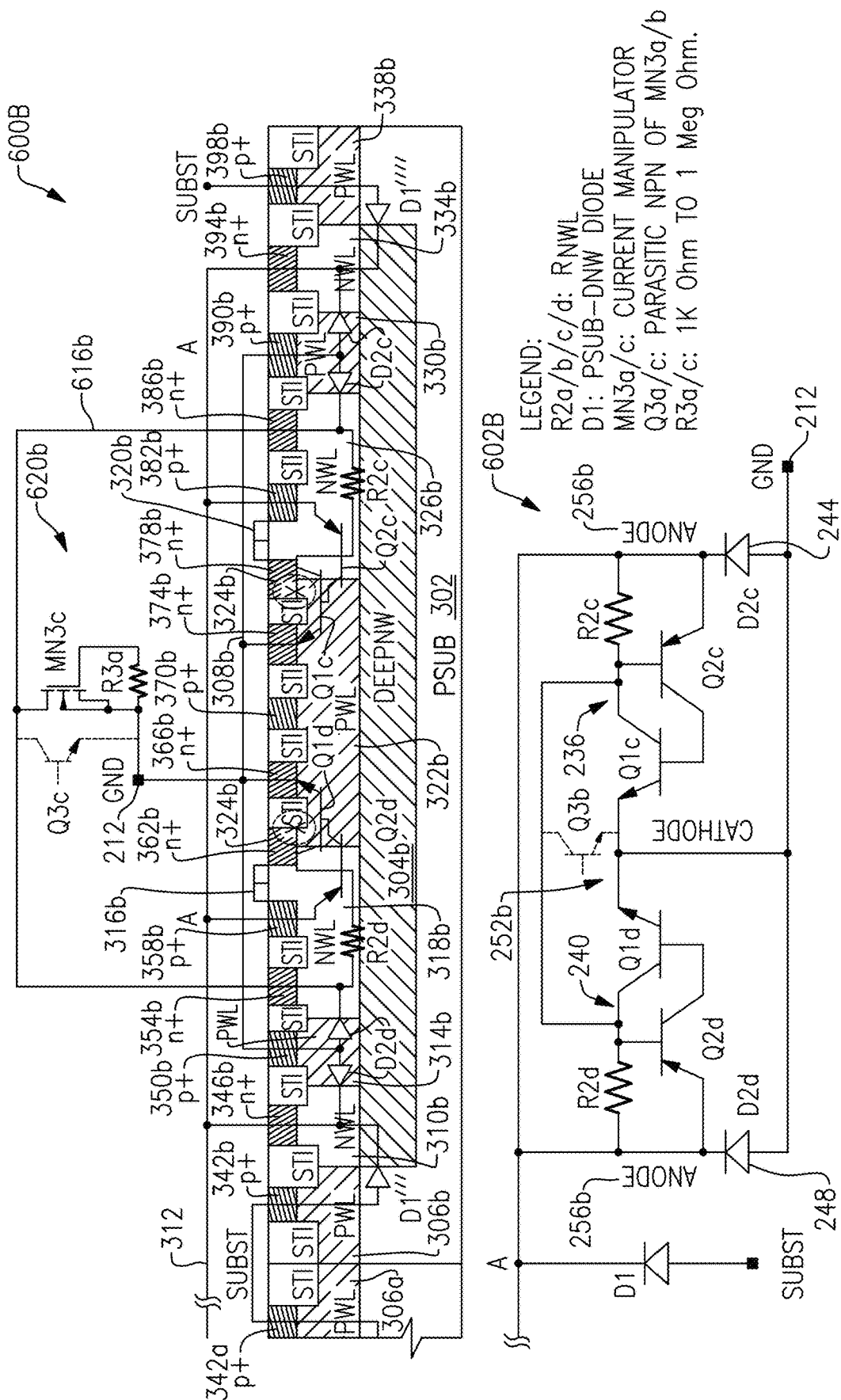

APPARATUS FOR AUTOMOTIVE AND COMMUNICATION SYSTEMS TRANSCEIVER INTERFACES

BACKGROUND

Field

The disclosed technology relates to electronics, and more particularly to devices for providing protection from transient electrical events, such as electrical overstress/electrostatic discharge, in automotive and communication systems transceiver interfaces.

Description of the Related Technology

Electronic systems can be exposed to transient electrical events that last a relatively short duration and have rapidly changing voltages and/or currents. Transient electrical events can include, for example, electrostatic discharge (ESD) or electromagnetic interference events arising from inductive generation or the abrupt release of charge from an object or person to an electronic system.

Transient electrical events can damage integrated circuits (ICs) inside an electronic system due to overvoltage conditions and/or high levels of power dissipation over relatively small areas of the ICs. This rapid and high dissipation of power can potentially lead to damages to core circuits arising from, e.g., gate oxide punch-through, junction damage, metal damage, and surface charge accumulation, among other damaging phenomena. Moreover, transient electrical events can induce latch-up (in other words, inadvertent creation of a low-impedance path), thereby disrupting the functioning of the ICs and causing permanent damage to the ICs.

SUMMARY

In an aspect, a communication interface protection device comprises a first electrical overstress (EOS) protection switch electrically connected to a first terminal and a second EOS protection switch electrically connected to a second terminal. Each of the first and second EOS protection switches comprises a first semiconductor-controlled rectifier (SCR), and a second SCR, a first diode having a cathode electrically connected to an anode of the first SCR and a second diode having a cathode electrically connected to an anode of the second SCR. The first EOS protection device is configured to have a relatively high impedance within a predetermined operation voltage and to activate in response to an EOS condition that causes a first bias between the first and second terminals, and the second EOS protection device is configured to activate in response to an EOS condition that causes a second bias between the first and second terminals.

In another aspect, a communication interface protection device comprises a semiconductor substrate having formed therein a first device region and a second device region each electrically isolated from the substrate by a tub isolation. The protection device additionally comprises a first electrical overstress (EOS) protection switch formed in the first device region and a second EOS protection switch formed in the second device region. Each of the first and second EOS protection switches comprises a first semiconductor-controlled rectifier (SCR) and a second SCR, wherein anodes of the first and second SCRs are commonly connected through a first metallization path and cathodes of the first and second SCRs are commonly connected through a second metallization path. The second metallization path of the first EOS protection device is connected to a first terminal and the second metallization path of the second EOS protection device is connected to a second terminal. In addition, the first metallization paths of the first and second EOS protection devices are commonly connected.

In yet another aspect, a communication interface protection device is configured to protect a signal processing circuit. The protection device comprises a first electrical overstress (EOS) protection switch electrically connected to a first terminal and a second EOS protection switch electrically connected to a second terminal. Each of the first and second EOS protection switches comprises a first semiconductor-controlled rectifier (SCR) and a second SCR, a selective activation means for selectively activating the first and second SCRs in response to an EOS condition that causes one but not the other of a positive bias and a negative bias between the first and second terminals, and a holding voltage adjustment means for adjusting a holding voltage of one or both of the first and SCRs to be lower than an operational voltage of the core circuit.

BRIEF DESCRIPTION OF THE DRAWINGS

FIG. 4B schematically illustrates a cross-sectional view (top) and a corresponding equivalent circuit diagram (bottom) of a first device region of the bidirectional communication interface protection device illustrated in FIG. 4A.

FIG. 6C schematically illustrates a cross-sectional view (top) and a corresponding equivalent circuit diagram (bottom) of a second device region of the bidirectional communication interface protection device illustrated in FIG. 6A.

FIG. 6I displays positive waveforms corresponding to the IV curves illustrated in FIG. 6H.

FIG. 6O displays experimental IV curves obtained under 100 ns pulse width transmission line pulse (TLP) testing condition from a bidirectional communication interface protection device illustrated in FIGS. 6A-6D.

DETAILED DESCRIPTION

Figure 1A:
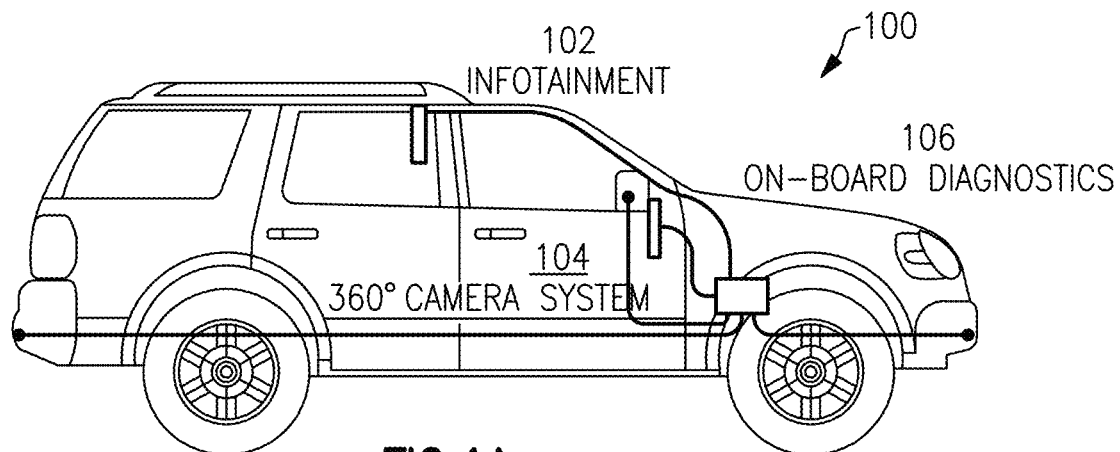
FIG. 1A schematically illustrates an automotive infotainment communication system that includes a satellite camera array, bidirectional communication interfaces, and communication interfaces protection devices, according to embodiments.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

Emerging integrated circuits (ICs) for various applications including automotive electronics, e.g., electronics for autonomous driving, and other consumer electronics that are fabricated using low voltage CMOS processes are increasingly using input/output (I/O) interface pins that may be exposed to harsh environments and are designed to comply with applicable electrostatic discharge (ESD) and electromagnetic interference immunity (EMI) specifications. Robust ESD and EMI immunity is desirable because the ICs can be subject to a wide range of high voltage transient electrical events that exceed ordinary operating conditions.

The transient electrical events can be, e.g., a rapidly changing high energy signal such as an electrostatic discharge (ESD) event. The transient electrical event can be associated with an overvoltage event caused by a user contact. In other circumstances, the transient electrical event can be generated by a manufacturer to test the robustness of the transceiver integrated circuit under a defined stress condition, which can be described by standards set by various organizations, such as the Joint Electronic Device Engineering Council (JEDEC), the International Electrotechnical Commission (IEC), and the Automotive Engineering Council (AEC).

Various techniques can be employed to protect a core or a main circuitry of the ICs against these damaging transient electrical events. Some systems employ external off-chip protection devices to ensure that core electronic systems are not damaged in response to the transient electrostatic and electromagnetic events. However, due to performance, cost, and spatial considerations, there is an increasing need for protection devices that are monolithically integrated with the main circuitry, that is, the circuitry to be protected Electronic circuit reliability is enhanced by providing protection devices to the pins or pads of an IC. This can be particularly critical in some applications, e.g., autonomous driving applications, in which the degree of desired integrated circuit reliability can be particularly high. The protection devices can maintain the voltage level at the pads within a predefined safe range by transitioning from a high-impedance state to a low-impedance state when the voltage of the transient electrical event reaches a trigger voltage. Thereafter, the protection device can shunt at least a portion of the current associated with the transient electrical event before the voltage of a transient electrical event reaches a positive or negative failure voltage that can lead to one of the most common causes of IC damage. The protection devices can be configured, for example, to protect an internal circuit against transient signals that exceed the IC power high and power low (for instance, ground) voltage supply levels. It can be desirable for a protection device to be configurable for different current and voltage (I-V) blocking characteristics and able to render protection against positive and negative transient electrical events with fast operational performance and low static power dissipation at normal operating voltage conditions.

Some electronic systems, e.g., automotive interfaces, programmable logic controllers, instrument amplifiers and communication interfaces with distributed remote nodes and sensors, may need protection devices that can meet many competing needs including optimized blocking voltage, high current handling capability, fast response times and sufficient holding voltage, to name a few. For example, the protection devices may need to protect the core circuits from high voltage EOS conditions while providing sufficient holding voltage that is high enough to prevent latch-up to prevent damage to the core circuit, while also being configured to respond rapidly to very short transient stresses and provide high current handling capabilities.

One technology application area where the protection requirements are increasingly becoming more complex in terms of speed balanced with current and voltage handling capabilities is communication interface protection architectures for automotive communication systems using advanced CMOS process technology, such as specialized automotive infotainment video link applications and autonomous driving satellite sensors communication interfaces, without limitation. Designing communication interface protection device architectures using advanced CMOS processes to meet stringent requirements in these applications can be particularly challenging, because advanced and/or low voltage CMOS technologies can more susceptible to stress induced damage. In addition, because high voltage dopant implants may not be available for use in some advanced CMOS processes, and due to design constraints that might place limits in resistance specifications that can be tolerated for high performance video communication interfaces, designing a suitable interface protection device having suitably high stress handling capabilities, for instance the capability to handle, e.g., 8,000V and 30 A as provided by ISO10605 system level specifications, can be challenging. A suitable communication interface protection system for these applications should have at least the following attributes:

1. Sustain high power/fast transient stress conditions at the system level, in both powered and unpowered states.

2. Safely protect core devices in a system integrated circuit (IC) against ESD events.

3. Not interrupt the system IC's normal operations during power-up ESD events.

4. Satisfy system-level DPI and BCI EMC robustness classification.

Designing interface protection devices to meet each one of the above attributes adds complexity to the overall design. Example criteria for satisfying the attributes 1 and 2 above may include the 8,000V direct contact ISO10605 Section-9 criteria under an unpowered state. Example criteria for satisfying attributes 1-3 above may include the 4,000V Level-A ISO10605 Section-8 criteria under a powered-up state. Example criteria for satisfying the attribute 4 above may include the Direct Power Injection (DPI) and Bulk Current Injection (BCI) EMC test.

To meet the competing requirements as discussed above, and to provide to protect core circuits having different operational voltages, communication interface protection device architectures according to various embodiments described herein can be customized to provide different trigger and hold voltages. To meet various competing requirements, protection devices according to various embodiments comprises a plurality of electrical overstress (EOS) protection switches that are laterally arranged to have a first electrical overstress (EOS) protection switch electrically connected to a first terminal and a second EOS protection switch electrically connected to a second terminal. For example, the plurality of EOS protection switches includes a first EOS protection formed in a first device region and a second EOS protection switch formed in a second device region.

Each of the first and second EOS protection switches comprises a first semiconductor-controlled rectifier (SCR) and a second SCR, a selective activation means for selectively activating the first and second SCRs in response to an EOS condition that causes one but not the other of a positive bias and a negative bias between the first and second terminals. The selective activation means comprises, e.g., a first diode having a cathode electrically connected to an anode of the first SCR and a second diode having a cathode electrically connected to an anode of the second SCR. Advantageously, using the selective activation means, different the EOS switches formed in different device regions can be activated to dissipate EOS current having opposite polarities. In addition, each of the first and second device regions comprise a plurality of p-doped wells and n-doped wells that are arranged in an annular configuration, further increasing high current handling capabilities. The lateral positioning and/or annular arrangement can be designed to achieve a high current handling capability while reducing or minimizing current crowding, which may be caused by high current, e.g., snapback induced from the SCRs.

Each of the first and second EOS protection switches additionally includes a trigger voltage and/or holding voltage adjustment means for adjusting one or both of a trigger voltage and a holding voltage of one or both of the first and SCRs. Using such means, the trigger voltage can be advantageously adjusted to, e.g., adjust the sensitivity and to reduce or minimize false triggering of the SCRs. The holding voltage can be advantageously adjusted to lower than an operational voltage of the core circuit to reduce or minimize the risk of latch up that can occur when the holding voltage of higher than the operational voltage of the core circuit. Thus, depending on the operational voltages of the core circuits in communication interface integrated circuits for automotive applications, the risk of false latch up can be reduced or minimized.

In some applications, the communication interface protection device architectures described herein can be customized to protect core circuits operating at relatively low voltages (e.g., <about ±2 V) and under relatively small bi-polar signals, while having high-stress current handling capabilities. Without limitation, embodiments described with respect to FIGS. 2A-2E can be configured to meet these and other needs. In some other applications, the communication interface protection device architectures described herein can be customized to protect core circuits operating at relatively medium voltages, (e.g., between about ±2 V and about ±4 V) and under relatively small bi-polar signals, while having high-stress current handling capabilities. Without limitation, embodiments described with respect to FIGS. 4A-4C and 5A-5B can be configured to meet these and other needs. In some other applications, the communication interface protection device architectures described herein can be customized to protect core circuits operating at relatively high voltages, (e.g., about ±5V and higher) and under relatively small bi-polar signals, while having high-stress current handling capabilities. Without limitation, embodiments described with respect to FIGS. 6A-6C and 7A-7B can be configured to meet these and other needs. In yet some other embodiments, e.g., embodiments described with respect to FIGS. 8A-8D without limitation, the communication interface protection device architectures can be customized to protect core circuits operating at one of relatively low, medium and high voltages in one polarity, while protecting the core circuits operating at another one of relatively low, medium and high voltages in an opposite polarity. Thus, for different applications, the versatile designs of communication interface protection device architectures enabled by embodiments described herein can be configured to have active-controlled triggering, customized holding voltage and/or customized levels of high current handling capabilities. Various device architectures described herein can enable new generation video link communication transceiver applications in advanced CMOS process technology, with wide application in automotive, industry 4.0, and IoT (internet of things), to name a few. These design solutions can achieve target video communication performance while meeting stringent EMC (electromagnetic compatibility) safety requirements, which may be encountered in mission-critical automotive and other harsh environment applications, while reducing video communication system implementation cost.

FIG. 1A schematically illustrates an automotive communication system 100 that includes a bidirectional communication interface protection device, according to embodiments. The automotive communication system 100 can include various sub systems, such as an infotainment system 102, a camera system 104 and an on-board diagnostics system 106, according to embodiments.

Figure 1B:
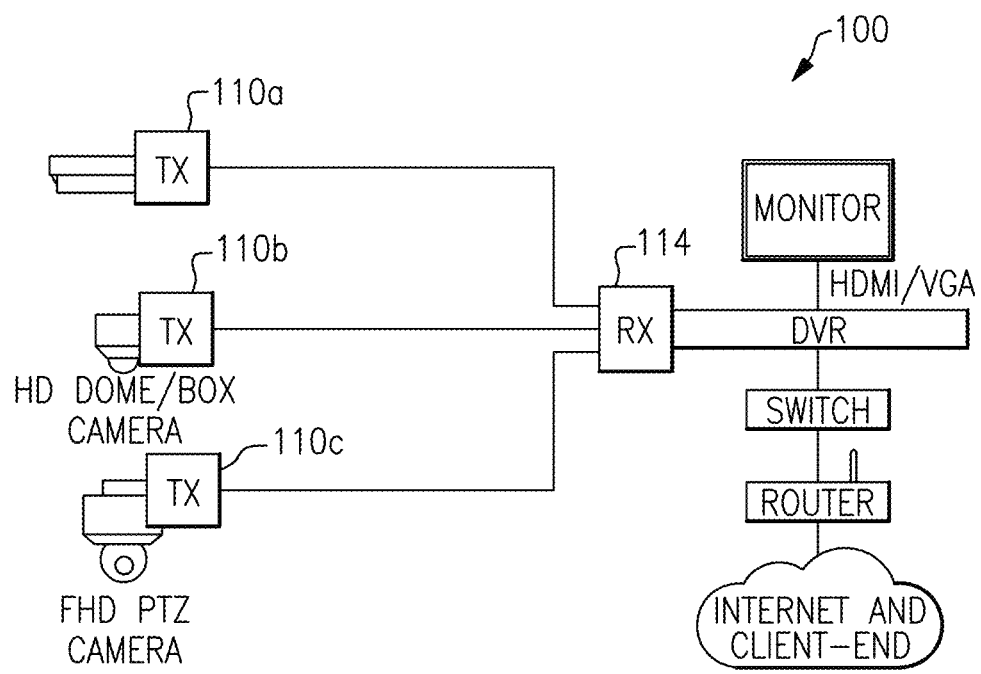
FIG. 1B schematically illustrates a block diagram of an automotive video communication transmitters (TX) and receivers (RX) system that includes cameras, bidirectional communication interfaces and communication interfaces protection devices, according to embodiments.

FIG. 1B schematically illustrates a block diagram of an automotive communication system 100 that includes a bidirectional communication interface protection device, according to embodiments. The communication system 100 includes a video communication distribution network including a receiver (RX) integrated circuit (IC) 114 and various transceiver ICs (TX) 110a, 110b, 110c, each of which can be a source of EOS events, in an automotive environment to serve different functions, e.g., for human-machine interface, safety and autonomous driving to name a few.

Figure 1C:
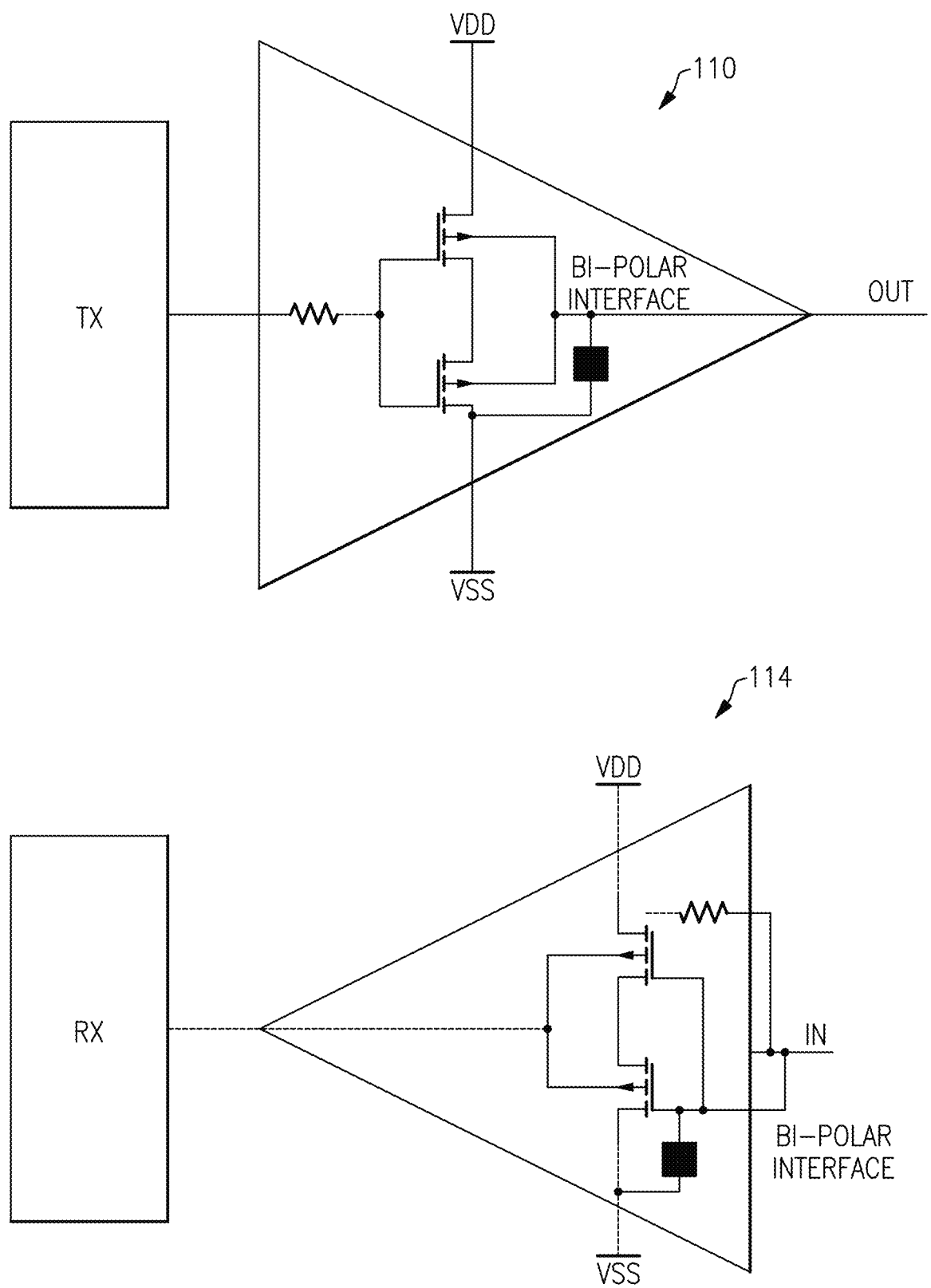
FIG. 1C schematically illustrates example interface integrated circuits for an automotive communication system including a transmitter, a receiver, and a bidirectional communication interface protection device, according to embodiments.

FIG. 1C schematically illustrates example interface ICs included in an automotive communication system, including a TX interface IC 110 and an RX interface IC 114. Each of the TX interface IC 110 and the RX interface IC includes a bidirectional communication interface protection device, according to various embodiments described herein.

The transceiver interfaces described above with respect to FIGS. 1A-1C illustrate examples transceiver interfaces that can be implemented with a transceiver integrated circuits having a bidirectional communication interface protection device described herein. However, the transceiver interfaces can be implemented in other ways to meet communication protocol constraints.

Additionally, although the bidirectional communication interface protection devices have been illustrated in the context of transceiver interfaces for automotive applications, the clamp devices described herein can be used in a wide range of ICs and other electronics in other applications, including, for example, industrial control systems, interface systems, power management systems, microelectromechanical system (MEMS) sensor systems, automotive systems, wireless infrastructure systems, and/or digital signal processing (DSP) systems. Additionally, the bidirectional protection devices can be connected in other ways. For example, the terminals of the clamp devices can be connected in other ways, such as to other nodes and/or voltages.

Figure 2A:
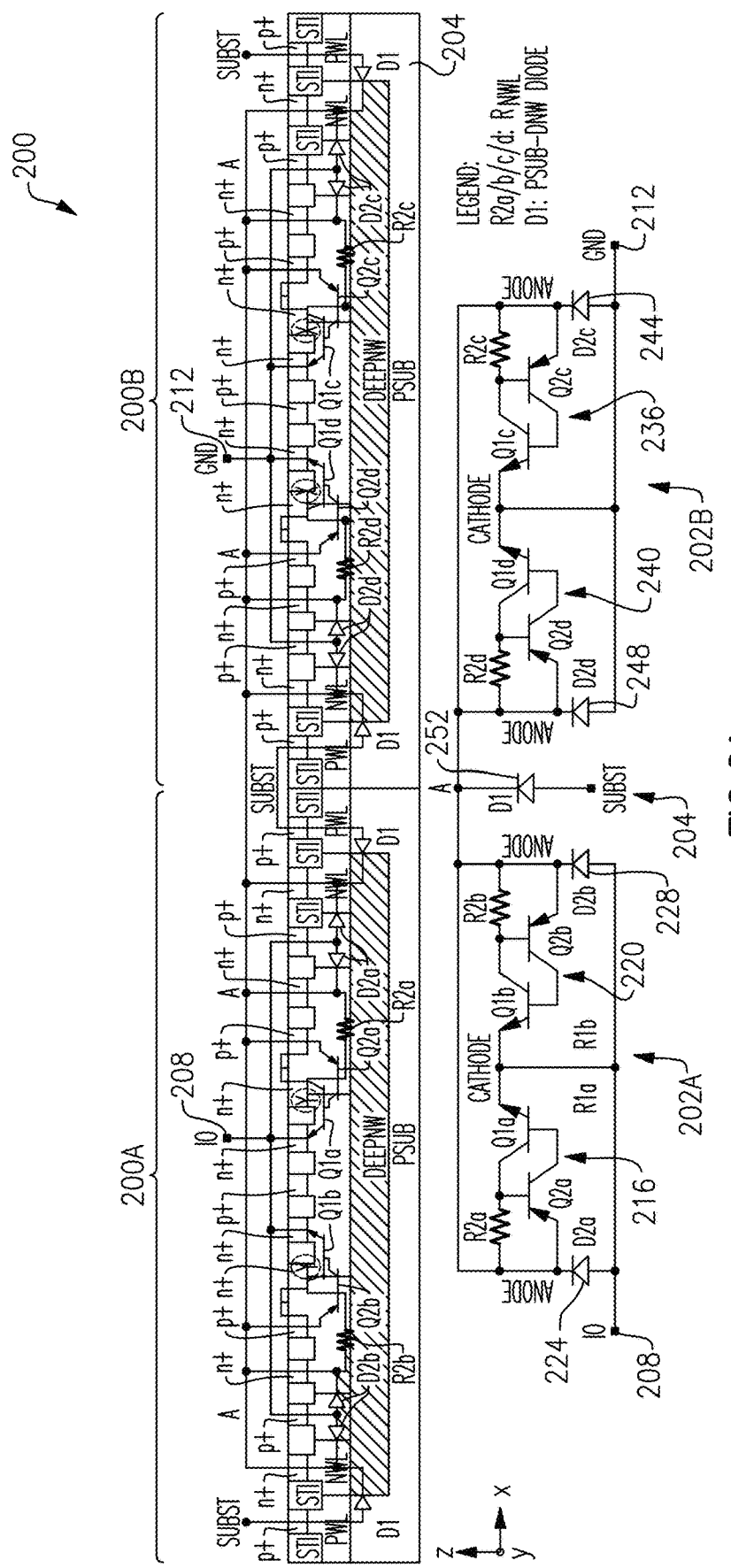
FIG. 2A schematically illustrates a cross-sectional view (top) and a corresponding equivalent circuit diagram (bottom) of a bidirectional communication interface protection device, according to embodiments.
Figure 2B:
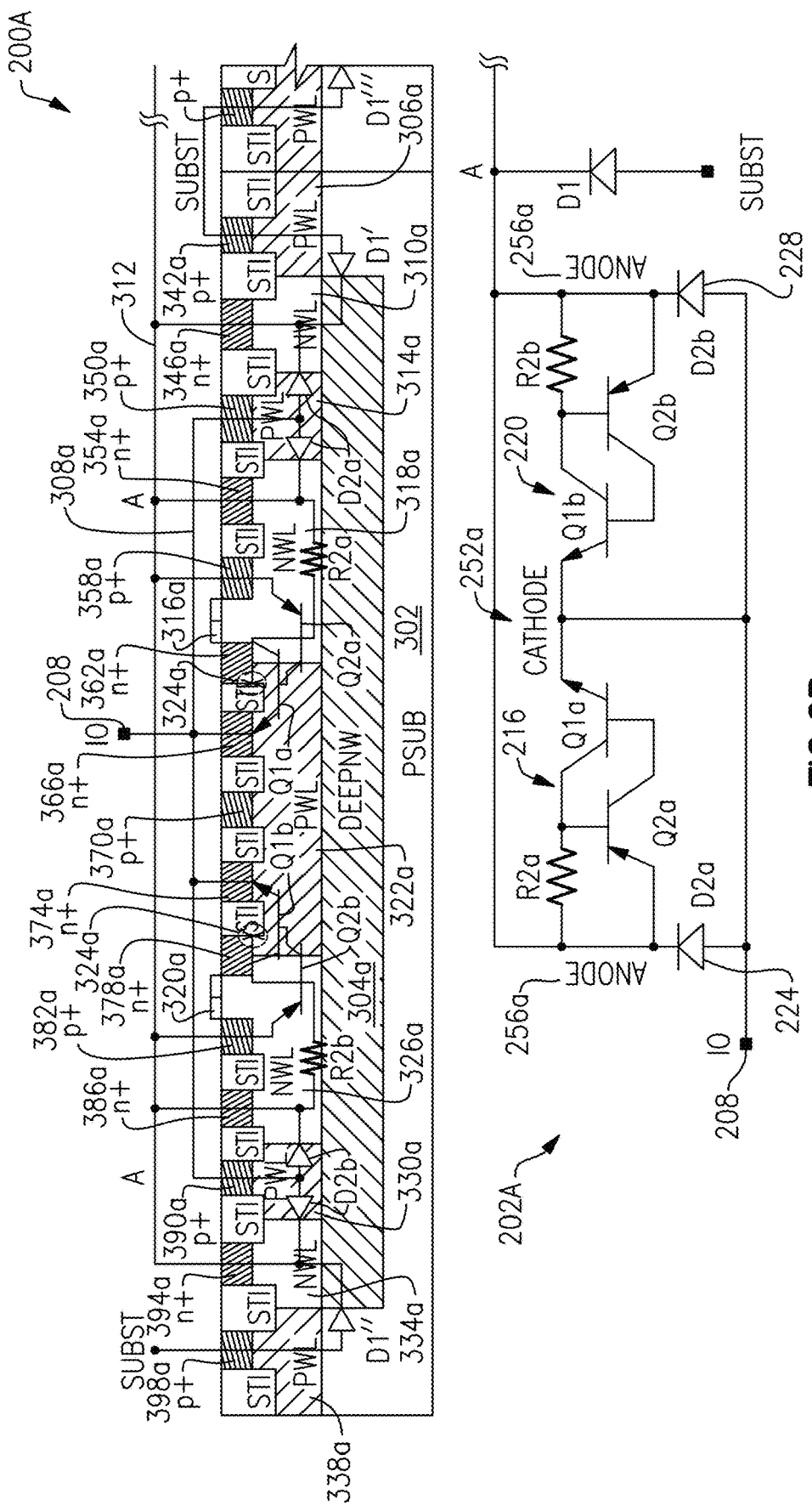
FIG. 2B schematically illustrates a cross-sectional view (top) and a corresponding equivalent circuit diagram (bottom) of a first device region of the bidirectional communication interface protection device illustrated in FIG. 2A.
Figure 2C:
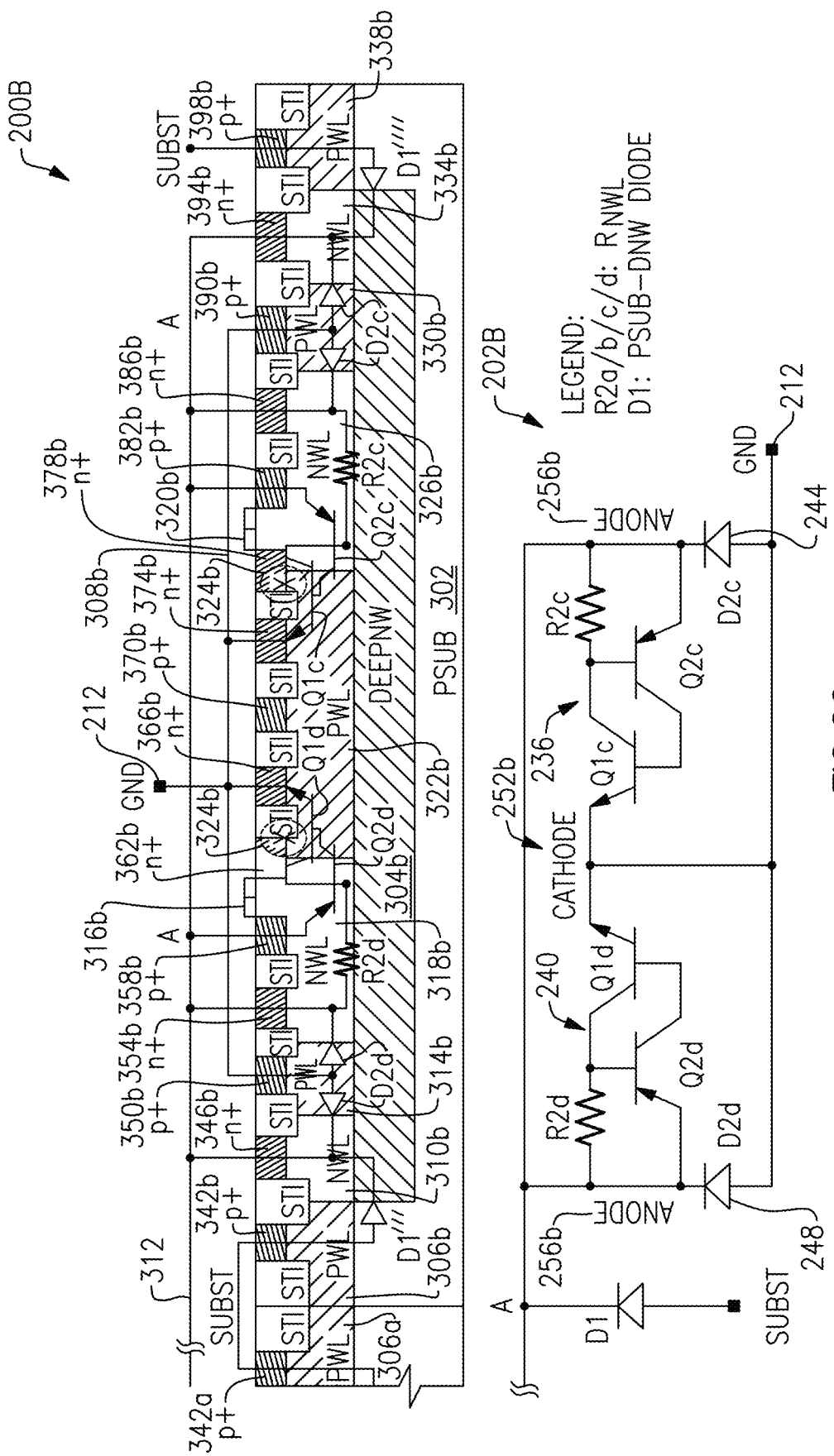
FIG. 2C schematically illustrates a cross-sectional view (top) and a corresponding equivalent circuit diagram (bottom) of a second device region of the bidirectional communication interface protection device illustrated in FIG. 2A.

FIGS. 2A-2E schematically illustrates a bidirectional communication interface protection device 200, according to embodiments. Without limitation, the communication interface protection device 200 can be customized to protect core circuits operating at relatively low voltages (e.g., <about ±2 V) and under relatively small bi-polar signals, while having high-stress current handling capabilities. FIG. 2A schematically illustrate a cross-sectional view (top) of a device region and a corresponding equivalent circuit diagram (bottom) of a 200, according to embodiments. The protection device 200 comprises a first device region 200A and a second device region 200B formed in the substrate 204. Each of the first and second device regions 200A and 200B comprises various wells formed in an annular arrangement, as described in more detail below (FIGS. 2D-2D), and can be formed laterally adjacent to each other. According to embodiments, the first and second device regions 200A and 200B may be formed in a common semiconductor substrate 204. FIGS. 2B and 2C illustrate detailed views of the first and second device regions 200A and 200B, respectively. An equivalent circuit diagram of the overall physical arrangement of the integrated circuit 200 is illustrated in FIG. 2A. A detailed description of the cross-sectional views of the physical arrangements of different semiconductor regions, and corresponding equivalent circuit diagrams thereof, of the first and second device regions 200A and 200B are described with respect to FIGS. 2B and 2C, respectively.

Referring to FIG. 2A (top), the first device region 200A formed in the semiconductor substrate 204 is electrically isolated therefrom by an isolation structure, e.g., a tub isolation. The first device region 200A comprises a first electrical overstress (EOS) protection switch 202A electrically connected to a first terminal 208, e.g., one of an input/output (IO) or a ground (GND). The second device region 200B formed in the semiconductor substrate 204 is electrically isolated therefrom by an isolation structure, e.g., a tub isolation. The second device region 200B comprises a second EOS protection switch 202B electrically connected to a second terminal 212, e.g., the other of the IO or the GND.

Referring to the equivalent circuit diagram of the transceiver integrated circuit 200 depicted in FIG. 2A (bottom), the first EOS protection switch 202A of the first device region 200A comprises a first semiconductor-controlled rectifier (SCR) 216 and a second SCR 220, and further comprises a first diode 224 and a second diode 228. The first diode 224 has a cathode, e.g., an n-type region, electrically connected to an anode, e.g., a type-region, of the first SCR 216, and the second diode 228 has a cathode electrically connected to an anode of the second SCR 220. As configured, the first and second diodes 224, 228 serve as decouple reverse diodes which, under a bias having a first polarity between the first and second terminals 208, 212, e.g., a negative bias therebetween, the first and second diodes (D2a, D2b) 224, 228 are configured to be reverse-biased to provide a relatively high blocking voltage to suppress the activation of the first and second SCRs 216, 220 of the first EOS protection switch 202A disposed in the first device region 200A, while under a bias having a second polarity opposite to the first polarity between the first and second terminals 208, 212, e.g., positive bias therebetween, the D2a, D2b 224, 228 are configured to be forward-biased to provide a relatively low blocking voltage to facilitate the activation of the first and second SCRs 216, 220 of the first EOS protection switch 202A disposed in the first device region 200A.

Still referring to FIG. 2A (bottom), the second electrical EOS protection switch 202B of the second device region 200B comprises, in an analogous manner to the first device region 200A, a third SCR 236 and a fourth SCR 240, and further comprises third and fourth diodes (D2c, D2d) 244, 248. The cathodes of the D2c, D2d 244, 248 are electrically connected to anodes of the third and fourth SCRs 236, 240, respectively. As configured, the D2c, D2d 244, 248 serve as decouple reverse diodes which operate in an analogous manner as described above with respect to the D2a, D2b 224, 248, but under an opposite polarity sense. That is, under a first polarity between the first and second terminals 208, 212, e.g., a negative bias therebetween, the D2c, D2d 244, 248 are configured to be forward-biased to provide a relatively low blocking voltage to facilitate the activation of the third and fourth SCRs 236, 240 of the second EOS protection switch 202B disposed in the second device region 200B, while under a second polarity opposite the first polarity between the first and second terminals 208, 212, e.g., positive bias therebetween, the D2c, D2d 244, 248 are configured to be reverse-biased to provide a relatively high blocking voltage to suppress the activation of the third and fourth SCRs 236, 240 of the second EOS protection switch 202B disposed in the second device region 200B.

Still referring to FIG. 2A, the anodes of the first and second SCRs 216, 220 are commonly electrically connected to form an anode 256a of the first EOS protection switch 202A disposed in the first device region 200A. The cathodes of the first and second SCRs 216, 220 are commonly electrically connected to form a cathode of the first EOS protection switch 202A, which is in turn connected to the first terminal 208. The anodes of the third and fourth SCRs 236, 240 are commonly electrically connected to form an anode of the second EOS protection switch 202B disposed in the second device region 200B. The cathodes of the third and fourth SCRs 236, 240 are commonly electrically connected to form a cathode of the second EOS protection switch 202B, which is in turn connected to the second terminal 212. The anodes of the first and second EOS protection switches 202A, 202B are in turn electrically connected to each other at a central region A. The central region A is configured to be electrically floated in some embodiments. For example, in the illustrated embodiment, a fifth diode (D1) 252 is formed between the central region A and the substrate 204 and configured to be reverse biased in operation, such that the central region A is electrically floated. The first and second terminals 208, 212 are connected to independent system pads which can be subject to relatively small signal that is insufficient to trigger the transceiver integrated circuit 200 during normal operations while being subject to a high overstress signal that is sufficient to trigger the one or both of the first and second EOS protection switches 202A, 202B of the transceiver integrated circuit 200 during fault conditions.

In the following, details of semiconductor regions of the first and second device regions 200A and 200B formed in the semiconductor substrate 204 are described with respect to FIGS. 2B (top) and 2C (top), respectively. In addition, details of the resulting equivalent circuits of the first and second EOS protection switches 202A, 202B are described with respect to FIGS. 2B (bottom) and 2C (bottom), respectively.

Referring to FIG. 2B (bottom), the first EOS protection switch 202A of the first device region 200A comprises a first SCR 216 and a second SCR 220, and further comprises a first diode 224 and a second diode 228. The first SCR 216 includes a first NPN bipolar transistor (BJT) Q1a and a first PNP BJT Q2a. The emitter of the first NPN BJT Q1a is electrically connected to the first terminal 208 through a cathode 252a of the first EOS protection switch 202A. The emitter of the first PNP BJT Q2a is electrically connected to an anode 256a of the first EOS protection switch 202A. Each of the base of the first PNP BJT Q2a and the collector of the first NPN BJT Q1a is connected to the anode 256a through a first resistor R2a. The second SCR 220 includes a second NPN bipolar transistor (BJT) Q1b and a second PNP BJT Q2b. The emitter of the second NPN BJT Q1b is electrically connected to the first terminal 208 through the cathode 252a of the first EOS protection switch 202A. The emitter of the second PNP BJT Q2b is electrically connected to the anode 256a of the first EOS protection switch 202A. Each of the base of the second NPN BJT Q2b and the collector of the second NPN BJT Q1b is connected to the anode 256a through a second resistor R2b.

It will be appreciated that the first SCR 216 includes the first PNP BJT Q2a and the first NPN BJT Q1a that are cross-coupled and configured to be activated in response to a positive voltage received at the first terminal 208 relative to the second terminal 216 (or a negative voltage received at the second terminal 216 relative to the first terminal 208). Similarly, the second SCR 220 includes the second PNP BJT Q2b and the second NPN BJT Q1b that are cross-coupled and configured to be activated in response to a positive voltage received at the first terminal 208 relative to the second terminal 212 (or a negative voltage received at the second terminal 212 relative to the first terminal 208).

The first SCR 216 comprises: a first p-type region comprising the emitter of the first PNP BJT Q2a; a first n-type region comprising the collector of the first NPN BJT Q1a that can be common with or connected to the base of the first PNP BJT Q2a; a second p-type region comprising the base of the first NPN BJT Q1a that can be common with or connected to the collector of the first PNP BJT Q2a; and a second n-type region comprising the emitter of the first NPN BJT Q1a.

Similarly, the second SCR 220 comprises: a first p-type region comprising the emitter of the second PNP BJT Q2b; a first n-type region comprising the collector of the second NPN BJT Q1b that can be common with or connected to the base of the second PNP BJT Q2b; a second p-type region comprising the base of the second NPN BJT Q1b that can be common with or connected to the collector of the second PNP BJT Q2b; and a second n-type region comprising the emitter of the second NPN BJT Q1b.

As described herein, the first p-type region, the second p-type region, and the second n-type region of each the first and second SCRs 216, 220, may sometimes referred to as a "cathode," a "gate," and an "anode," respectively, of the respective SCRs.

Without being bound to any theory, in various embodiments, a PNPN SCR can be activated in different ways. One mode of activation is associated with a voltage applied between the cathode and the anode of the PNPN SCR. This mode is sometimes referred to as voltage triggering, which occurs when a forward voltage (i.e., a positive voltage) exceeding a threshold value is placed between an anode relative to the cathode of an PNPN SCR. Under a forward voltage below a threshold voltage of the PNPN SCR, the first PN junction between the first p-type region and first n-type region and the second PN junction between the second p-type region and the second n-type region are forward biased, while the middle NP junction between the first n-type region and the second p-type region is initially reverse biased. Initially, little current flows across the PNPN SCR because little carriers cross the middle NP junction. However, at or above a forward voltage exceeding the first threshold value of the PNPN SCR, the PNPN SCR begins to conduct in part due to avalanche multiplication of carriers in the middle NP junction. Once the breakdown begins, an increase in majority carriers in the first n-type region and the second p-type region drives the middle NP junction to be forward biased, resulting in a low impedance state in which all junctions of the PNPN SCR become forward biased.

Based on the doping and dimensions of the respective first and second p-type regions and the first and second n-type regions of the PNPN SCR, the first and second trigger voltages $V_{TR1}$, $V_{TR2}$ of the first and second SCRs 216, 220, may be adjusted for the application at hand. In some embodiments, the first and second trigger voltages $V_{TR1}$, $V_{TR2}$, are configured to be the same such that the first and second SCRs 216, 220 are triggered at about the same time and/or the same overstress conditions. In some other embodiments, the first and second trigger voltages $V_{TR1}$, $V_{TR2}$, are configured to be different such that the first and second SCRs 216, 220 are triggered at different times and/or different overstress conditions.

In FIG. 2B (top), to help better understand the various structural features as they relate to formation of various device components described above, various structural regions are overlaid with an equivalent circuit diagram. In the following, the various structural features are described first, followed by the operational principles of the EOS switch based on the equivalent circuit diagram. The first device region 200A includes a semiconductor substrate 302, e.g., a p-type semiconductor substrate, having formed therein first to fifth p-type wells (PWs) 306a, 314a, 322a, 330a and 338a that are alternating with first to fourth n-type wells (NWs) 310a, 318a, 326a, and 334a. The first device region 200A additionally includes first to seventh heavily doped p-type (p⁺) regions 342a, 350a, 358a, 370a, 382a, 390a and 398a formed in the PW 306a, PW 314a, NW 318a, PW 322a, NW 326a, PW 330a, and PW 338a, respectively. The first device region 200A additionally includes first to eighth heavily doped n-type (n⁺) regions 346a, 354a, 362a, 366a, 374a, 378a, 386a and 394a formed in the NW 310a, NW 318a, in a boundary region between PW 322a and NW 318a, PW 322a, PW 322a, in a boundary region between PW 322a and NW 326a, NW 326a and NW 334a, respectively. Some adjacent ones of n⁺ and p⁺ regions, n⁺ and n⁺ regions, or p⁺ and p⁺ regions are separated by an isolation region, e.g., a shallow trench isolation (STI) region. The p⁺ regions 350a and 390a and n⁺ regions 366a and 374a are electrically connected, e.g., directly connected, above or outside of the substrate 302 through a first metallization path 308 formed through one or more metallization levels. In addition, the p⁺ regions 358a and 382a and n⁺ regions 346a, 354a, 386a and 394a are electrically connected, e.g., directly connected, above or outside of the substrate 302 through a second metallization path 312 formed through one or more metallization levels that may include the same or different metallization levels from the first metallization path 308a.

As described herein and throughout the specification, it will be appreciated that the semiconductor substrate 302 can be implemented in a variety of ways, including, but not limited to, a doped semiconductor substrate or a silicon on insulator (SOI) substrate including a silicon-insulator-silicon structure in which the various structures described above are isolated from a support substrate using an insulator layer such as a buried $SiO_2$ layer. In addition, it will be appreciated that the various structures described above can be at least partially formed in an epitaxial layer formed at or near a surface region.

As described herein and throughout the specification, a junction or a junction region refers to a region formed when two semiconductor material of different types form an interface, and can include regions near the interface where the electronic bands (i.e., conduction and valence bands) are bent due to built-in electric fields. Thus, the dimension of a junction region can depend on various factors such as the doping concentrations and the doping profiles of the different types of semiconductor materials forming the junction.

Still referring to FIG. 2B, the first device region 200A includes a deep N well (DNW) 304a disposed below, e.g., immediately below or in contact with bottom ends of one or more of the second to fourth PWs 314a, 322a and 330a, and of one or more of first to fourth NWs 310a, 318a, 326a, and 334a. In some embodiments, the DNW 304a forms junction regions with the PWs 314a, 322a and 330a vertically in the z direction while forming a vertical extension of an n-type region from the NWs 310a and 334a.

Still referring to FIG. 2B, the p⁺ region 358a, the NW 318a, the PW 322a, and the n⁺ region 366a are electrically connected such that the first SCR 216 is formed. The first SCR 216 in turn includes the first PNP BJT Q2a that includes the p⁺ region 358a, the NW 318a and the PW 322a, and the first NPN BJT Q1a that includes the NW 318a, the PW 322a, and the n⁺ region 366a. The first PNP BJT Q2a and the first NPN BJT Q1a are cross-coupled as illustrated and as described above to form and operate as the first SCR 216. Analogously, the p⁺ region 382a, the NW 326a, the PW 322a, and the n⁺ region 374a are electrically connected such that the second SCR 220 is formed. The second PNPN SCR 220 in turn includes the second PNP BJT Q2b that includes the p⁺ region 382a, the NW 326a and the PW 322a, and the second NPN BJT Q2b that includes the NW 326a, the PW 322a, and the n⁺ region 374a. The second PNP BJT Q2b and the second NPN BJT Q1b are cross-coupled as illustrated and as described above to form and operate as the second SCR 220.

The p⁺ regions 358a and 382a are commonly connected through the second metallization path 312 to a common anode 256a of the first and second SCRs 216 and 220. In addition, the n⁺ regions 374a and 366a form a common cathode 252a of the first and second SCRs 216 and 220, and are commonly connected to the first metallization path 308. A metallization path formed using a metallization process architecture of a protection device can include a plurality of metallization levels, e.g., first (M1) through $n^{th}$ (Mn) metallization levels, where n can be 2 to 10. As described herein and throughout the specification, a metallization level includes laterally extending conductive structures formed of conductive materials, e.g., Cu, Al or W, such as metal lines, that can be patterned using a lithography mask, and also includes vertically extending conductive structures such as vias or contacts formed of conductive materials such as, e.g., Cu, Al or W, that are immediately below the laterally extending conductive structures. Thus, the first and second metallization paths 308a and 312 can include the lowest level metal lines above the substrate 302 and vias or contacts made to an n⁺ or a p⁺ region (e.g., self-aligned silicide or "salicided" contacts), within a PW or an NW.

Still referring to FIG. 2B, one or more of the p⁺ region 350a and the PW 318a and one or more of the NW 318a and the n⁺ region 354a are electrically connected such that a first one D2a' of the first diodes D2a is formed. Similarly, one or more of the p⁺ region 350a and the PW 318a and one or more of the NW 310a and the n⁺ region 346a are electrically connected such that a second one D2a" of the first diodes D2a is formed. The first and second ones D2a' and D2a" of the first diodes D2a are electrically connected in parallel, and in the equivalent circuit diagram, the combination of the diodes D2a' and D2a" is represented as a single diode D2a. Analogously, one or more of p⁺ region 390a and the PW 330a and one or more of the NW 326a and the n⁺ region 386a are electrically connected such that a first one D2b' of second diodes D2b is formed. Similarly, one or more of the p⁺ region 350a and the PW 318a and one or more of the NW 334a and the n⁺ region 394a are electrically connected such that a second one D2b" of second diodes D2b is formed. The first and second ones D2b' and D2b" of the second diodes D2b are electrically connected in parallel, and in the equivalent circuit diagram, the combination of the diodes D2b' and D2b" is represented as a single diode D2b.

As illustrated, the cathode or the n-type region of the first diode D2a, which can include one or both of the NW 318a and the n⁺ region 354a, and the anode of the first SCR 216, which includes the p⁺ region 358a, are connected to each other through the second metallization path 312 that is above the substrate 302. In addition, the cathode or the n-type region of the first diode D2a is electrically connected to the base of the first PNP BJT Q2a through the resistor first R2a formed in the NW 318a. The anode or the p-type region of the first diode D2a, which can include one or more of the p⁺ region 350a and the PW 318a, is connected to the cathode of the first SCR 216, which includes the n⁺ region 366a through the first metallization path 308a that is above the substrate 302.

Analogously, the cathode or the n-type region of the second diode D2b, which can include one or both of the NW 334a and the n⁺ region 394a, and the anode of the second SCR 220, which includes the p⁺ region 382a, are connected to each other through the second metallization path 312 that is above the substrate 302. In addition, the cathode or the n-type region of the second diode D2b is electrically connected to the base of the second PNP BJT Q2b through the second resistor R2b formed in the NW 326a. The anode or the p-type region of the second diode D2b, which can include one or more of the p⁺ region 390a and the PW 330a, is connected to the cathode of the second SCR 220, which includes the n⁺ region 374a through the first metallization path 308a that is formed above the substrate 302. The first metallization path 308a is in turn connected to the first terminal 208.

With continued reference to FIG. 2B, a first one D1' of the fifth diodes D1 includes a cathode or an n-type region, which can include one or both of the NW 334a and the n⁺ region 394a, and an anode or a p-type region, which can include one or both of the p⁺ region 398a and the PW 338a. A second one D1" of the fifth diodes D1 is formed by a cathode or an n-type region, which can include one or both of the NW 310a and the n⁺ region 346a, and an anode or a p-type region, which can include one or both of the p⁺ region 342a and the PW 306a. The first and second ones D1' and D1" of the fifth diodes D1 are electrically connected in parallel, and in the equivalent circuit diagram, the combination of the diodes D1' and D1", along with third and fourth ones D1''' and D1'''' of the fifth diodes described below in reference to FIG. 2C, is represented as a single diode D1. As illustrated, the n-type region of the first one D1' of the fifth diodes D1 is connected to the n-type region of the first diode D2a through or by sharing one more NWs, e.g., NW 334a and/or DNW 304a. Similarly, the n-type region of the second one D1" of the fifth diodes D1 is connected to the n-type region of the second diode through or by sharing one more NWs, e.g., NW 310a and/or DNW 304a. Thus, as configured, the fifth diode D1 operates to block current flowing into the substrate 302 when the first and/or second diodes D2a, D2b are forward biased to trigger the protection switch 202A. The first metallization levels 308a is connected to the first terminal 208.

With continued reference to FIG. 2B, the first device region 200A includes one or more electrically floating metal layers 316a, 320a extending laterally in the x-direction and separating some of the adjacent heavily doped (n⁺ and p⁺) regions. For example, in the illustrated embodiment, a first electrically floating metal layer 316a is formed on or over a surface of the NW 318a between the p⁺ region 358a and the n⁺ region 362a, and a second electrically floating metal 320a formed on a surface of the NW 326a between the p⁺ region 382a and the n⁺ region 378a. The electrically floating metal layers are electrically floating because they are not electrically connected to other structures and are separated from the surfaces on which they are formed by a thin dielectric layer. Without being bound to any theory, it will be appreciated that the floating metal layers can allow placement of oppositely doped adjacent n⁺ and p⁺ regions at relatively close lateral proximity for high current (e.g., >1×10⁵ A/cm²) capability of the devices formed by the n⁺ and/or p⁺ regions with improved breakdown characteristics therebetween, e.g., due to band-to-band tunneling and/or punch-through effects. This in turn allows for optimization of various BJTs of the EOS protection switch 202A for relatively high current and high speed capability, e.g., by enabling shorter base regions of the first PNP BJT Q2a and the second PNP BJT Q2b for optimum transistor efficiency. Suitable metals for the electrically floating metal layers 316a, 320a include, e.g., aluminum (Al), tungsten (W), titanium (Ti), tantalum (Ta), molybdenum (Mo), rubidium (Ru), TiN, TaN, TaCN, and TaSi$_x$N$_y$, to name a few. The lateral dimensions of each of the electrically floating metal layers 316a, 320a are less than about 1 µm, less than about 0.5 µm, less than about 0.2 µm, between about 0.1 µm and about 0.3 µm, or between about 0.06 µm and about 0.2 µm, for instance about 0.16 µm. Some other adjacent heavily doped (p⁺ and n⁺) regions that are not separated by an electrically floating metal layer may be separated by a dielectric isolation region, which can be a shallow trench isolation (STI) region. Similar to floating metal layers, dielectric isolations can allow placement of oppositely doped adjacent n⁺ and p⁺ regions at relatively close lateral proximity for high current capability. Compared to the floating metal layers, however, dielectric isolation regions can allow for optimization of various BJTs of the bidirectional SCR device for relatively lower speed, e.g., by enabling a longer path length between the adjacent n⁺ and p⁺ regions, e.g., a longer path length of the base regions of some BJTs.

Various p⁺ regions and n⁺ regions disclosed herein can have a peak doping concentration exceeding about 1×10¹⁹ cm⁻³, exceeding about 1×10²⁰ cm⁻³, or in the range between about 1×10²⁰ cm⁻³ and about 8×10²⁰ cm⁻³, for example, about 2×10²⁰ cm⁻³. In addition, various PWs and NWs and the DNW have a peak doping concentration in the range of about 1.5×10¹⁶ cm⁻³ to about 7.5×10¹⁶ cm⁻³, for example, about 5.0×10¹⁶ cm⁻³.

Referring to FIG. 2C (bottom), the second EOS protection switch 202B of the second device region 200B comprises a third SCR 236 and a fourth SCR 240, and further comprises a third diode 244 and a fourth diode 248. The third SCR 236 includes a third NPN bipolar transistor (BJT) Q1c and a third PNP BJT Q2c. The emitter of the third NPN BJT Q1c is electrically connected to the second terminal 212 through a cathode 252b of the second EOS protection switch 202B. The emitter of the third PNP BJT Q2c is electrically connected to an anode 256b of the second EOS protection switch 202B. Each of the base of the third PNP BJT Q2c and the collector of the third NPN BJT Q1c is connected to the anode 256b through a third resistor R2c. The fourth SCR 240 includes a fourth NPN bipolar transistor (BJT) Q1d and a fourth PNP BJT Q2d. The emitter of the fourth NPN BJT Q1d is electrically connected to the second terminal 212 through the cathode 252b of the second EOS protection switch 202B. The emitter of the fourth PNP BJT Q2d is electrically connected to the anode 256b of the second EOS protection switch 202B. Each of the base of the fourth NPN BJT Q2bd and the collector of the fourth NPN BJT Q1d is connected to the anode 256b through a fourth resistor R2d.

It will be appreciated that the third SCR 236 includes the third PNP BJT Q2c and the third NPN BJT Q1c that are cross-coupled and configured to be activated in response to a positive voltage received at the second terminal 212 relative to the first terminal 208 (or a negative voltage received at the first terminal 208 relative to the second terminal 208). Similarly, the fourth SCR 240 includes the fourth PNP BJT Q2d and the fourth NPN BJT Q1d that are cross-coupled and configured to be activated in response to a positive voltage received at the second terminal 212 relative to the first terminal 208 (or a negative voltage received at the first terminal 208 relative to the second terminal 212).

The third SCR 236 comprises: a third p-type region comprising the emitter of the third PNP BJT Q2c; a third n-type region comprising the collector of the third NPN BJT Q1c that can be common with or connected to the base of the third PNP BJT Q2c; a fourth p-type region comprising the base of the third NPN BJT Q1c that can be common with or connected to the collector of the third PNP BJT Q2c; and a second n-type region comprising the emitter of the third NPN BJT Q1c.

Similarly, the fourth SCR 240 comprises: a first p-type region comprising the emitter of the fourth PNP BJT Q2d; a first n-type region comprising the collector of the fourth NPN BJT Q1d that can be common with or connected to the base of the fourth PNP BJT Q2d; a second p-type region comprising the base of the fourth NPN BJT Q1d that can be common with or connected to the collector of the fourth PNP BJT Q2d; and a second n-type region comprising the emitter of the fourth NPN BJT Q1d.

As described herein, the first p-type region, the second p-type region, and the second n-type region of each the third and fourth SCRs 236, 240, may sometimes referred to as a "cathode," a "gate," and an "anode," respectively, of the respective SCRs.

Based on the doping and dimensions of the respective first and second p-type regions and the first and second n-type regions, the third and fourth trigger voltages $V_{TR3}$, $V_{TR4}$ of the third and fourth SCRs 236, 240, may be adjusted for the application at hand. In some embodiments, the third and fourth trigger voltages $V_{TR3}$, $V_{TR4}$, are configured to be the same such that the third and fourth SCRs 236, 240 are triggered at about the same time and/or the same overstress conditions. In some other embodiments, the third trigger voltages $V_{TR3}$, $V_{TR4}$, are configured to be different such that the third and fourth SCRs 236, 240 are triggered at different times and/or different overstress conditions.

In FIG. 2C (top), to help better understand the various structural features as they relate to formation of various device components described above, various structural regions are overlaid with an equivalent circuit diagram. In the following, the various structural features are described first, followed by the operational principles of the EOS switch based on the equivalent circuit diagram. The second device region 200B includes a semiconductor substrate 302, e.g., a p-type semiconductor substrate, having formed therein first to fifth p-type wells (PWs) 306b, 314b, 322b, 330b and 338b that are alternating with first to fourth n-type wells (NWs) 310b, 318b, 326b, and 334b. The second device region 200B additionally includes first to seventh heavily doped p-type (p$^+$) regions 342b, 350b, 358b, 370b, 382b, 390b and 398b formed in the PW 306b, PW 314b, NW 318b, PW 322b, NW 326b, PW 330b, and PW 338b, respectively. The second device region 200B additionally includes first to eighth heavily doped n-type (n$^+$) regions 346b, 354b, 362b, 366b, 374b, 378b, 386b and 394b formed in the NW 310b, NW 318b, in a boundary region between PW 322b and NW 318b, PW 322b, PW 322b, in a boundary region between PW 322b and NW 326b, NW 326b and NW 334b, respectively. Some adjacent ones of n$^+$ and p$^+$ regions, n$^+$ and n$^+$ regions, and p$^+$ and or p$^+$ are separated by an isolation region, e.g., a shallow trench isolation (STI) region. The p$^+$ regions 350b and 390b and n$^+$ regions 366b and 374b are electrically connected, e.g., directly connected, above or outside of the substrate 302 through a third metallization path 308b. In addition, the p$^+$ regions 358b and 382b and n$^+$ regions 346b, 354b, 386b and 394b are electrically connected, e.g., directly connected, above or outside of the substrate 302 through the second metallization path 312 that may be different from or the same as the third metallization path 308b.

Still referring to FIG. 2C, the second device region 200B includes a deep N well (DNW) 304b disposed below, e.g., immediately below or in contact with bottom ends of one or more of the second to fourth PWs 314b, 322b and 330b, and of one or more of first to fourth NWs 310b, 318b, 326b, and 334b. In some embodiments, the DNW 304b forms junction regions with the PWs 314b, 322b and 330b vertically in the z direction while forming a vertical extension of an n-type region from the NWs 310b and 334b.

Still referring to FIG. 2C, the p$^+$ region 358b, the NW 318b, the PW 322b, and the n$^+$ region 366b are electrically connected such that the third SCR 236 is formed. The third SCR 236 in turn includes the third PNP BJT Q2c that in includes the p$^+$ region 358b, the NW 318b and the PW 322b, and the third NPN BJT Q1b that includes the NW 318b, the PW 322b, and the n$^+$ region 366b. The third PNP BJT Q2c and the third NPN BJT Q1c are cross-coupled as illustrated and as described above to form and operate as the third SCR 236. Analogously, the p$^+$ region 382b, the NW 326b, the PW 322b, and the n$^+$ region 374b are electrically connected such that the fourth SCR 240 is formed. The fourth SCR 240 in turn includes the fourth PNP BJT Q2d that includes the p$^+$ region 382b, the NW 326b and the PW 322b, and the fourth NPN BJT Q2d that includes the NW 326b, the PW 322b, and the n$^+$ region 374b. The fourth PNP BJT Q2d and the fourth NPN BJT Q1d are cross-coupled as illustrated and as described above to form and operate as the fourth SCR 240.

The p$^+$ regions 358b and 382b are commonly connected through the second metallization path 312 to a common anode 256b of the third and fourth SCRs 236 and 240. In addition, the n$^+$ regions 374b and 366b form a common cathode 252b of the third and fourth SCRs 236 and 240, and are commonly connected to the first metallization path 308.

Still referring to FIG. 2C, one or more of the p$^+$ region 350b and the PW 318b and one or more of the NW 318b and the n$^+$ region 354b are electrically connected such that a first one D2c' of the third diodes D2c is formed. Similarly, one or more of the p$^+$ region 350b and the PW 318b and one or more of the NW 310b and the n$^+$ region 346b are electrically connected such that a second one D2c" of the third diodes D2c" is formed. The first and second ones D2c' and D2c" of the third diodes D2c are electrically connected in parallel, and in the equivalent circuit diagram, the combination of the diodes D2a' and D2a" is represented as a single diode D2c. Analogously, one or more of p$^+$ region 390b and the PW 330b and one or more of the NW 326b and the n$^+$ region 386b are electrically connected such that a first one D2d' of fourth diodes D2d is formed. Similarly, one or more of the p$^+$ region 350b and the PW 318b and one or more of the NW 334b and the n$^+$ region 394b are electrically connected such that a second one D2d" of fourth diodes D2d is formed. The first and second ones D2d' and D2d" of the fourth diodes D2d are electrically connected in parallel, and in the equivalent circuit diagram, the combination of the diodes D2d' and D2d" is represented as a single diode D2d.

As illustrated, the cathode or the n-type region of the third diode D2c, which can include one or both of the NW 318c and the n$^+$ region 354b, and the anode of the third SCR 236, which includes the p$^+$ region 358b, are connected to each other through the one or more second metallization path 312 that is above the substrate 302. In addition, the cathode or the n-type region of the third diode D2c is electrically connected to the base of the third PNP BJT Q2c through the third resistor R2c formed in the NW 318b. The anode or the p-type region of the third diode D2c, which can include one or more of the p$^+$ region 350b and the PW 318b, is connected to the cathode of the third SCR 236, which includes the n$^+$ region 366b through the third metallization path 308b that formed above the substrate 302.

Analogously, the cathode or the n-type region of the fourth diode D2d, which can include one or both of the NW 334$b$ and the n$^+$ region 394$b$, and the anode of the fourth SCR 240, which includes the p$^+$ region 382$b$, are connected to each other through the second metallization path 312 that is formed above the substrate 302. In addition, the cathode or the n-type region of the fourth diode D2$d$ is electrically connected to the base of the fourth PNP BJT Q2$d$ through the fourth resistor R2$d$ formed in the NW 326$b$. The anode or the p-type region of the second diode D2$d$, which can include one or more of the p$^+$ region 390$b$ and the PW 330$b$, is connected to the cathode of the fourth SCR 240, which includes the n$^+$ region 374$b$ through the third metallization path 308$b$ that is formed above the substrate 302. The third metallization path 308$b$ are in turn connected to the second terminal 212.

With continued reference to FIG. 2C, a third one of the fifth diodes D1 includes a cathode or an n-type region, which can include one or both of the NW 334$b$ and the n$^+$ region 394$b$, and an anode or a p-type region, which can include one or both of the p$^+$ region 398$b$ and the PW 338$b$. A fourth one of the fifth diodes D1 is formed by a cathode or an n-type region, which can include one or both of the NW 310$b$ and the n$^+$ region 346$b$, and an anode or a p-type region, which can include one or both of the p$^+$ region 342$b$ and the PW 306$b$. The third and fourth ones D1''' and D1'''' of the fifth diodes D1 are electrically connected in parallel with each other and in parallel with the first and second ones D1' and D1'' of the fifth diodes D1, and in the equivalent circuit diagram, the combination of the diodes D1', D1'', D1''' and D1'''' that are electrically connected parallel is represented as a single diode D1. As illustrated, the n-type region of the third one D1''' of the fifth diodes D1 is connected to the n-type region of the first diode D2$a$ through or by sharing one more NWs, e.g., NW 334$b$ and/or DNW 304$b$. Similarly, the n-type region of the fourth one D1'''' of the fifth diodes D1 is connected to the n-type region of the second diode D2$a$ through or by sharing one more NWs, e.g., NW 310$b$ and/or DNW 304$b$. Thus, as configured, the fifth diode D1 operates to block current flowing into the substrate 302 when the third and/or fourth diodes D2$c$, D2$d$ are forward biased to trigger the protection switch 202B. The third metallization path 308$b$ is in turn connected to the second terminal 212.

With continued reference to FIG. 2C, the second device region 200B includes one or more electrically floating metal layers 316$b$, 320$b$ extending laterally in the x-direction and separating some of the adjacent heavily doped (n$^+$ and p$^+$) regions. For example, in the illustrated embodiment, a first electrically floating metal layer 316$b$ is formed on a surface of the NW 318$b$ between the p$^+$ region 358$b$ and the n$^+$ region 362$b$, and a second electrically floating metal 320$b$ formed on a surface of the NW 326$b$ between the p$^+$ region 382$b$ and the n$^+$ region 378$b$. Various physical features and advantages of the electrically floating metal layers have been described in reference to FIG. 2B, and are omitted herein for brevity. Similarly, some other adjacent heavily doped (p$^+$ and n$^+$) regions that are not separated by a dielectric isolation region, which can be a shallow trench isolation (STI) region, in a similar manner as described above with respect to FIG. 2B.

Various PWs, NWs, p$^+$ regions and n$^+$ regions of the second device region 200B can have physical features including dopant concentrations described above with respect to FIG. 2B.

Figure 2E:
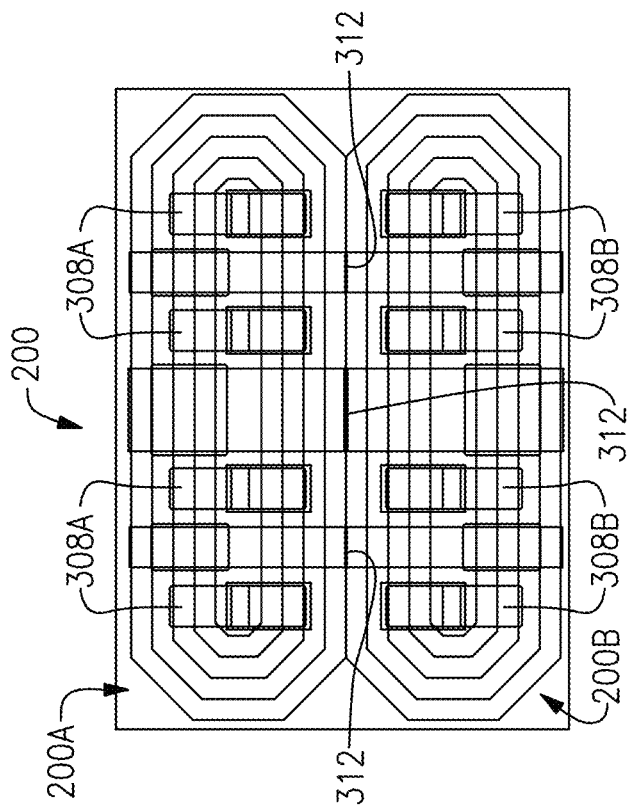
FIG. 2E schematically illustrates a plan view of the bidirectional communication interface protection device illustrated in FIG. 2D, including metallization, according to embodiments.
Figure 2D:
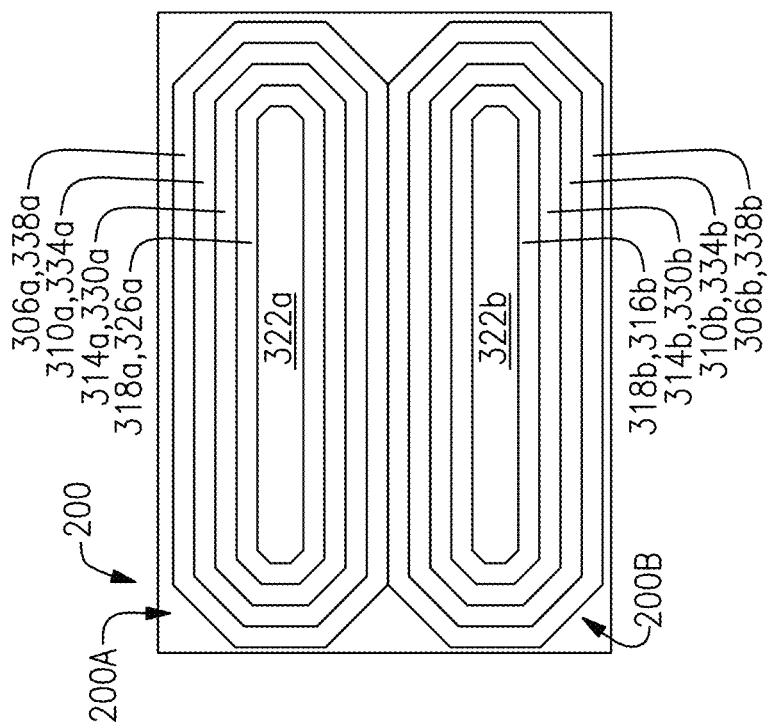
FIG. 2D schematically illustrates a plan view of a bidirectional communication interface protection device having first and second device regions each having well regions arranged in an annular configuration, according to embodiments.

FIGS. 2D and 2E illustrate schematic plan views of a bidirectional communication interface protection device 200, according to some embodiments. In the illustrated embodiment, each of the device regions 200A and 200B are arranged to have an annular configuration. FIG. 2D illustrates a plan view showing PWs and NWs only, of the protection device 200 illustrated in FIGS. 2A-2C, for clarity of purposes, and FIG. 2E illustrates the PWs and NWs of protection device 200 along with the first, third, and second metallization paths 308$a$, 308$b$ and 312. In the annular configuration of the first device region 200A, PWs 306$a$ and 338$a$ form a common ring region, and PWs 314$a$ and 330$a$ form a common ring structure surrounding the PW 322$a$ disposed at a central region. Likewise, NWs 310$a$ and 334$a$ form a common ring structure and NWs 318$a$ and 326$a$ form a common ring structure surrounding the PW 322$a$. In a similar manner, p$^+$ regions 342$a$ and 398$a$ form a common ring structure, p$^+$ regions 350$a$ and 390$a$ form a common ring structure, and p$^+$ regions 358$a$ and 382$a$ form a common ring structure surrounding the p$^+$ region 370$a$ disposed at the central region. Likewise, the n$^+$ regions 346$a$ and 394$a$ form a common ring structure, n$^+$ regions 354$a$ and 386$a$ form a common ring structure, n$^+$ regions 362$a$ and 378$a$ form a common ring structure, and n$^+$ regions 366$a$ and 374$a$ form a common ring structure surrounding the p$^+$ region 370$a$ disposed at the central region. Thus, the first device region 200A includes the PW 322$a$ disposed at the central region thereof, which is successively surrounded by NW 318$a$/326$a$, PW 314$a$/330$a$, NW 310$a$/334$a$ and PW 306$a$/338$a$.

In the annular configuration of the second device region 200B, PWs 306$b$ and 338$b$ form a common ring region and PWs 314$b$ and 330$b$ form a common ring structure surrounding the PW 322$b$ disposed at a central region. Likewise, NWs 310$b$ and 334$b$ form a common ring structure and NWs 318$b$ and 326$b$ form a common ring structure surrounding the PW 322$b$ disposed at a central region. In a similar manner, p$^+$ regions 342$b$ and 398$b$ form a common ring structure, p$^+$ regions 350$b$ and 390$b$ form a common ring structure, and p$^+$ regions 358$b$ and 382$b$ form a common ring structure surrounding the p$^+$ region 370$b$ disposed at the central region. Likewise, the n$^+$ regions 346$b$ and 394$b$ form a common ring structure, n$^+$ regions 354$b$ and 386$b$ form a common ring structure, n$^+$ regions 362$b$ and 378$b$ form a common ring structure, and n$^+$ regions 366$b$ and 374$b$ form a common ring structure surrounding the p$^+$ region 370$b$ disposed at the central region. Thus, the second device region 200B includes the PW 322$b$ disposed at the central region thereof, which is successively surrounded by NW 318$b$/326$b$, PW 314$b$/330$b$, NW 310$b$/334$b$ and PW 306$b$/338$b$.

Referring to FIGS. 2A-2E, in the following, a summary of the operational principle of the protection device 200 is described. When a transient electrical signal such as electrostatic discharge (ESD) is received by the first terminal 208 (e.g., an IO terminal) at a positive voltage relative to the second terminal 212 (e.g., a GND terminal), the first EOS protection switch 202A is activated. The first and second diodes D2$a$, D2$b$ are forward biased, and the potential at a node A initially rises. When the potential at the node A with respect to the second terminal 212 over a threshold value, e.g., about 9V, the n+/PW junction 324$a$ between the n+ region 362$a$/378$a$ and the PW 322$a$ (marked by "X") breaks down and the first and second NPN BJTs Q1$a$ and Q1$b$ is caused to be turned on. Once the first and second NPN BJTs Q1$a$ and Q1$b$ are turned on, the collectors of the first and second NPN BJTs Q1$a$ and Q1$b$ draw current out of the bases of the first and second PNP BJTs Q2$a$ and Q2$b$, which in turn causes the first and second PNP BJTs Q2$a$ and Q2$b$ to turn on. As the first and second PNP BJTs Q2$a$ and Q2$b$ turns on, the collectors of the first and second PNP BJTs Q2$a$ and Q2$b$ pushes more current into the bases of the first and second NPN BJTs Q1a and Q1b, which are caused to be turned on stronger. Thus, a positive feedback loop sustains the first and second SCRs 216 and 220, until the ESD may be substantially discharged.

Conversely, when a transient electrical signal such as electrostatic discharge (ESD) is received by the first terminal 208 (e.g., an IO terminal) at a negative voltage relative to the second terminal 212 (e.g., a GND terminal), the second EOS protection switch 202B is activated. The third and fourth diodes D2c, D2d are forward biased, and the potential at a node A initially rises. When the potential at the node A with respect to the first terminal 212 over a threshold value, e.g., about 9V, the n+/PW junction 324b between the n+ region 362b/378b and the PW 322b (marked by "X") breaks down and the third and fourth NPN BJTs Q1c and Q1d is caused to be turned on. Once the third and fourth NPN BJTs Q1c and Q1d are turned on, the collectors of the third and fourth NPN BJTs Q1c and Q1d draw current out of the bases of the third and fourth PNP BJTs Q2c and Q2d, which in turn causes the third and fourth PNP BJTs Q2c and Q2d to turn on. As the third and fourth PNP BJTs Q2c and Q2d turns on, the collectors of the third and fourth PNP BJTs Q2c and Q2d pushes more current into the bases of the third and fourth NPN BJTs Q1c and Q1d, which are caused to be turned on stronger. Thus, a positive feedback loop sustains the third and fourth SCRs 236 and 240, until the ESD may be substantially discharged.

Figure 3A:
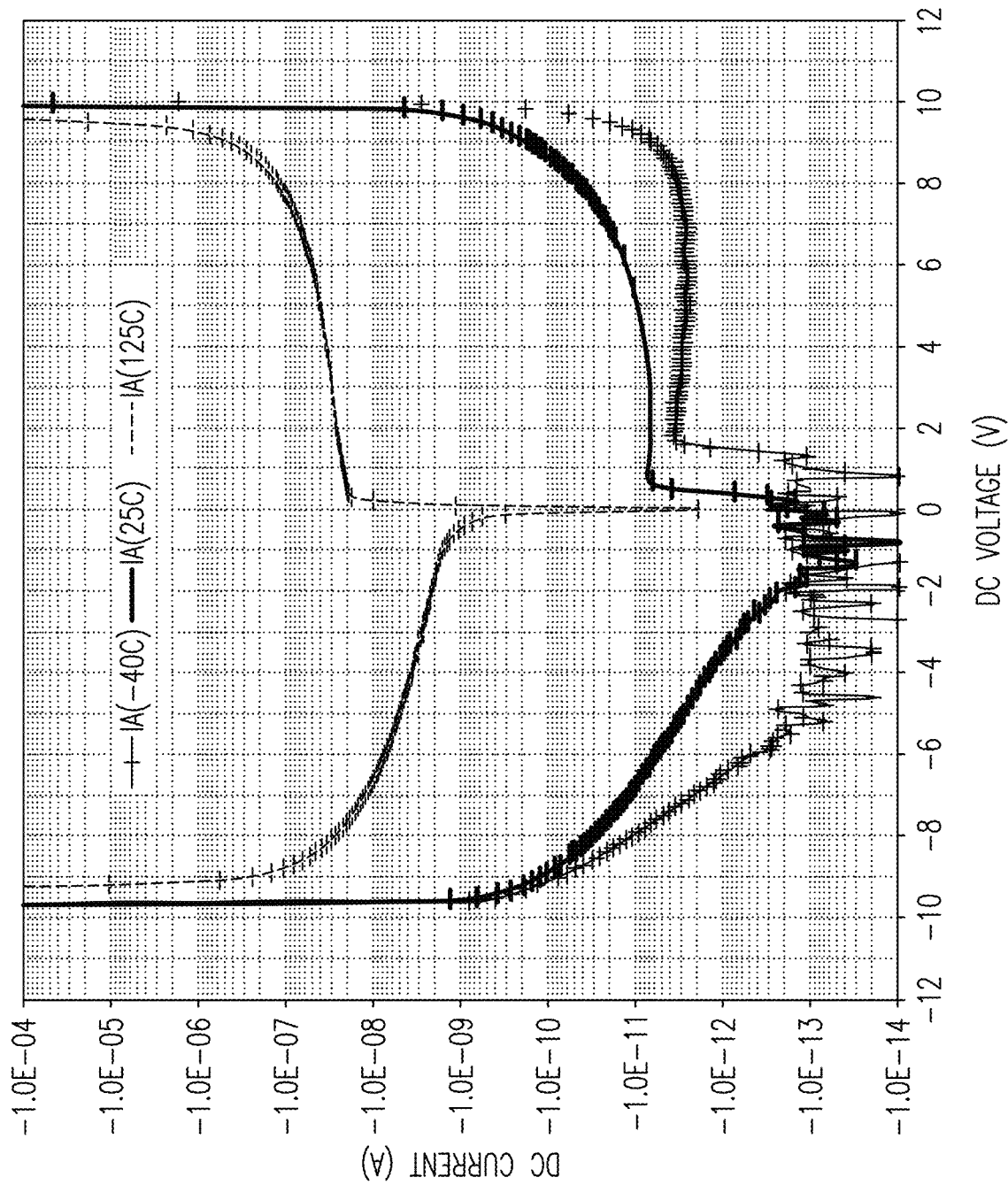
FIG. 3A displays experimental DC current-voltage (IV) curves obtained from a bidirectional communication interface protection device illustrated in FIGS. 2A-2E at different temperatures.
Figure 3B:
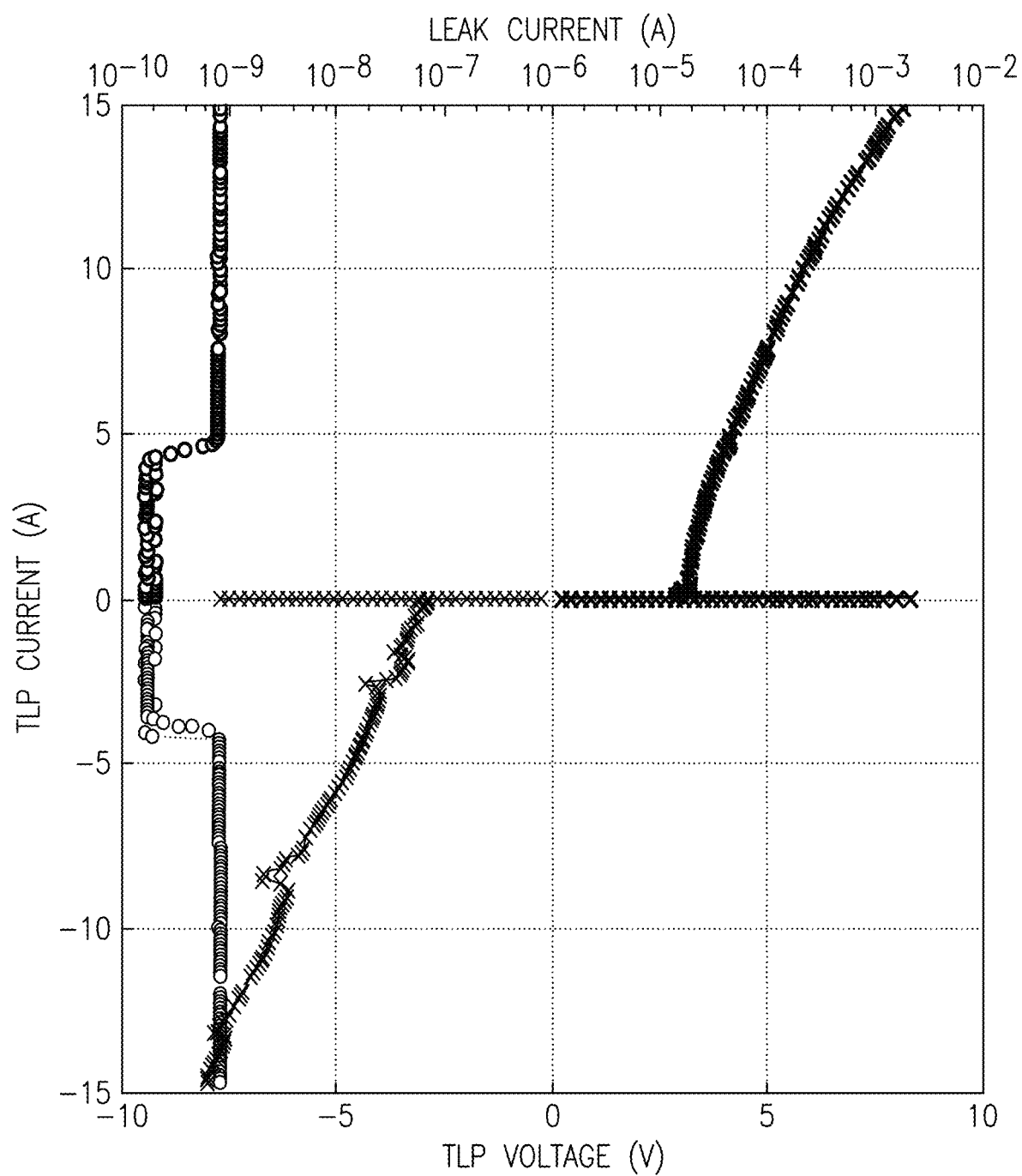
FIG. 3B displays experimental IV curves obtained under HMM high stress 8 kV equivalent test from a bidirectional communication interface protection device illustrated in FIGS. 2A-2E.
Figure 3C:
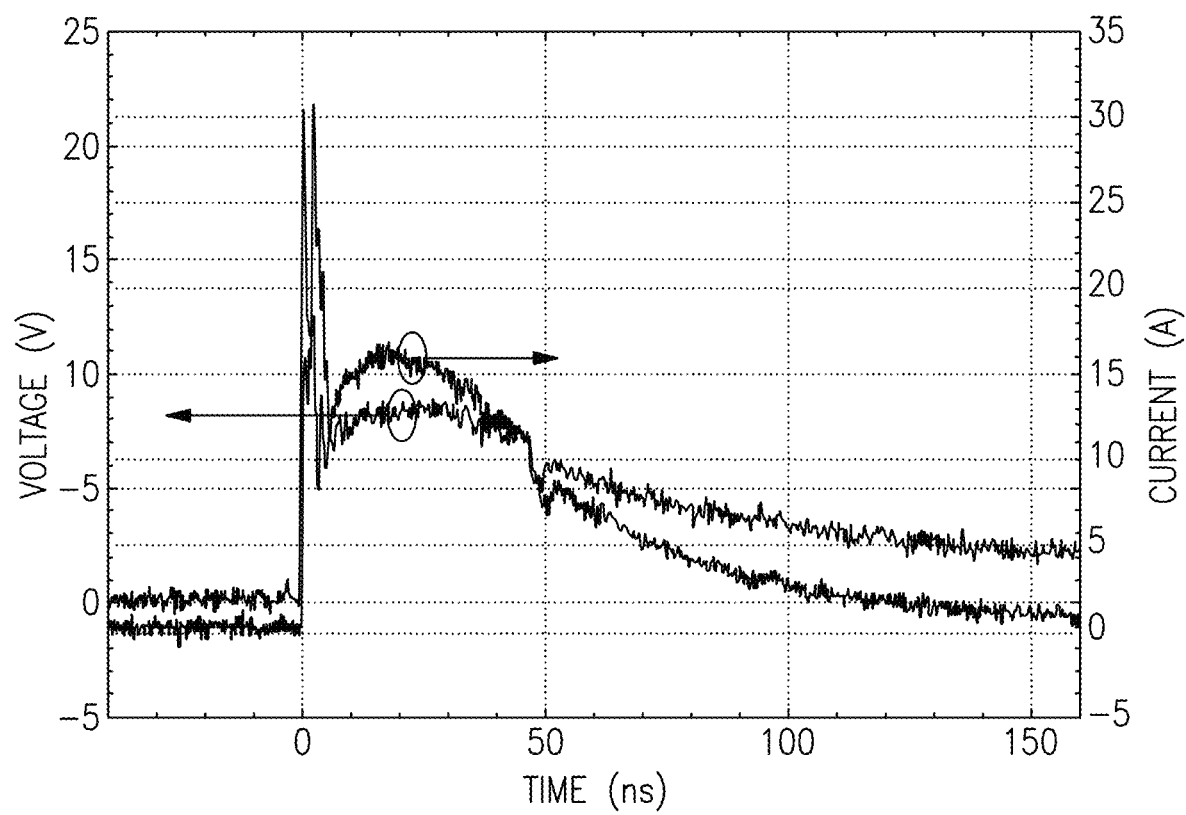
FIG. 3C displays positive waveforms corresponding to the IV curves illustrated in FIG. 3B.
Figure 3D:
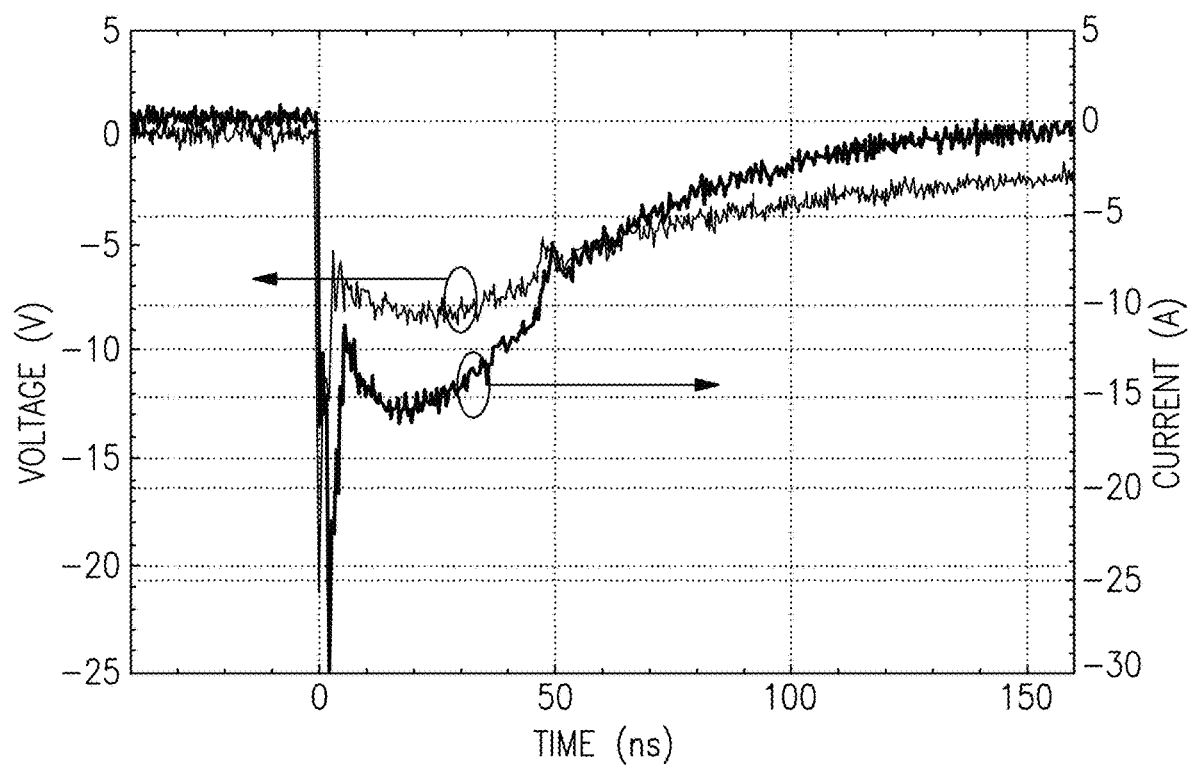
FIG. 3D displays negative waveforms corresponding to the IV curves illustrated in FIG. 3B.
Figure 3E:
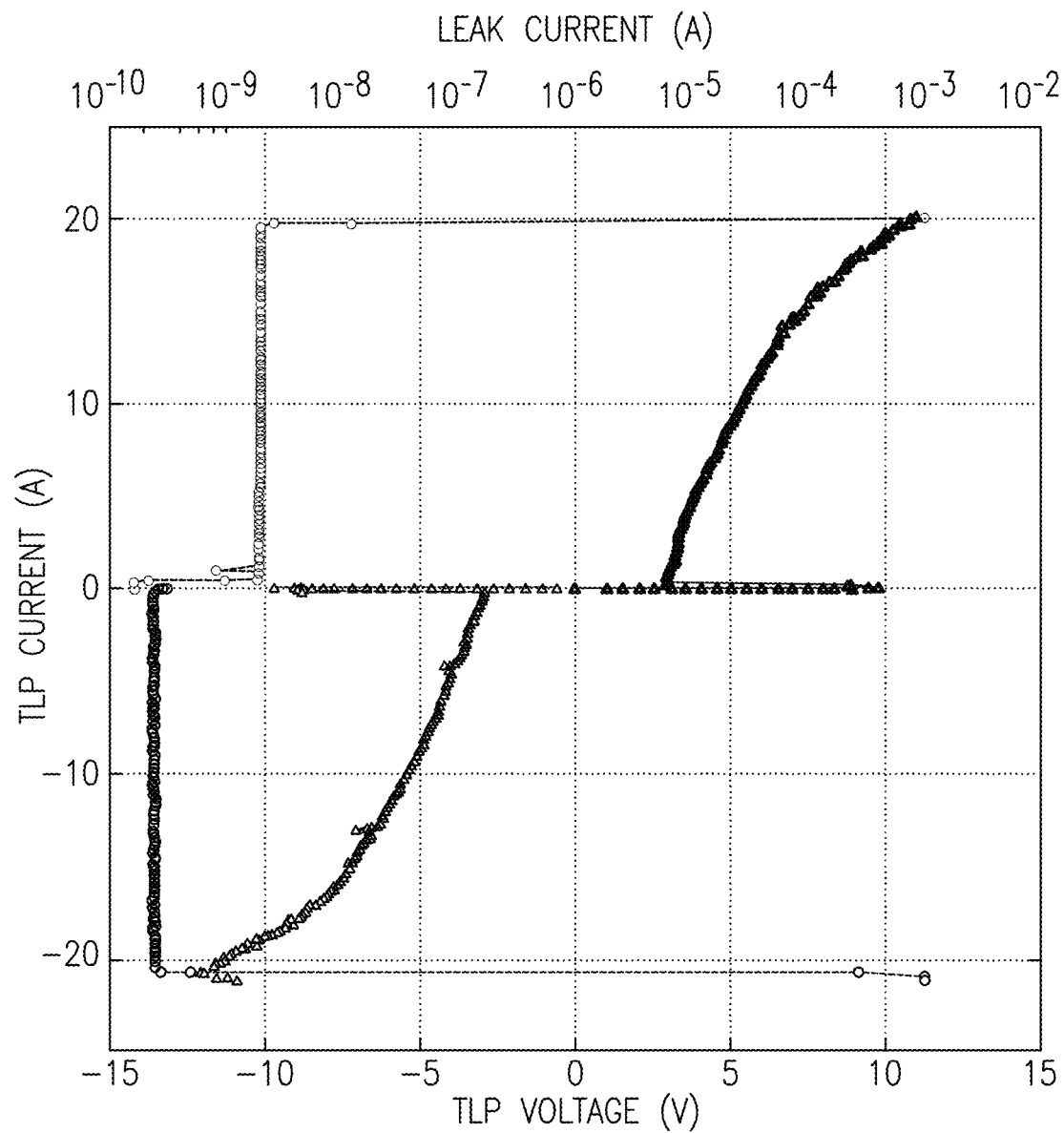
FIG. 3E displays experimental IV curves obtained under 100 ns pulse width transmission line pulse (TLP) testing condition from a bidirectional communication interface protection device illustrated in FIGS. 2A-2E.
Figure 3F:
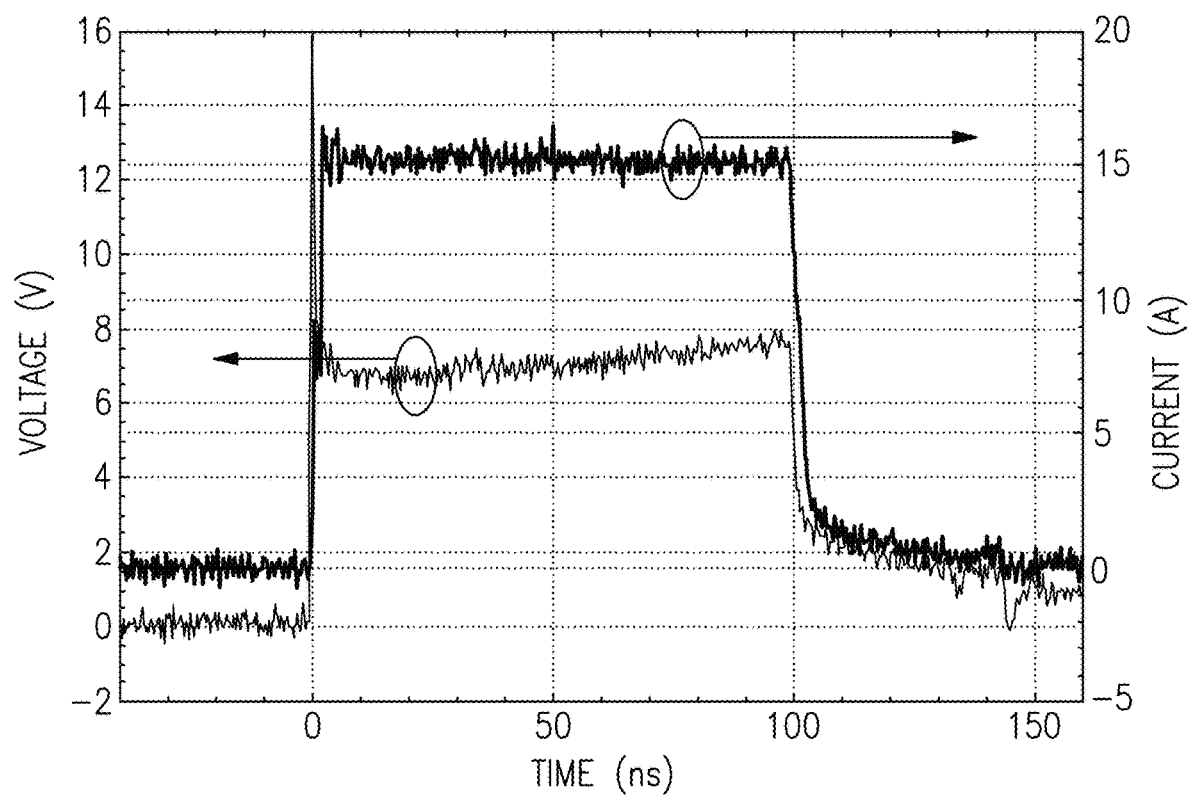
FIG. 3F displays positive waveforms corresponding to the IV curves illustrated in FIG. 3E.
Figure 3G:
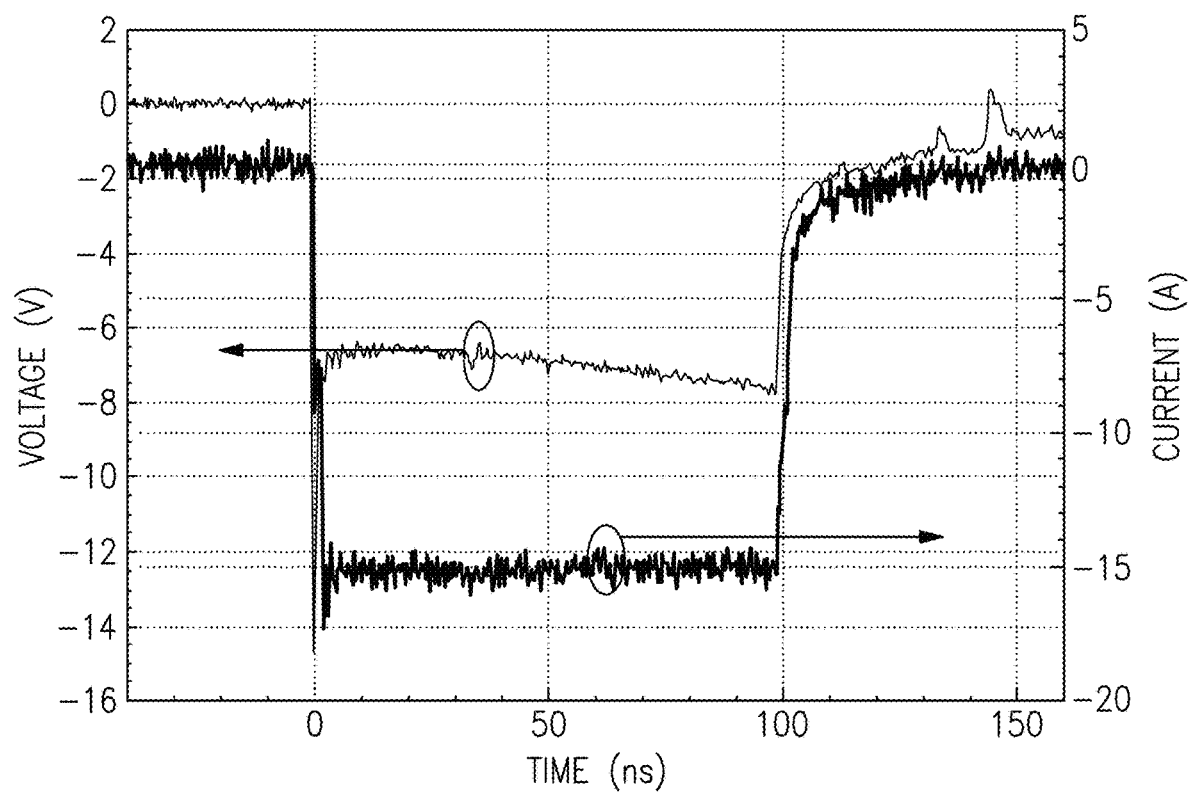
FIG. 3G displays negative waveforms corresponding to the IV curves illustrated in FIG. 3E.

FIGS. 3A-3F illustrate experimental measurements obtained from an example implantation of the protection device 200 described above. FIG. 3A displays experimental DC current-voltage (IV) curves obtained at different temperatures, namely at −40° C., 25° C. and 125° C. FIG. 3B displays experimental IV curves obtained under HMM high stress 8 kV equivalent test, and FIGS. 3C and 3D display the corresponding wave forms. FIG. 3E displays experimental IV curves obtained under transmission line pulse (TLP) testing condition of 100 ns pulse width, and FIGS. 3C and 3D display the corresponding waveforms.

Figure 4A:
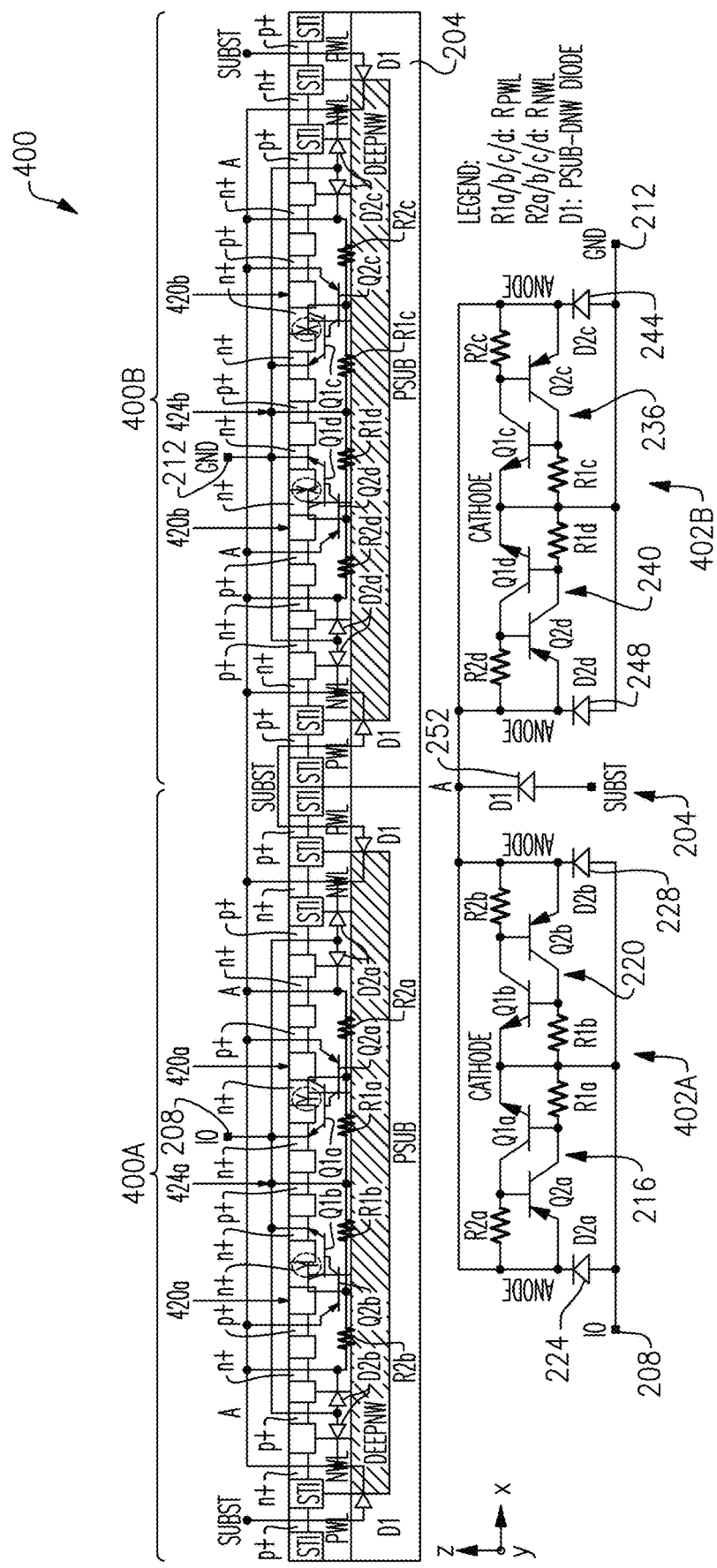
FIG. 4A schematically illustrates a cross-sectional view (top) and a corresponding equivalent circuit diagram (bottom) of a bidirectional communication interface protection device, according to embodiments.
Figure 4C:
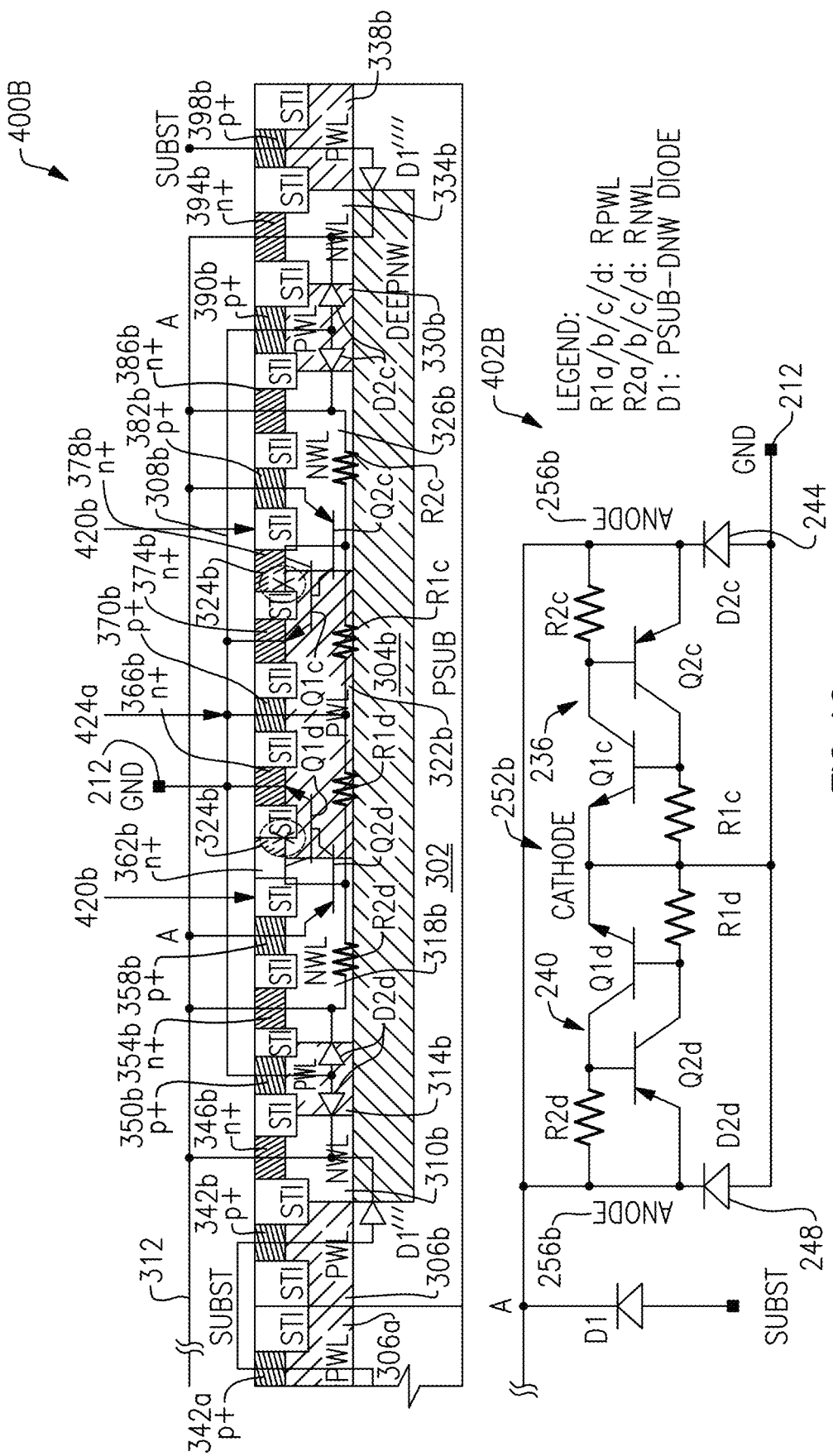
FIG. 4C schematically illustrates a cross-sectional view (top) and a corresponding equivalent circuit diagram (bottom) of a second device region of the bidirectional communication interface protection device illustrated in FIG. 4A.

FIG. 4A schematically illustrates a cross-sectional view (top) and a corresponding equivalent circuit diagram (bottom) of a bidirectional communication interface protection device 400, according to embodiments. Without limitation, the communication interface protection device 400 described herein can be customized to protect core circuits operating at relatively medium voltages, (e.g., between about ±2 V and about ±4 V) and under relatively small bi-polar signals, while having high-stress current handling capabilities. The protection device 400 has first and second device regions 400A and 400B, which include first and second EOS protection switches 402A and 402B, respectively. FIGS. 4B and 4C illustrate, in an analogous manner as illustrated in FIGS. 2B and 2C, the first and second device regions 400A and 400B, respectively, and the first and second EOS protection switches 402A and 402B, respectively. The protection device 400 includes features that correspond to features of the protection device 200 illustrated with respect to FIGS. 2A-2C. The corresponding features that are denoted by the same reference numerals as in FIGS. 2A-2C that have been described above with respect to FIGS. 2A-2C are not described in detail herein for brevity. In the following, features that are different relative to the protection device 200 are described.

Referring to FIG. 4B (top), unlike the first device region 200A of the protection device 200 described above with respect to FIG. 2B, a first device region 400A includes a first holding voltage adjustment means. The first holding voltage adjustment means includes, instead of first holding voltage means including electrically floating metal layers described above with respect to FIGS. 2A-2C, an isolation region 420a in the NW 318a between the p⁺ region 358a and the n⁺ region 362a, and in the NW 326a between the p⁺ region 382a and the n⁺ region 378a. In addition, the p+ region 370a is electrically connected to the first metallization path 308a.

Referring to FIG. 4B (bottom), the effect of these modifications to an equivalent circuit diagram is that each of the base of the first NPN BJT Q1a and the collector of the first PNP BJT Q2a is connected to the cathode 252a through a third resistor R1a.

Similarly, referring to FIG. 4C (top), unlike the second device region 200B of the protection device 200 described above with respect to FIG. 2C, a second device region 400B includes a second holding voltage adjustment means. The second holding voltage adjustment means includes, instead of electrically floating metal layers, an isolation region 420b in the NW 318b between the p⁺ region 358b and the n⁺ region 362b, and in the NW 326b between the p⁺ region 382b and the n⁺ region 378b. In addition, the p+ region 370b is electrically connected to the third metallization path 308b.

Referring to FIG. 4C (bottom), the effect of these modification to an equivalent circuit diagram is that each of the base of the second NPN BJT Q1b and the collector of the second PNP BJT Q2b is connected to the cathode 252a through a fourth resistor R1b. Without being bound to any theory, the modifications to the protection device 200 increases the breakdown characteristics between the adjacent n+ and p+ regions, which in turn increases the trigger and holding voltages of the resulting third and fourth SCRs 236 and 240 by effectively increasing the length of the base regions of the third PNP BJT Q2a and the third PNP BJT Q2b.

Referring to FIGS. 4A-4C, in the following, a summary of the operational principle of the protection device 400 is described. In operation, when a transient electrical signal such as electrostatic discharge (ESD) is received by the first terminal 208 (e.g., an IO terminal) at a positive voltage relative to the second terminal 212 (e.g., a GND terminal), the first EOS protection switch 402A is activated. The activation of the first EOS protection switch 402A is similar to that described above with respect to the first EOS protection switch 202A illustrated in FIG. 2B, including the breakdown of the n+/PW junction 324a between the n+ region 362a/378a and the PW 322a (marked by "X"), causing the first and second NPN BJTs Q1a and Q1b are caused to be turned on, which in turn causes the first and second PNP BJTs Q2a and Q2b to turn on, whereby a positive feedback loop is sustained therebetween to keep the first and second SCRs 216 and 220 activated, until the ESD may be substantially discharged. Unlike the first protection switch 202A (FIG. 2B), however, the structural modifications described above increases the breakdown characteristics between the adjacent n+ and p+ regions, which in turn increases the trigger and/or holding voltages of the resulting first and second SCRs 216 and 220 by effectively increasing the length of the base regions of the first PNP BJT Q2a and the second PNP BJT Q2b.

Conversely, when a transient electrical signal such as electrostatic discharge (ESD) is received by the first terminal 208 (e.g., an IO terminal) at a negative voltage relative to the second terminal 212 (e.g., a GND terminal), the second EOS protection switch 602B is activated. The activation of the second EOS protection switch 602B is similar to that described above with respect to the second EOS protection switch 202B illustrated in FIG. 2C, including the breakdown of the n+/PW junction 324b between the n+ region 362b/

378b and the PW 322b (marked by "X"), causing the third and fourth NPN BJTs Q1c and Q1d are caused to be turned on, which in turn causes the third and fourth PNP BJTs Q2c and Q2d to turn on, whereby a positive feedback loop is sustained therebetween to keep the third and fourth SCRs 236 and 240 activated, until the ESD may be substantially discharged. Unlike the first protection switch 202A (FIG. 2B), however, the structural modifications described above increases the breakdown characteristics between the adjacent n+ and p+ regions, which in turn increases the trigger and holding voltages of the resulting third and fourth SCRs 236 and 240 by effectively increasing the length of the base regions of the third PNP BJT Q2a and the third PNP BJT Q2b.

Figure 4D:
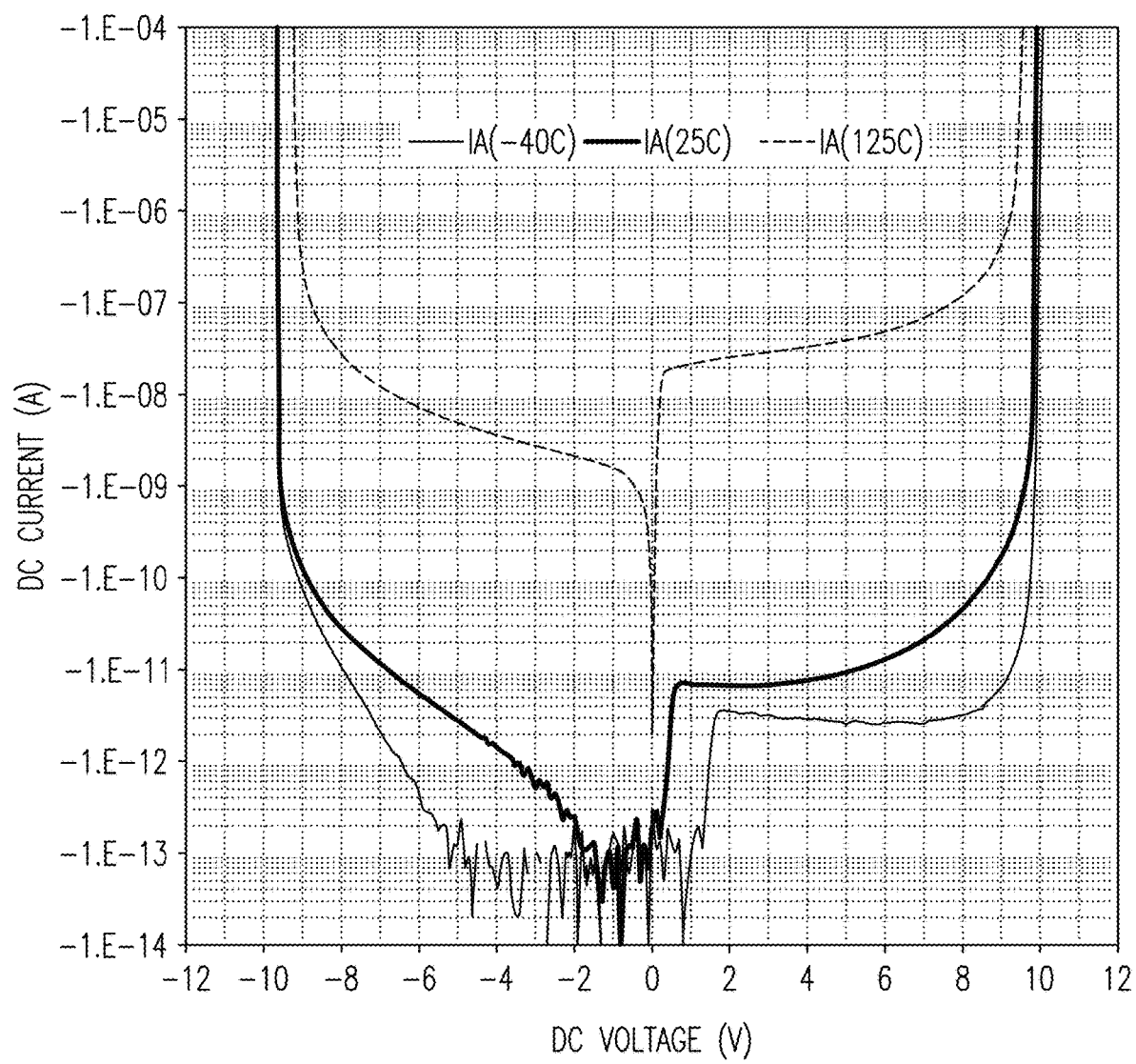
FIG. 4D displays experimental DC current-voltage (IV) curves obtained from a bidirectional communication interface protection device illustrated in FIGS. 4A-4C, 5A-5B at different temperatures.
Figure 4E:
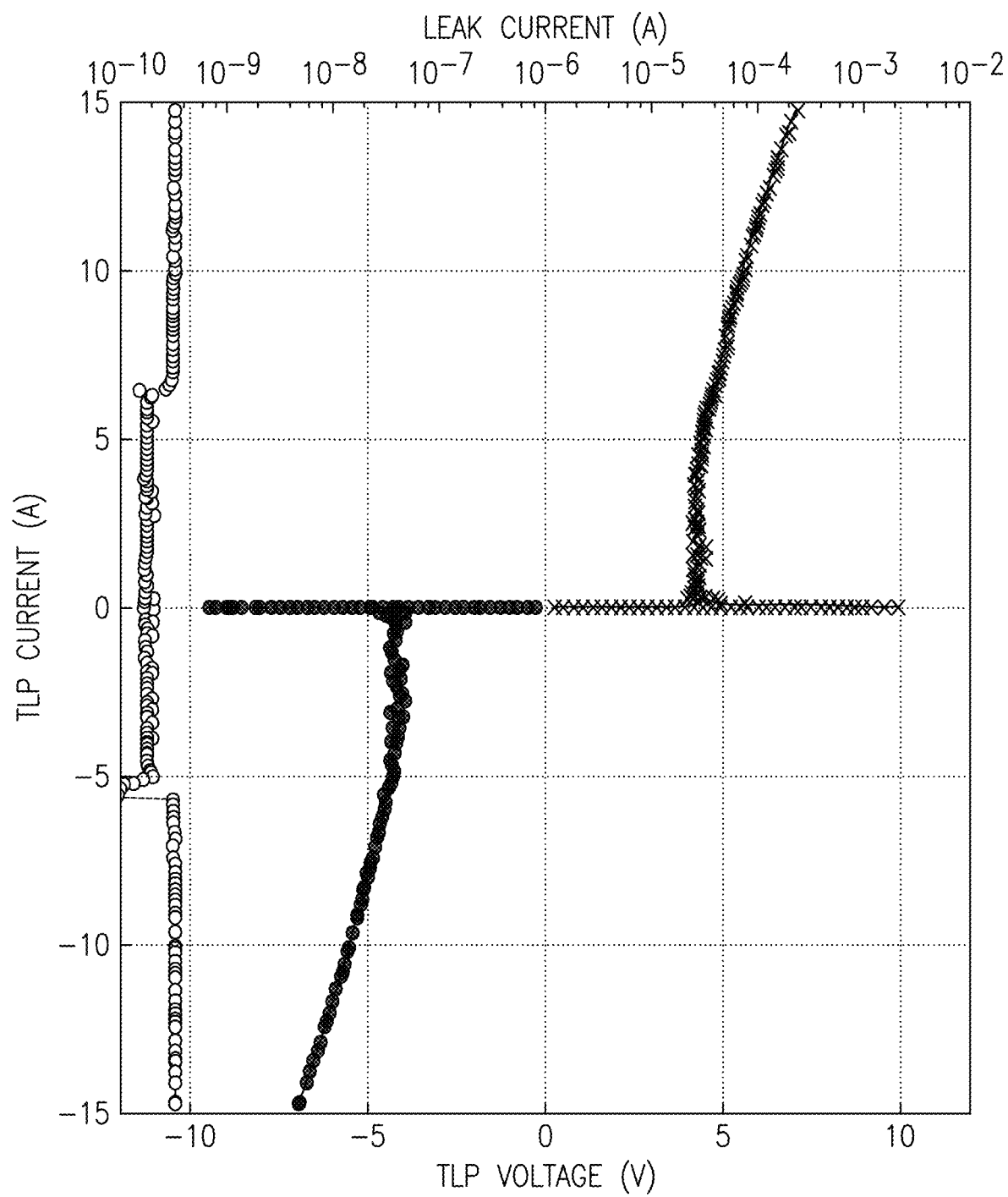
FIG. 4E displays experimental IV curves obtained under HMM high stress 8 kV equivalent test from a bidirectional communication interface protection device illustrated in FIGS. 4A-4C, 5A-5B.
Figure 4F:
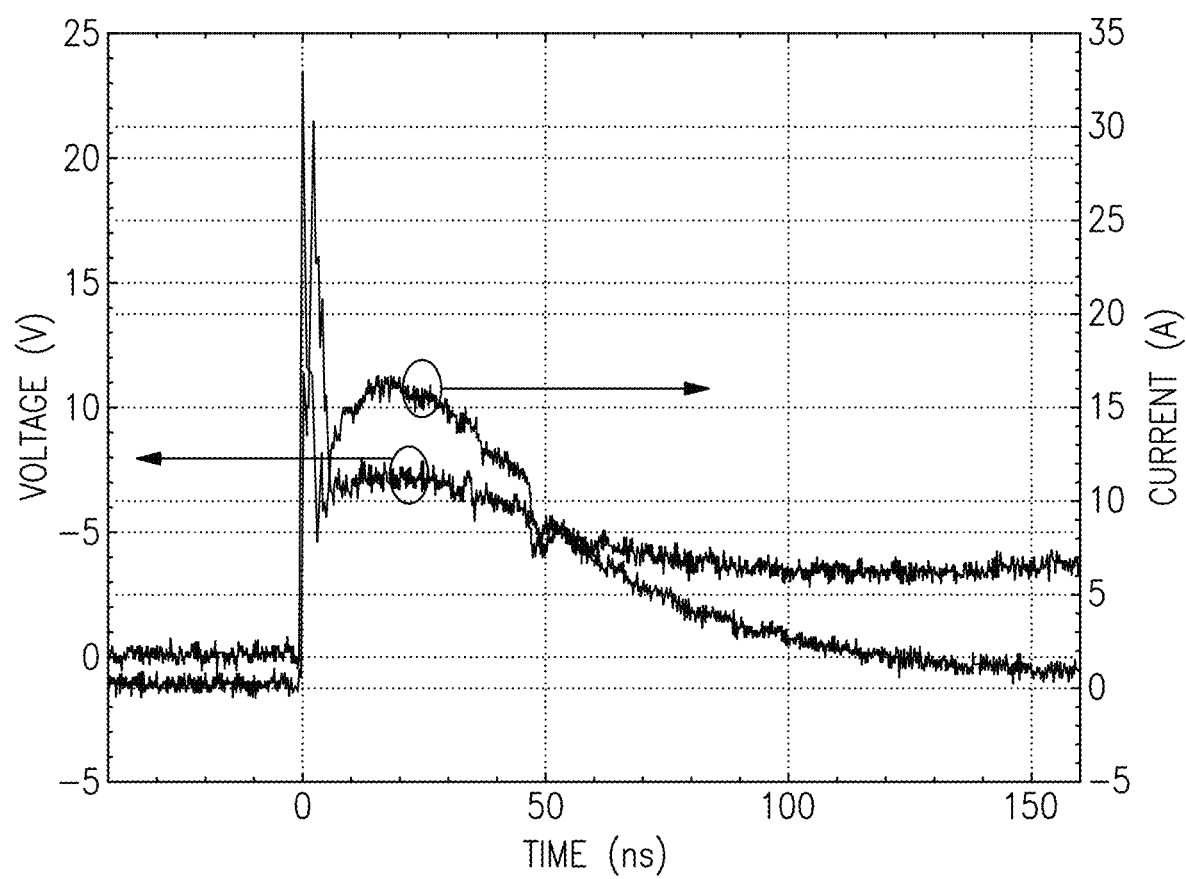
FIG. 4F displays positive waveforms corresponding to the IV curves illustrated in FIG. 4E.
Figure 4G:
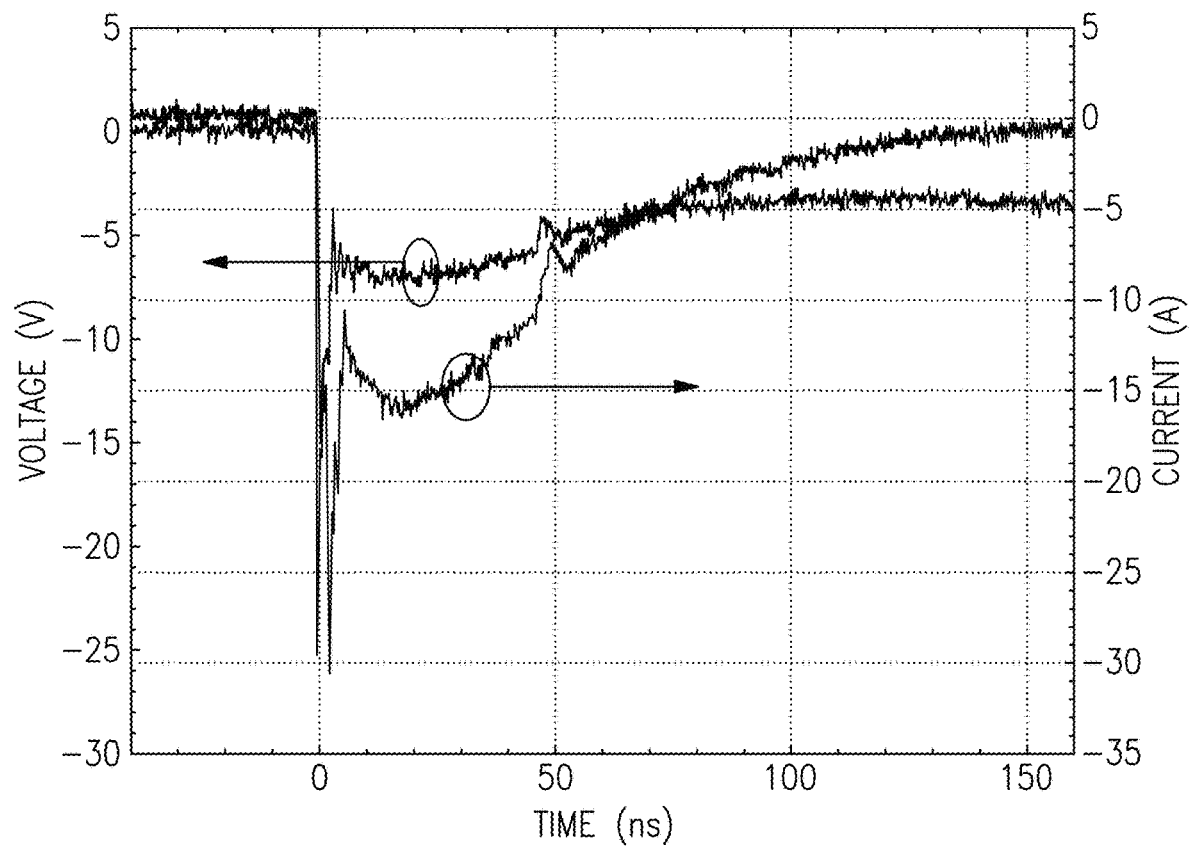
FIG. 4G displays negative waveforms corresponding to the IV curves illustrated in FIG. 4E.
Figure 4H:
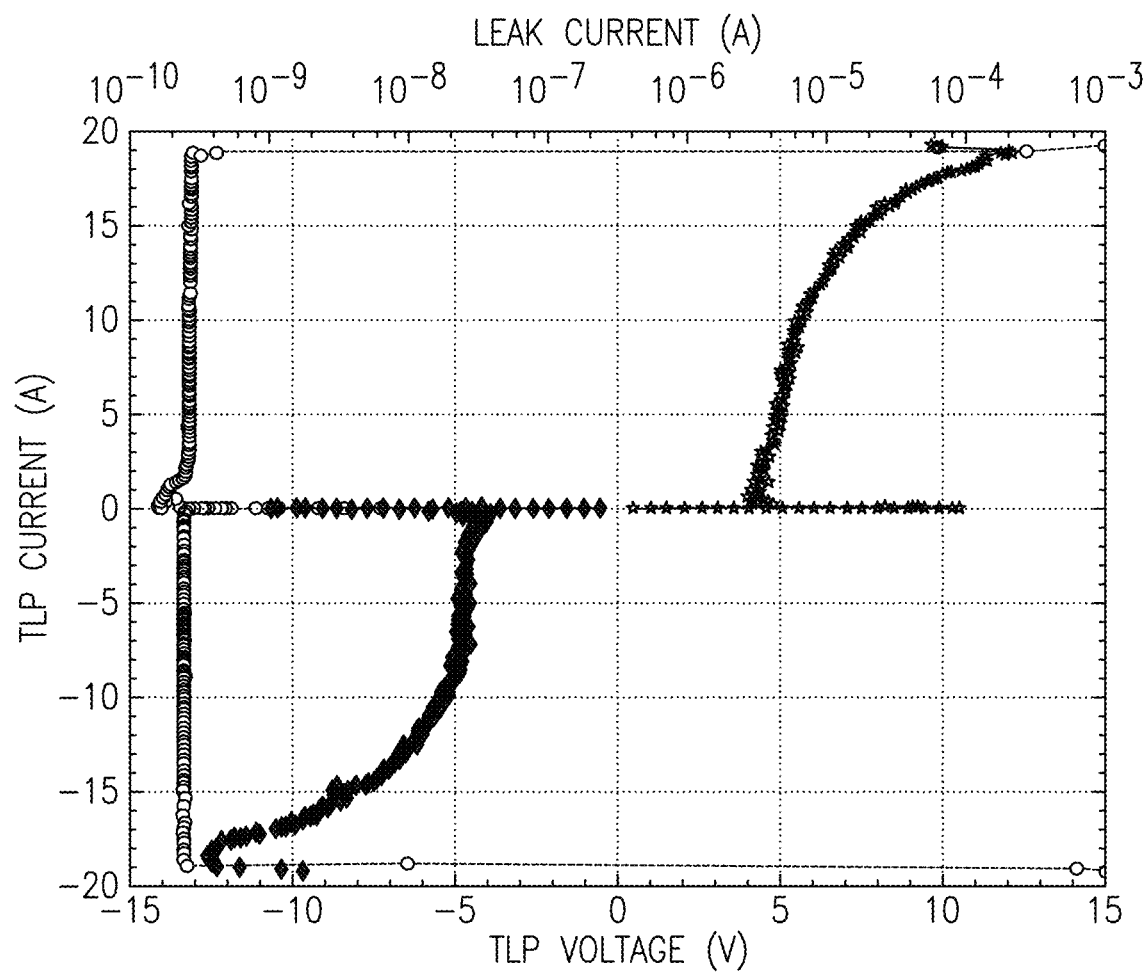
FIG. 4H displays experimental IV curves obtained under 100 ns pulse transmission line pulse (TLP) testing condition width from a bidirectional communication interface protection device illustrated in FIGS. 4A-4C, 5A-5B.
Figure 4I:
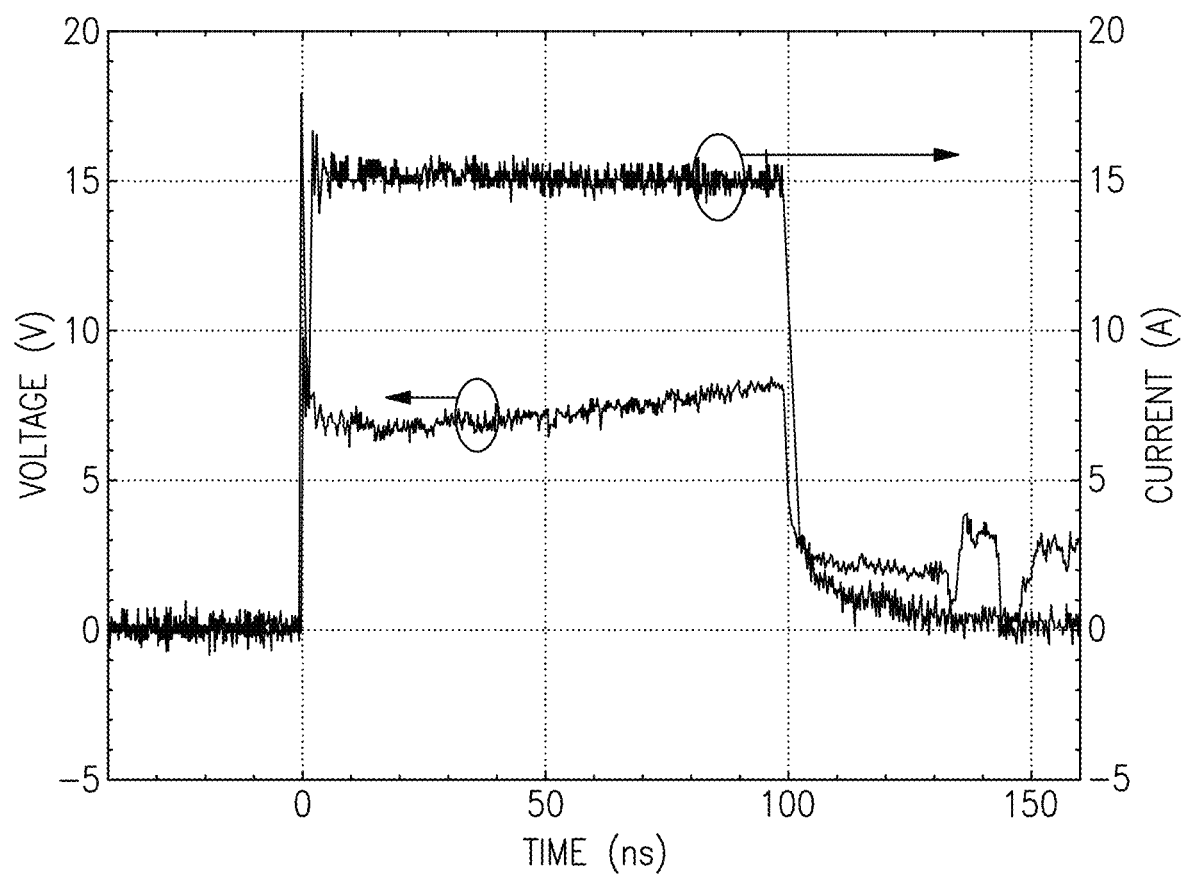
FIG. 4I displays positive waveforms corresponding to the IV curves illustrated in FIG. 4H.
Figure 4J:
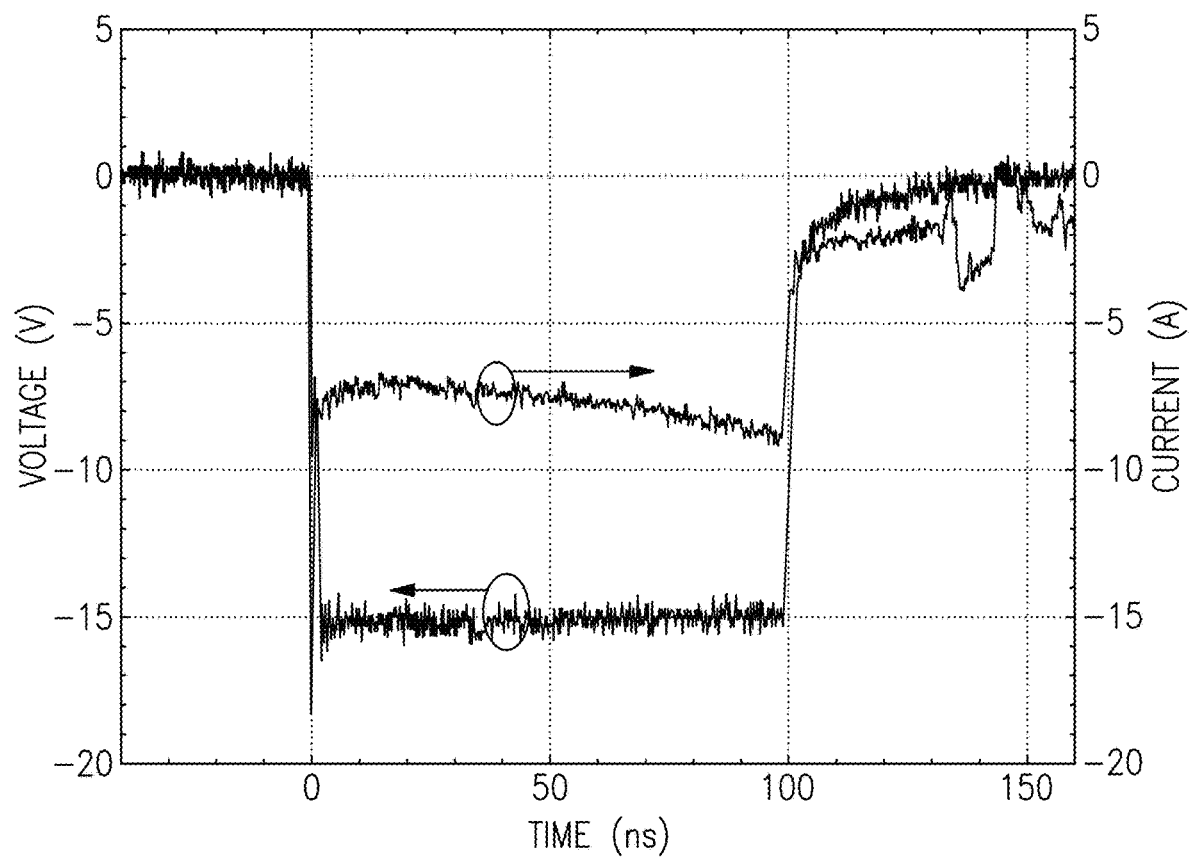
FIG. 4J displays negative waveforms corresponding to the IV curves illustrated in FIG. 4H.

FIGS. 4D-4J illustrate experimental measurements obtained from an example implantation of the protection device 400 described above. FIG. 4D displays experimental DC current-voltage (IV) curves obtained at different temperatures, namely at −40° C., 25° C. and 125° C. FIG. 4E displays experimental IV curves obtained under HMM high stress 8 kV equivalent test, and FIGS. 4F and 4G display the corresponding waveforms. FIG. 4H displays experimental IV curves obtained from the protection under transmission line pulse (TLP) testing condition of 100 ns pulse width, and FIGS. 4I and 4J display the corresponding waveforms.

Figure 5A:
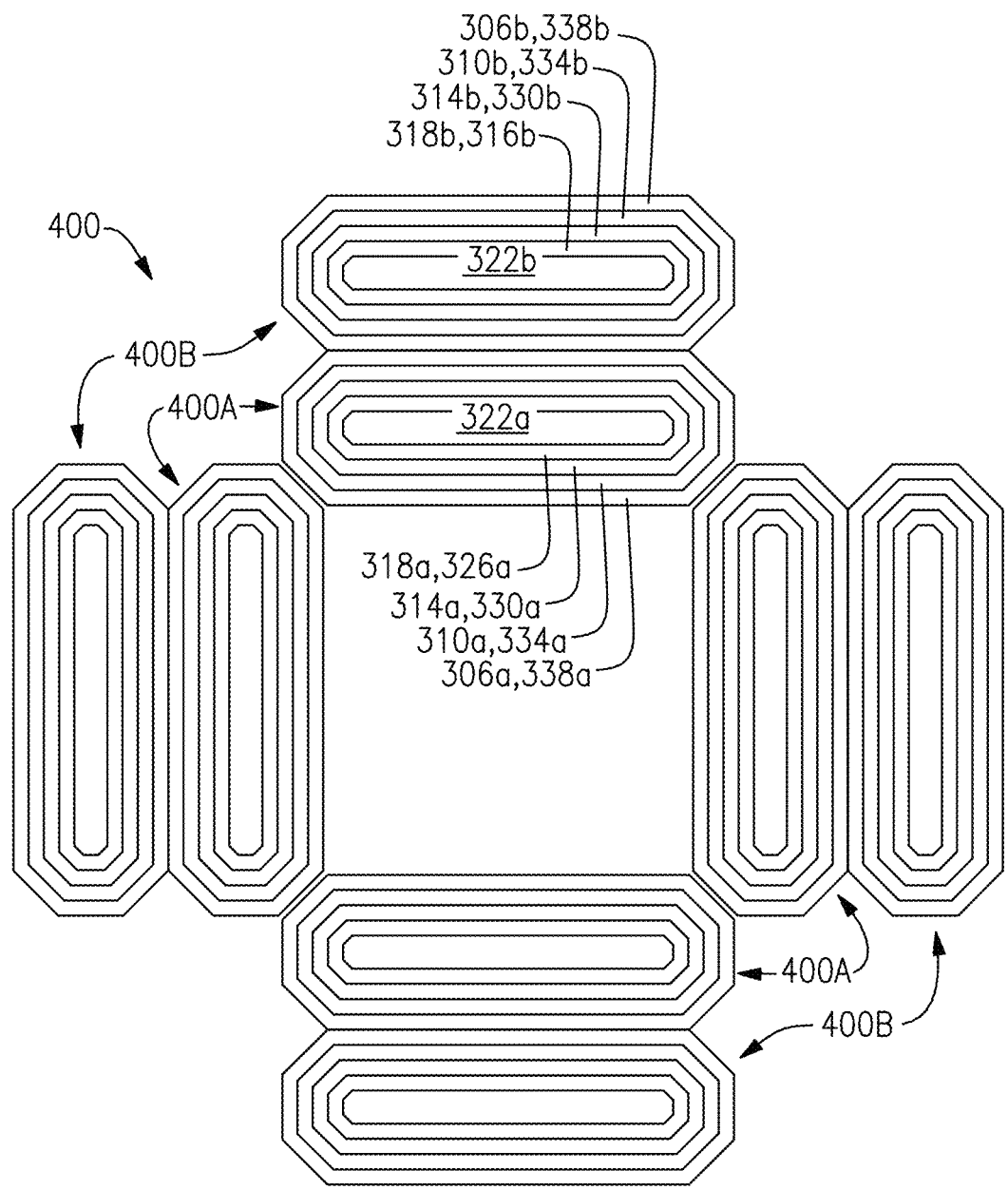
FIG. 5A schematically illustrates a plan view of a radial high current handling capability bidirectional communication interface protection device pad array having a plurality of first device regions each having well regions arranged in an annular configuration, and a plurality of second device regions each having well regions arranged in an annular configuration, according to embodiments.
Figure 5B:
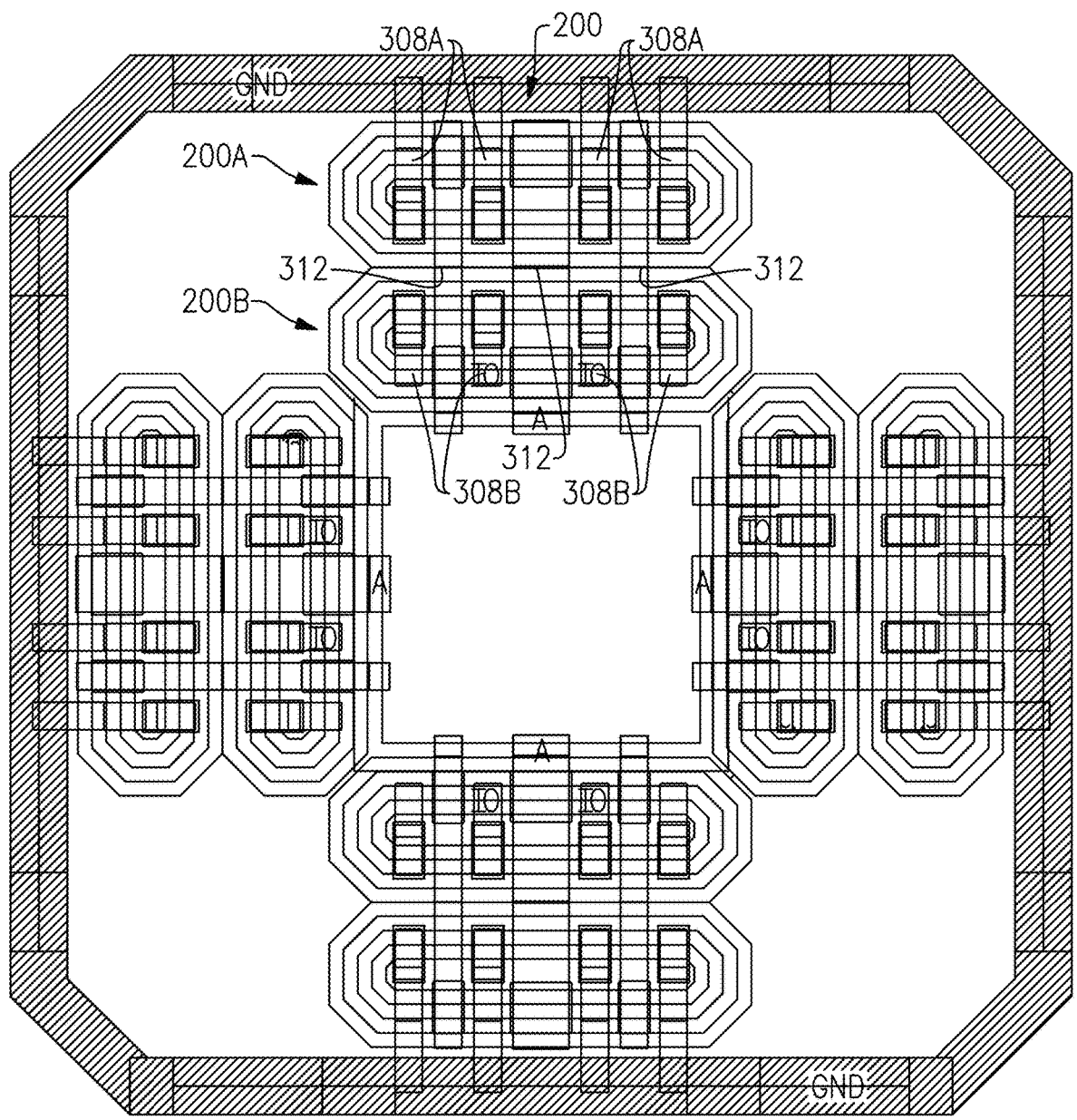
FIG. 5B schematically illustrates a plan view of the bidirectional communication interface protection device illustrated in FIG. 5A including metallization, ground trench distribution, and a pad located at the center, according to embodiments.

FIGS. 5A and 5B illustrate schematic plan views of a bidirectional communication interface protection device 400, according to some embodiments. In the illustrated embodiment, unlike the protection device 200 described above with respect to FIGS. 2D and 2E, the protection device 400 comprises a plurality of first device regions 400A, which may be arranged as a quadruple annular layout as shown and a plurality of device regions 400B, which may be arranged as a quadruple annular layout as shown, where each of the device regions 400A and 400B are arranged to have an annular configuration above with respect to FIGS. 2D and 2E. FIG. 5A illustrates a plan view showing PWs and NWs only, of the protection device 400 illustrated in FIGS. 4A-4C, for clarity of purposes, and FIG. 5B illustrates the PWs and NWs of protection device 400 along with the first, second and third metallization paths 308a, 308b and 312. The annular configurations of the PWs, NWs, p+ regions and n+ regions are similar to the corresponding regions described above with respect to FIGS. 2D and 2E, and their detailed description is omitted herein for brevity.

FIG. 4A schematically illustrates a cross-sectional view (top) and a corresponding equivalent circuit diagram (bottom) of a bidirectional video link interface protection device 400, according to embodiments. The protection device 400 has first and second device regions 400A and 400B, which include first and second EOS protection switches 402A and 402B, respectively. FIGS. 4B and 4C illustrate, in an analogous manner as illustrated in FIGS. 2B and 2C, the first and second device regions 400A and 400B, respectively, and the first and second EOS protection switches 402A and 402B, respectively. The protection device 400 includes features that correspond to features of the protection device 200 illustrated with respect to FIGS. 2A-2C. The corresponding features that are denoted by the same reference numerals as in FIGS. 2A-2C that have been described above with respect to FIGS. 2A-2C are not described in detail herein. In the following, features that are different relative to the protection device 200 are described.

Figure 6A:
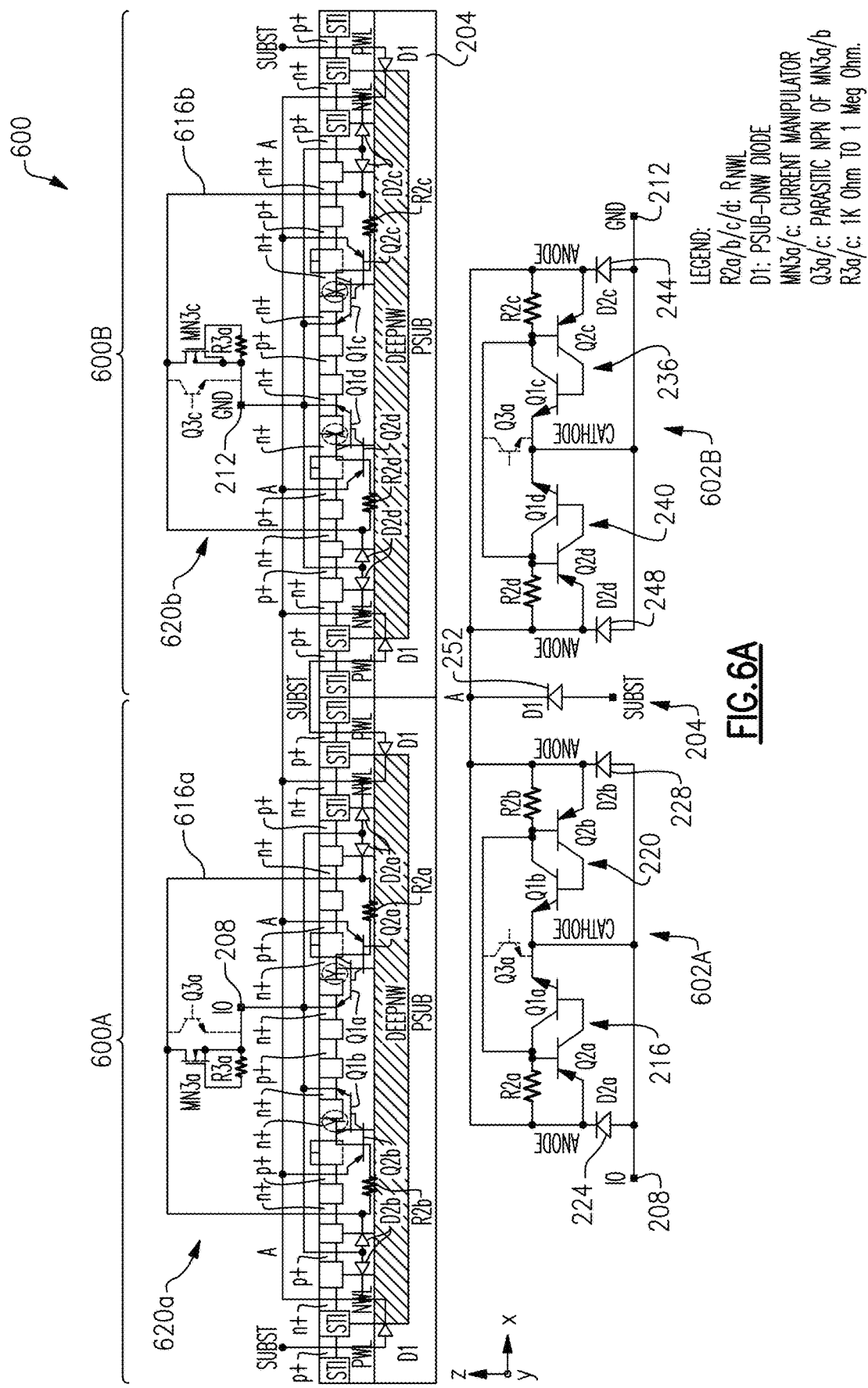
FIG. 6A schematically illustrates a cross-sectional view (top) and a corresponding equivalent circuit diagram (bottom) of a bidirectional communication interface protection device, and a plurality of trigger and holding voltage control means, according to embodiments.

FIG. 6A schematically illustrates a cross-sectional view (top) and a corresponding equivalent circuit diagram (bottom) of a bidirectional communication interface protection device 600, according to embodiments. Without limitation, the communication interface protection device 600 can be customized to protect core circuits operating at relatively high voltages, (e.g., about ±5V and higher) and under relatively small bi-polar signals, while having high-stress current handling capabilities. The protection device 600 has first and second device regions 600A and 600B, which include first and second EOS protection switches 602A and 602B, respectively, in an analogous manner as illustrated in FIGS. 2B and 2C. The protection device 600 includes features that correspond to features of the protection device 200 illustrated with respect to FIGS. 2A-2C. The corresponding features that are denoted by the same reference numerals as in FIGS. 2A-2C that have been described above with respect to FIGS. 2A-2C are not described in detail herein. In the following, features that are different relative to the protection device 200 are described.

Figure 6B:
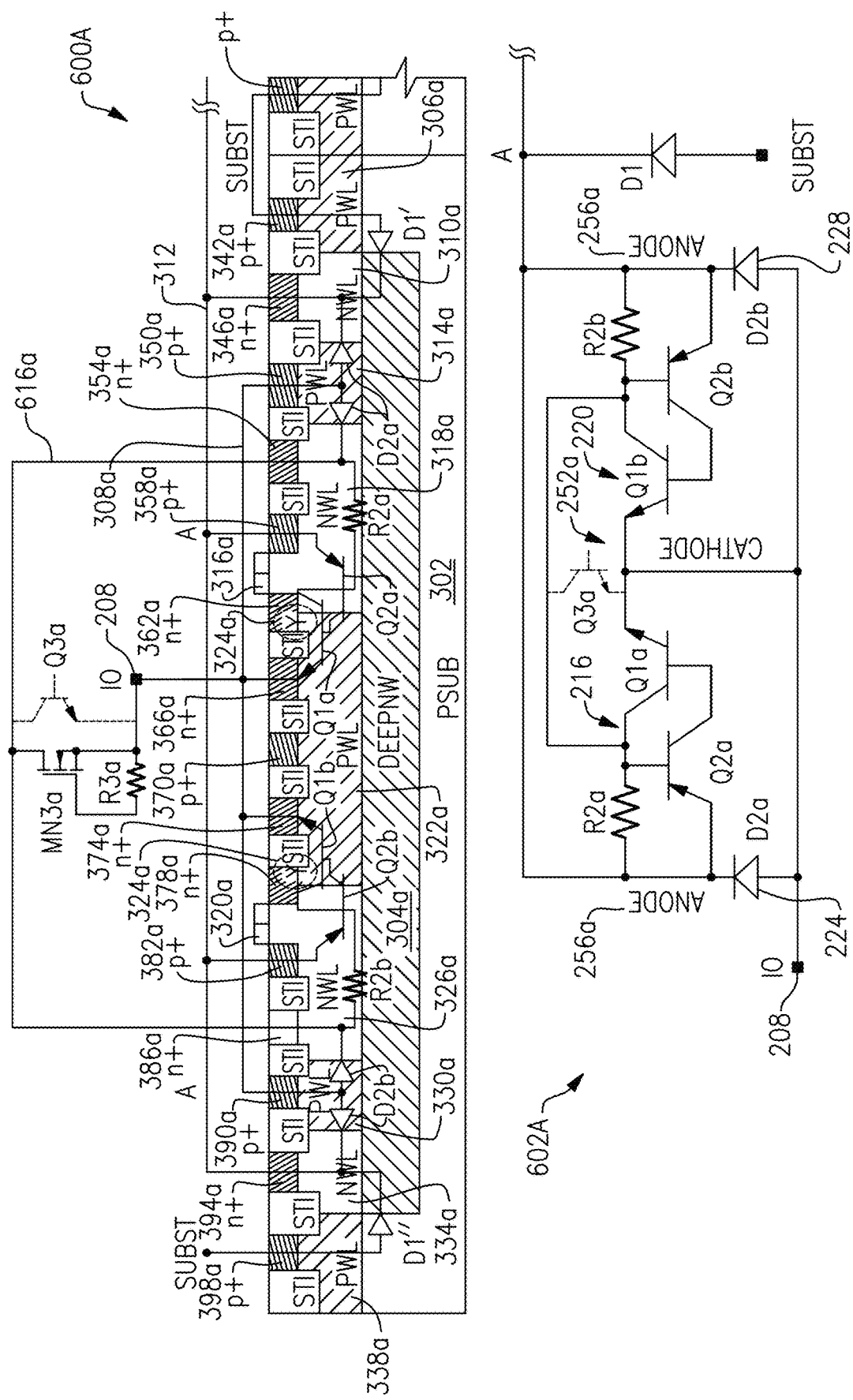
FIG. 6B schematically illustrates a cross-sectional view (top) and a corresponding equivalent circuit diagram (bottom) of a first device region of the bidirectional communication interface protection device illustrated in FIG. 6A.

Referring to FIG. 6B (top), unlike the first device region 200A of the protection device 200 described above with respect to FIG. 2B, the first device region 600A includes a third holding voltage adjustment means 620a. The third holding voltage adjustment means 620a includes a fourth metallization path 616a electrically connecting the n+ regions 386a and 354a. The third holding voltage adjustment means 620a further includes a first current manipulator, which can be a first gate-grounded MOS transistor MN3a or a first open base NPN BJT Q3a electrically connecting the fourth metallization path 616a to the common cathode 252a. In the illustrated embodiment, the first gate-grounded MOS transistor MN3a is a gate-grounded NMOS transistor. The first gate-grounded MOS transistor MN3a includes source, channel and drain regions, where the drain is connected to the common cathode 252a of the first and second SCRs 216, 220. In the illustrated embodiment, the first gate-grounded MOS transistor MN3a forms the first open base NPN BJT Q3a as a parasitic NPN transistor. However, embodiments are not so limited, and in other implementations, the first open base NPN BJT Q3a can be formed as a non-parasitic BJT.

Referring to FIG. 6B (bottom), the effect of these modifications to the equivalent circuit diagram is that bases of the first and second PNP BJT Q2a and PNP BJT Q2b are connected to each other and to the common cathode 252a.

Referring to FIG. 6C (top), unlike the second device region 200B of the protection device 200 described above with respect to FIG. 2C, the second device region 600B includes a fourth holding voltage adjustment means 620b. The fourth holding voltage adjustment means 620b includes a fifth metallization path 616b electrically connecting the n+ regions 386b and 354b. The fourth holding voltage adjustment means 620b further includes a first current manipulator, which can be a second gate-grounded MOS transistor MN3c or a second open base NPN BJT Q3a electrically connecting the fifth metallization path 616b to the common cathode 252b. In the illustrated embodiment, the second gate-grounded MOS transistor MN3b is a gate-grounded NMOS transistor. The second gate-grounded MOS transistor MN3a includes source, channel and drain regions, where the drain is connected to the common cathode 252b of the third and fourth SCRs 236, 240. In the illustrated embodiment, the second gate-grounded MOS transistor MN3a forms the second open base NPN BJT Q3b as a parasitic NPN transistor. However, embodiments are not so limited, and in other implementations, the second open base NPN BJT Q3b can be formed as a non-parasitic BJT Referring to FIG. 6C (bottom), the effect of these modifications to the equivalent circuit diagram is that bases of the first and second PNP BJT Q2a and PNP BJT Q2b are connected to each other and to the common cathode 252a.

Referring to FIGS. 6A-6C, in the following, a summary of the operational principle of the protection device 600 is described. In operation, when a transient electrical signal such as electrostatic discharge (ESD) is received by the first terminal 208 (e.g., an IO terminal) at a positive voltage relative to the second terminal 212 (e.g., a GND terminal), the first EOS protection switch 602A is activated. The activation of the first EOS protection switch 602A is similar to that described above with respect to the first EOS protection switch 202A illustrated in FIG. 2B, including the breakdown of the n+/PW junction 324a between the n+ region 362a/378a and the PW 322a (marked by "X"), causing the first and second NPN BJTs Q1a and Q1b are caused to be turned on, which in turn causes the first and second PNP BJTs Q2a and Q2b to turn on, whereby a positive feedback loop is sustained therebetween to keep the first and second SCRs 216 and 220 activated, until the ESD may be substantially discharged. Unlike the first protection switch 202A (FIG. 2B), however, an additional current discharge path through the first gate-grounded MOS transistor MN3a or the first open base NPN BJT Q3a is provided. When the first gate-grounded MOS transistor MN3a or the first open base NPN BJT Q3a is activated, e.g., at around 9V, it steers away a portion of current out of the bases of the first and second PNP BJTs Q2a and Q2b, which otherwise would have been fed to the collectors of first and second NPN BJTs Q1a and Q1b. As a result, a reduced amount of current flows to the collectors of the first and second NPN BJTs Q1a and Q1b, thereby resulting in a lower effective current gain thereof, which in turn results in a higher trigger voltage and/or holding voltage of the first and second SCRs 216 and 220.

Conversely, when a transient electrical signal such as electrostatic discharge (ESD) is received by the first terminal 208 (e.g., an IO terminal) at a negative voltage relative to the second terminal 212 (e.g., a GND terminal), the second EOS protection switch 602B is activated. The activation of the second EOS protection switch 602B is similar to that described above with respect to the second EOS protection switch 202B illustrated in FIG. 2C, including the breakdown of the n+/PW junction 324b between the n+ region 362b/378b and the PW 322b (marked by "X"), causing the third and fourth NPN BJTs Q1c and Q1d are caused to be turned on, which in turn causes the third and fourth PNP BJTs Q2c and Q2d to turn on, whereby a positive feedback loop is sustained therebetween to keep the third and fourth SCRs 236 and 240 activated, until the ESD may be substantially discharged. Unlike the first protection switch 202A (FIG. 2B), however, an additional current discharge path through the second gate-grounded MOS transistor MN3c or the second open base NPN BJT Q3c is provided. When the second gate-grounded MOS transistor MN3c or the second open base NPN BJT Q3c is activated, e.g., at around 9V, it steers away a portion of current out of the bases of the third and fourth PNP BJTs Q2c and Q2d, which otherwise would have been fed to the collectors of third and fourth NPN BJTs Q1c and Q1d. As a result, a reduced amount of current flows to the collectors of the third and fourth NPN BJTs Q1c and Q1d, thereby resulting in a lower effective current gain thereof, which in turn results in a higher trigger voltage and/or holding voltage of the third and fourth SCRs 236 and 240.

Figure 6D:
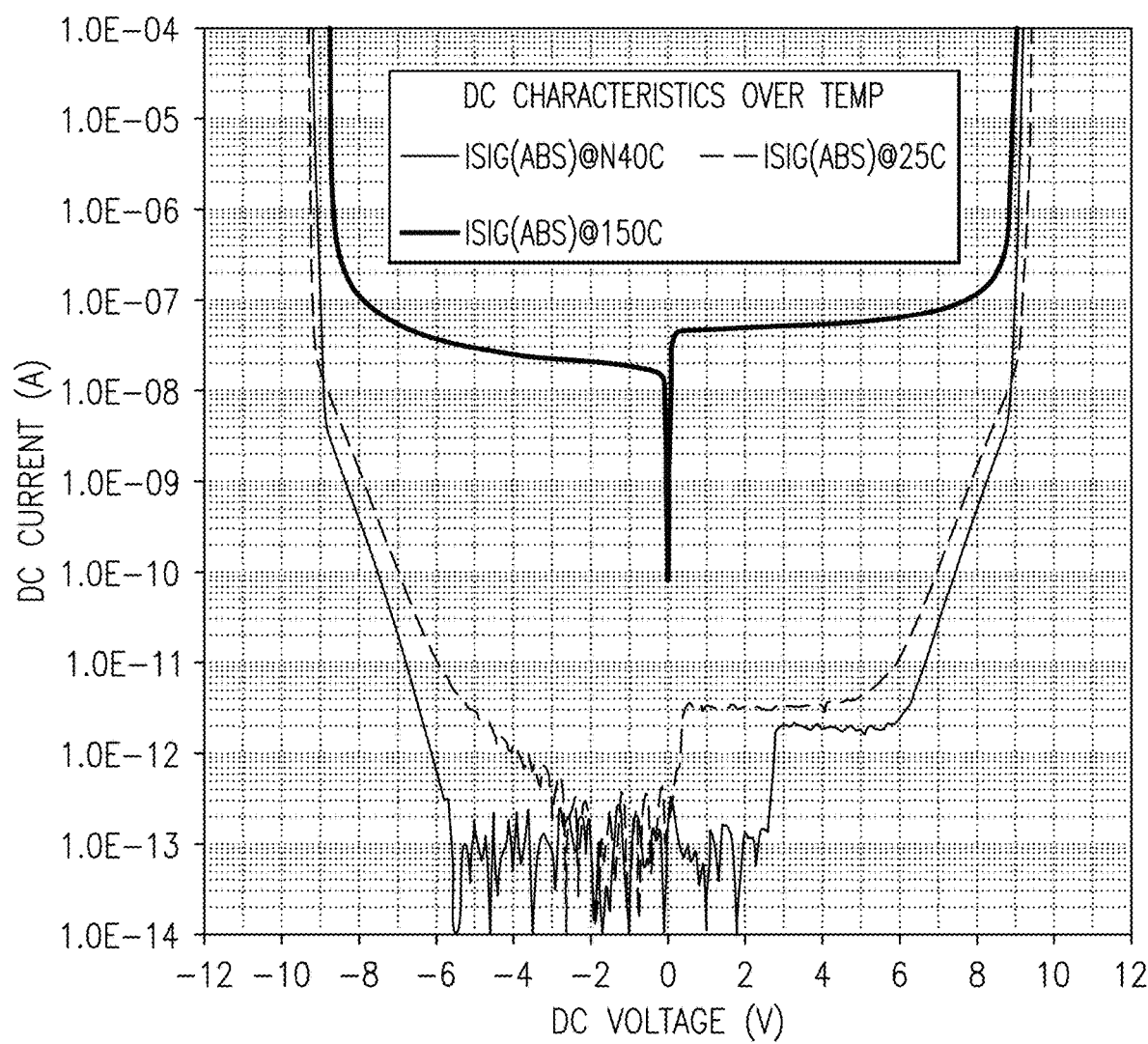
FIG. 6D displays experimental DC current-voltage (IV) curves obtained from a bidirectional communication interface protection device illustrated in FIGS. 6A-6C at different temperatures.
Figure 6E:
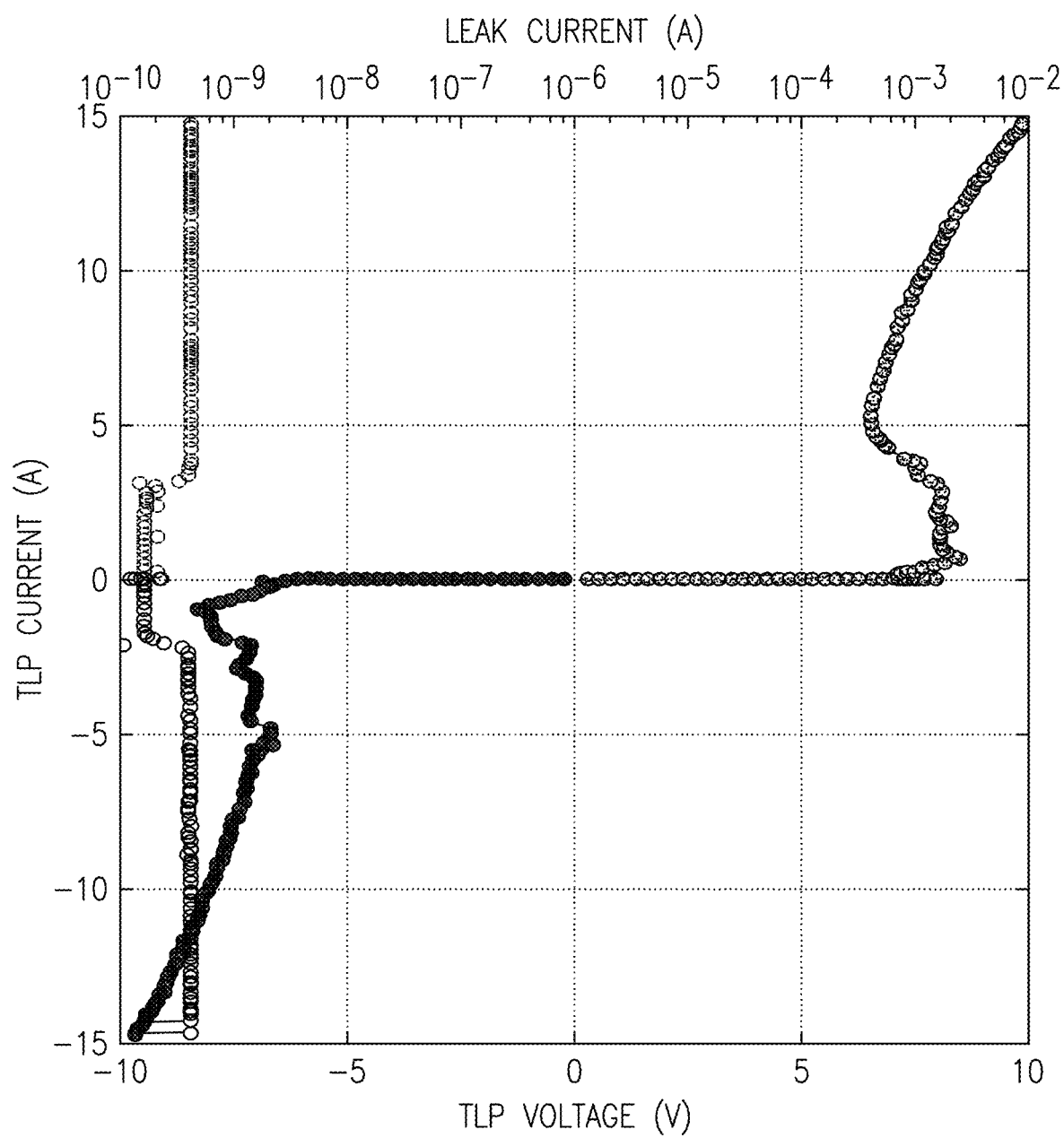
FIG. 6E displays experimental IV curves obtained under HMM high stress 8 kV equivalent test from a bidirectional communication interface protection device illustrated in FIGS. 6A-6D.
Figure 6F:
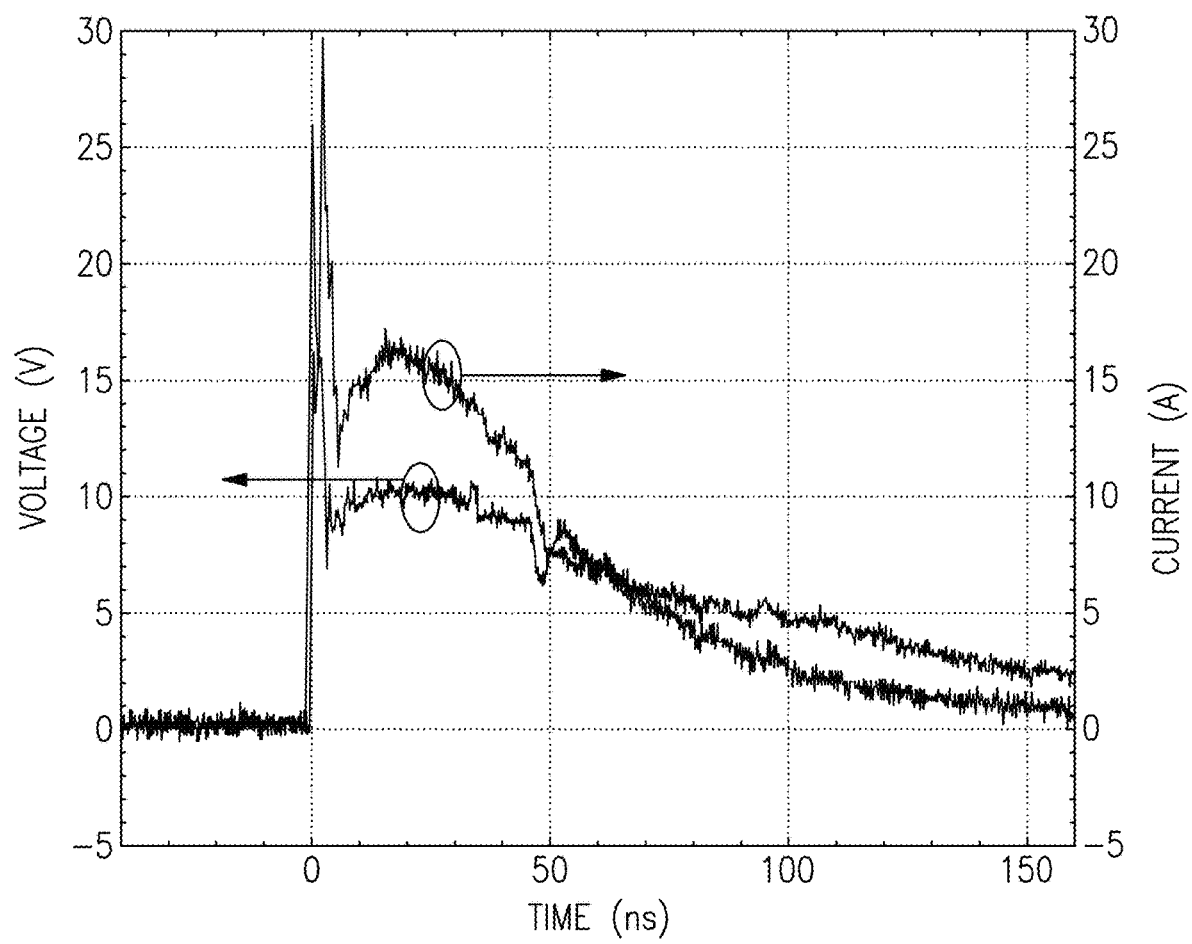
FIG. 6F displays positive waveforms corresponding to the IV curves illustrated in FIG. 6E.
Figure 6G:
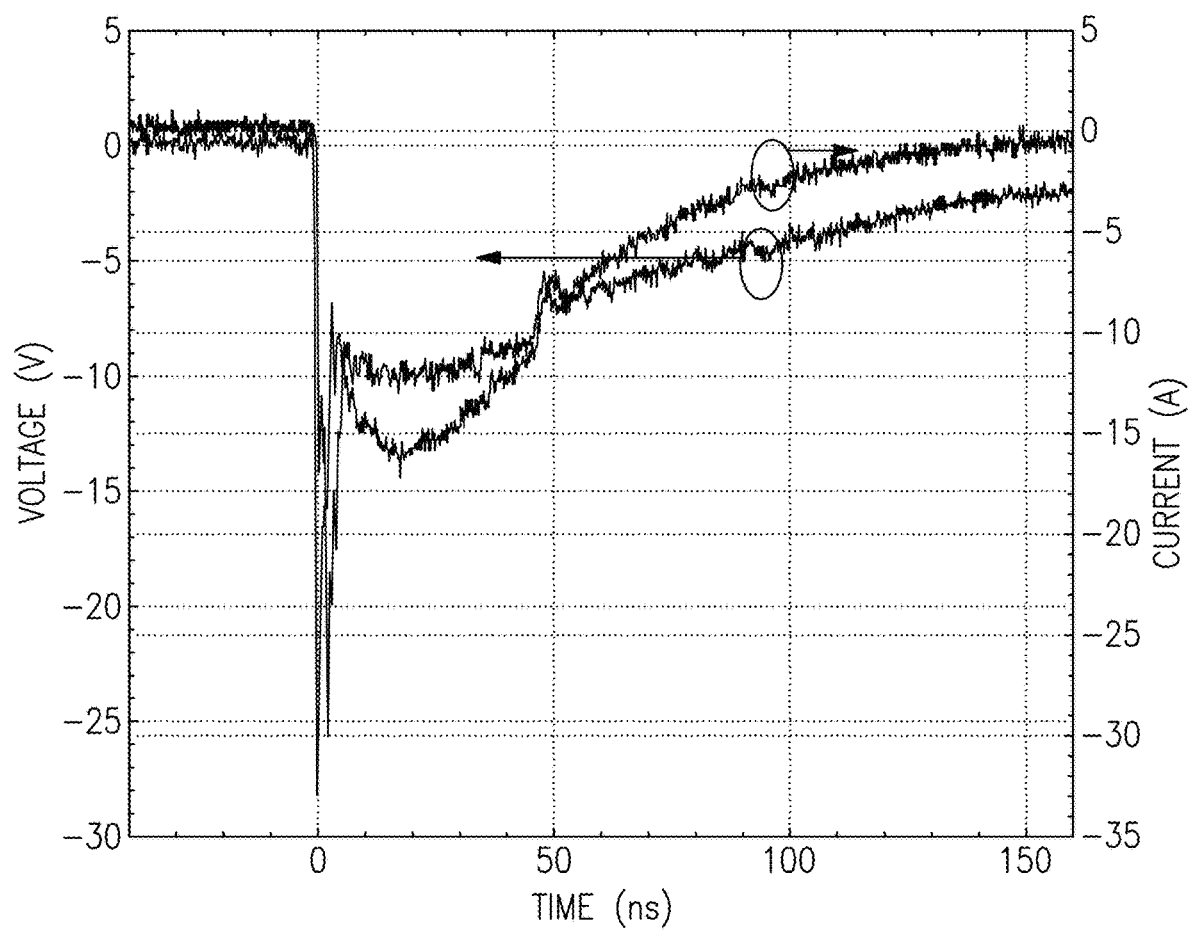
FIG. 6G displays negative waveforms corresponding to the IV curves illustrated in FIG. 6E.
Figure 6H:
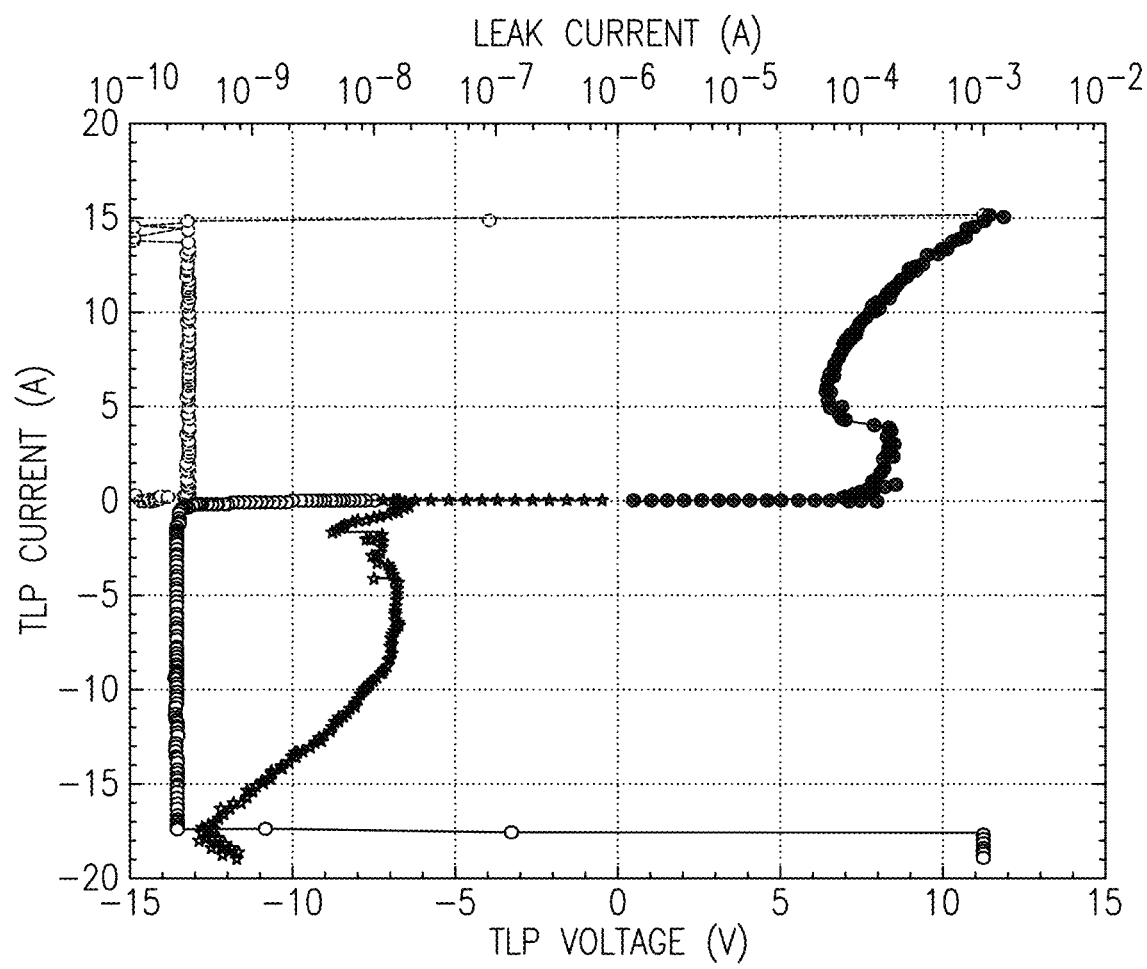
FIG. 6H displays experimental IV curves obtained under 100 ns pulse width transmission line pulse (TLP) testing condition from a bidirectional communication interface protection device illustrated in FIGS. 6A-6D.
Figure 61:
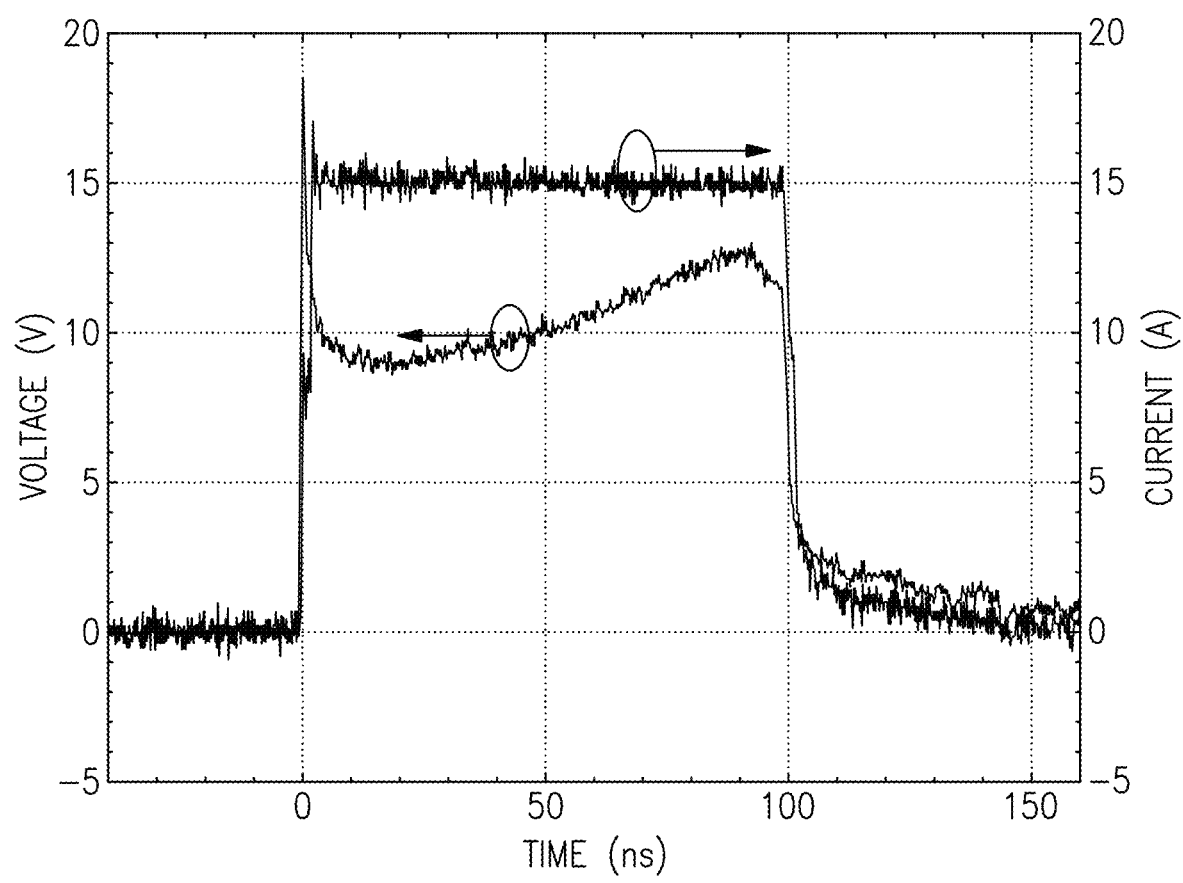
Figure 6J:
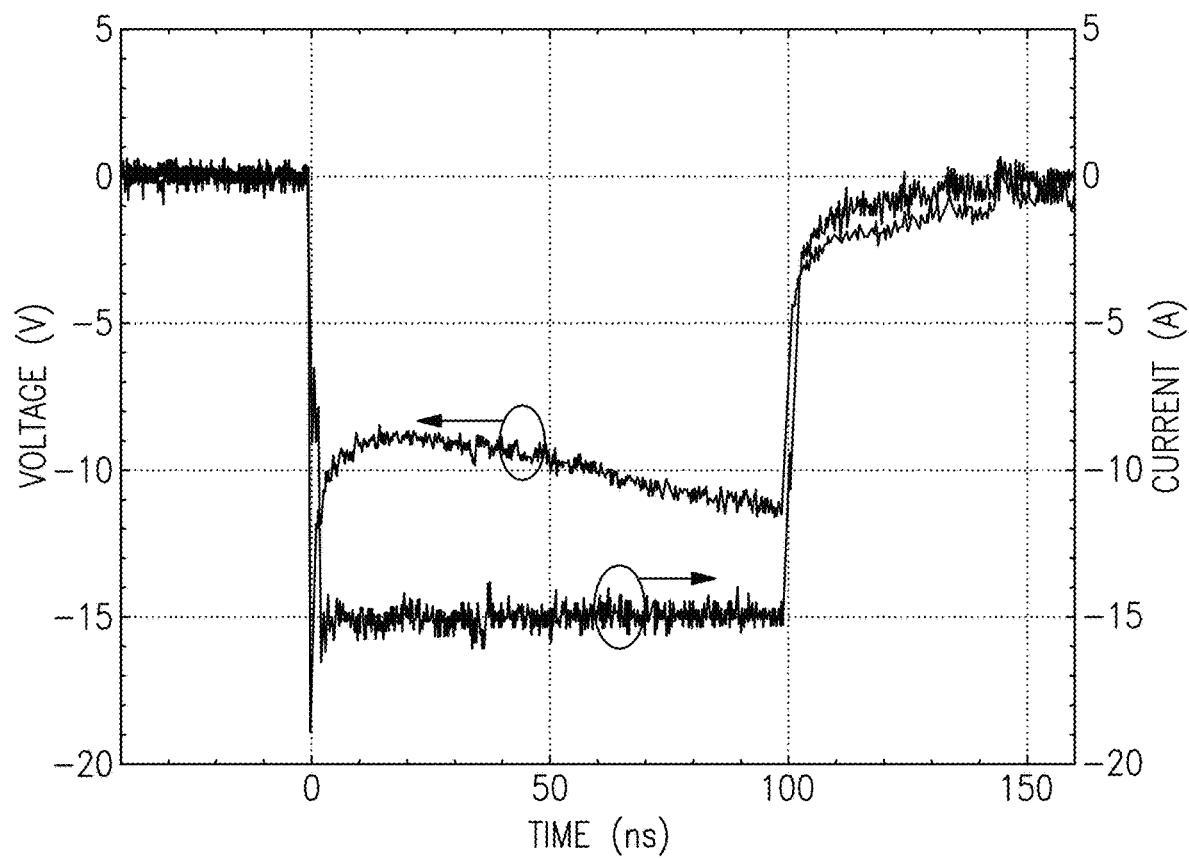
FIG. 6J displays negative waveforms corresponding to the IV curves illustrated in FIG. 6H.

FIGS. 6D-6J illustrate experimental measurements obtained from an example implantation of the protection device 600 described above. FIG. 6D displays experimental DC current-voltage (IV) curves obtained at different temperatures, namely at −40° C., 25° C. and 150° C. FIG. 6E displays experimental IV curves obtained under HMM high stress 8 kV equivalent test, and FIGS. 6F and 6G display the corresponding wave forms. FIG. 6H displays experimental IV curves obtained from the protection under transmission line pulse (TLP) testing condition of 100 ns pulse width, and FIGS. 6I and 6J display the corresponding waveforms.

Figure 6K:
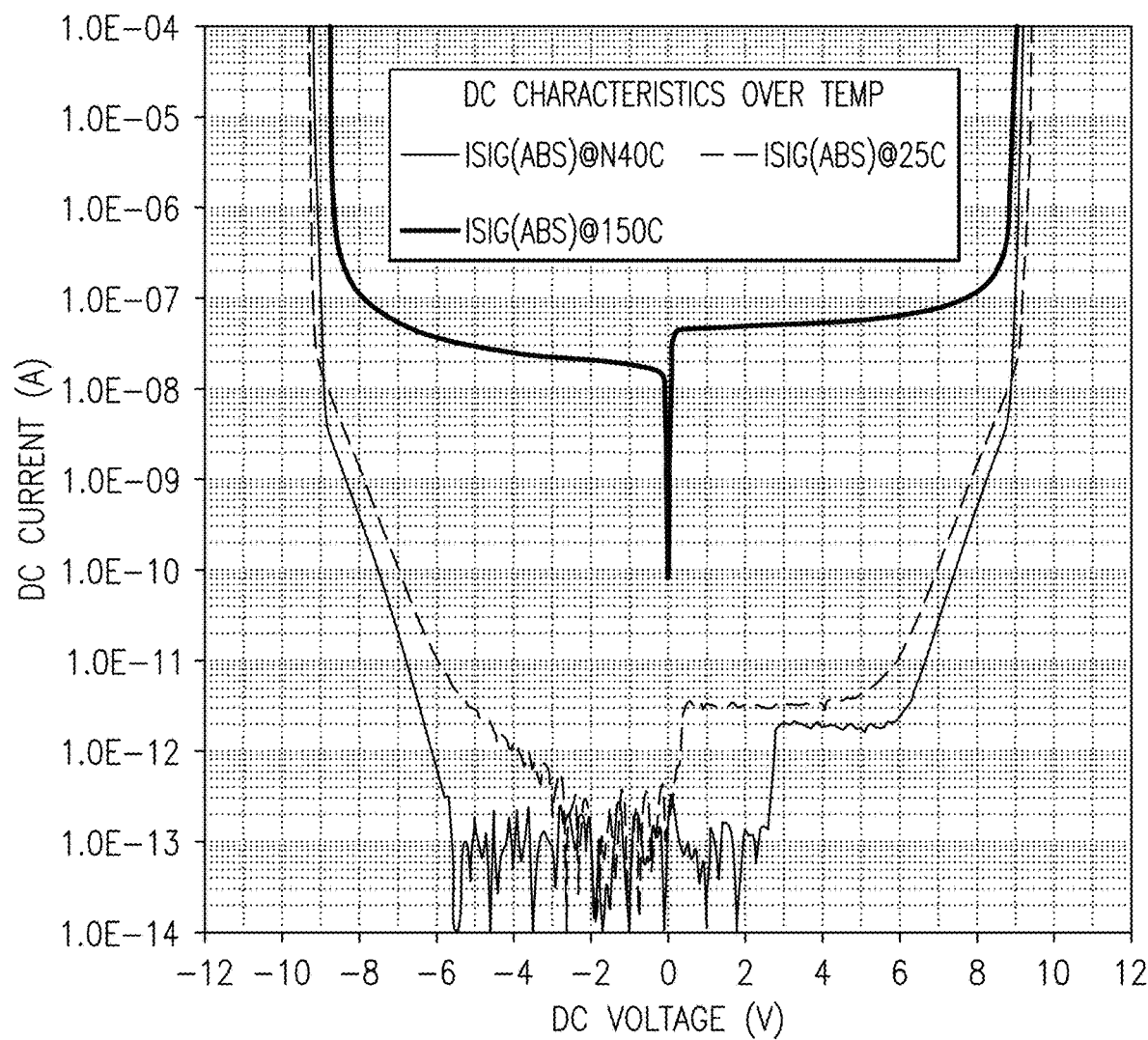
FIG. 6K displays experimental DC current-voltage (IV) curves obtained from a bidirectional communication interface protection device illustrated in FIGS. 6A-6D at different temperatures.
Figure 6L:
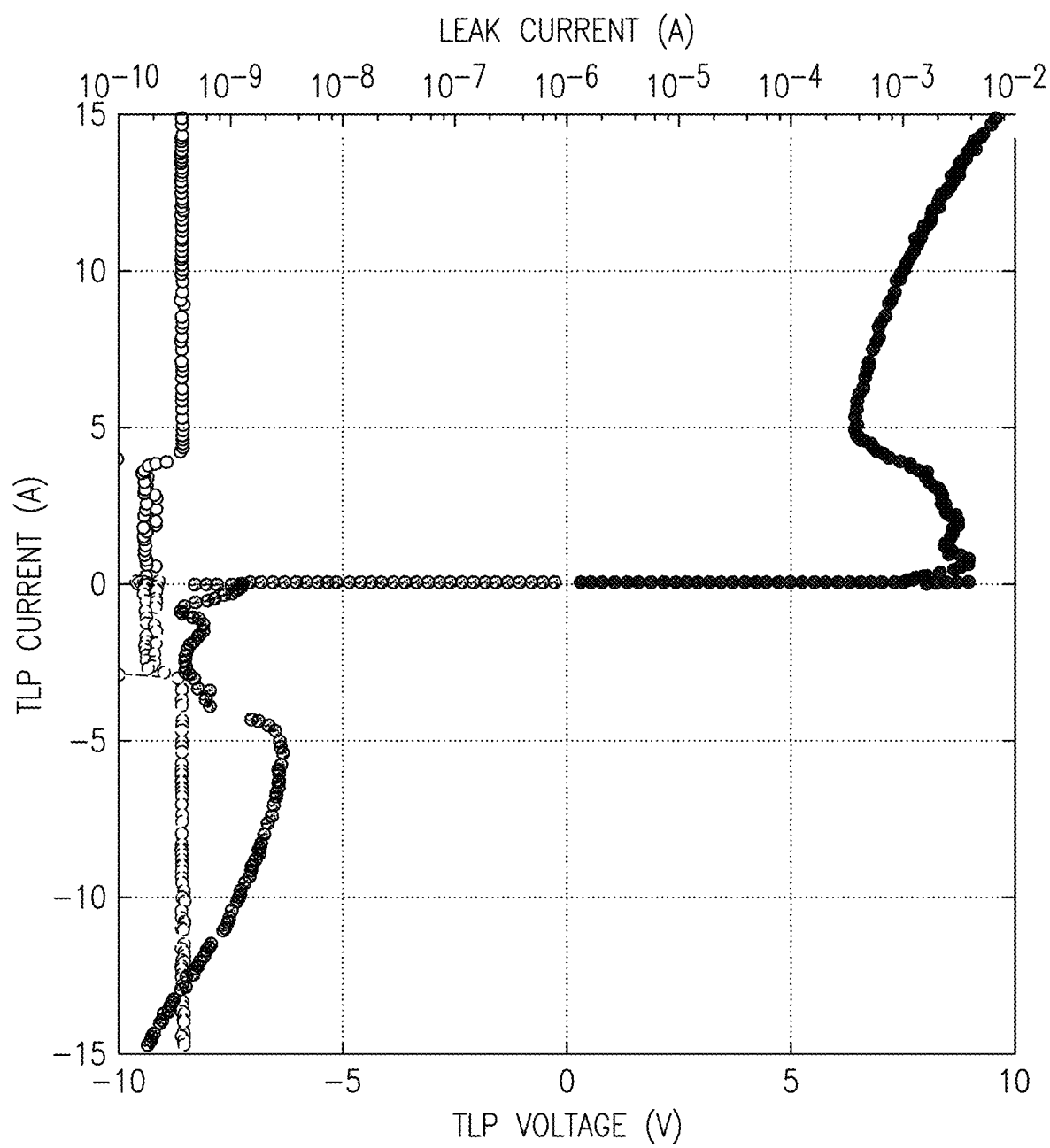
FIG. 6L displays experimental IV curves obtained under HMM high stress 8 kV equivalent test from a bidirectional communication interface protection device illustrated in FIGS. 6A-6D.
Figure 6M:
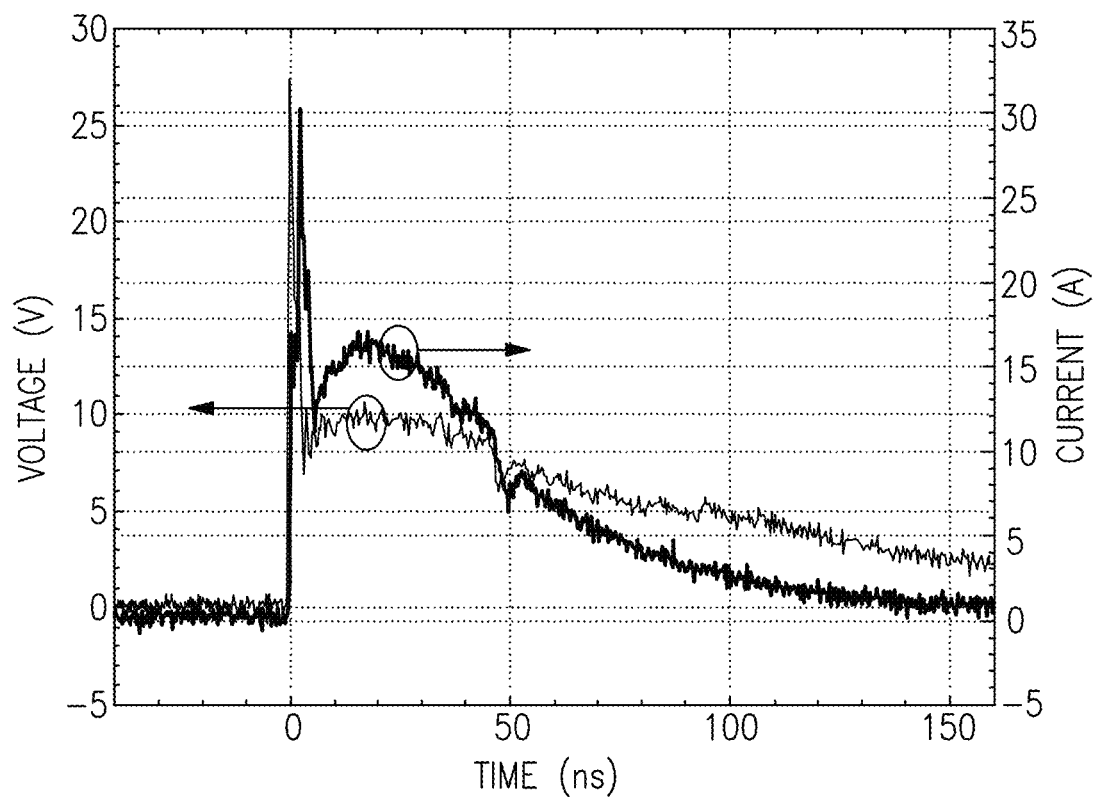
FIG. 6M displays positive waveforms corresponding to the IV curves illustrated in FIG. 6L.
Figure 6N:
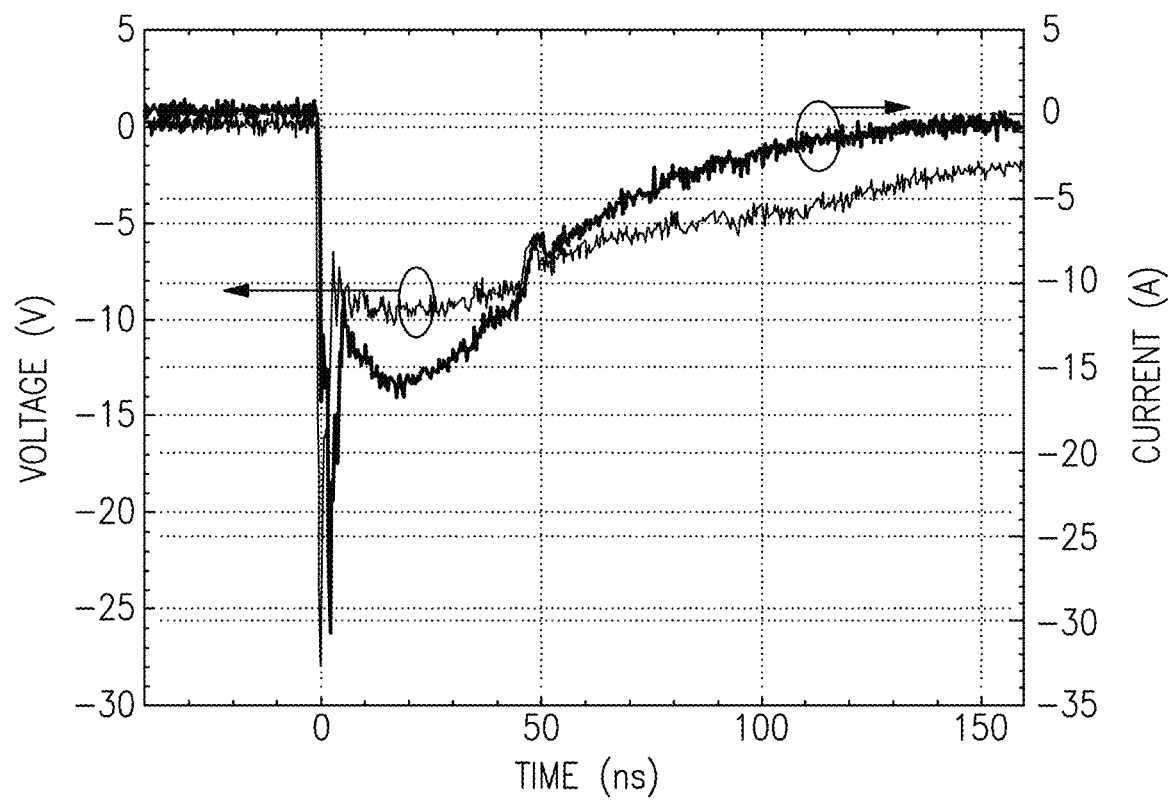
FIG. 6N displays negative waveforms corresponding to the IV curves illustrated in FIG. 6l.
Figure 60:
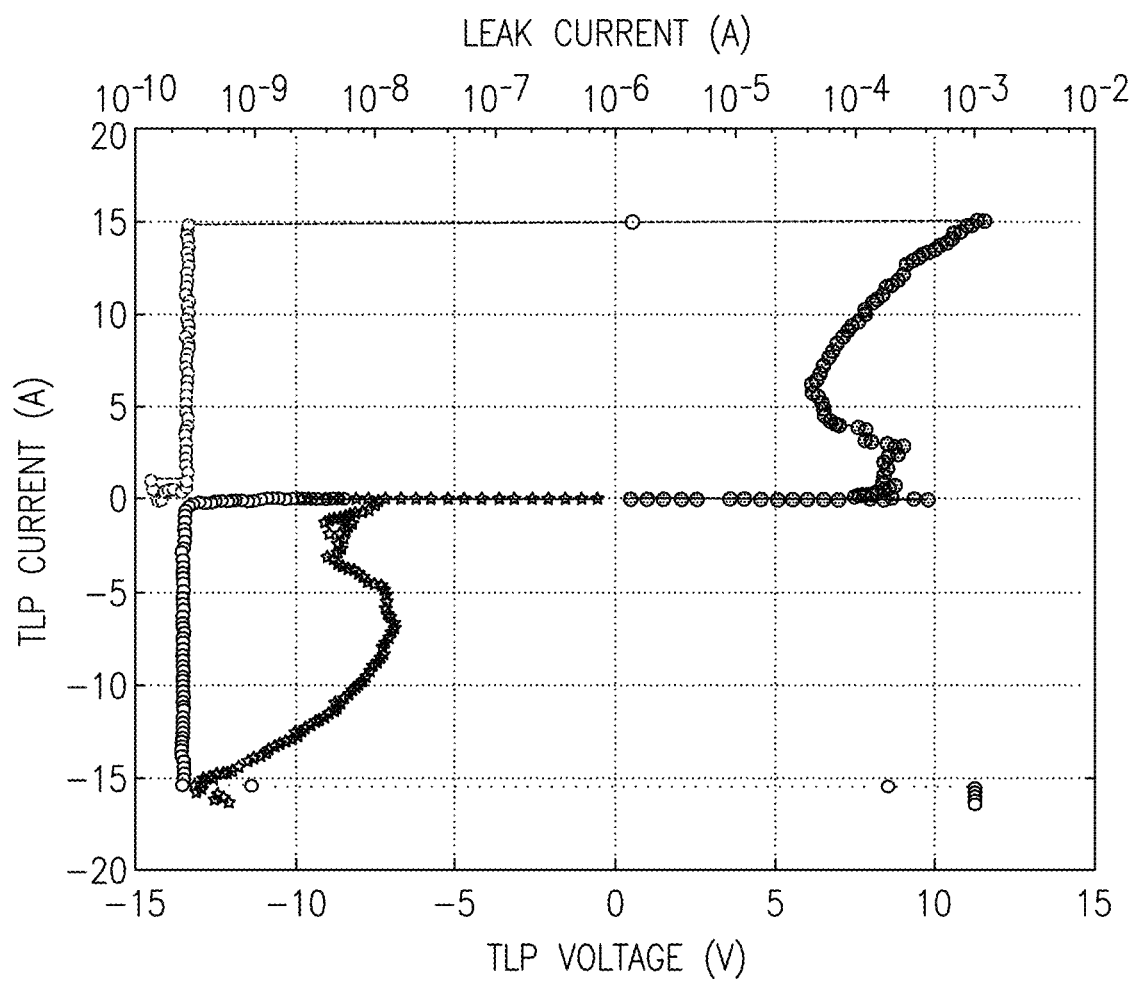
Figure 6P:
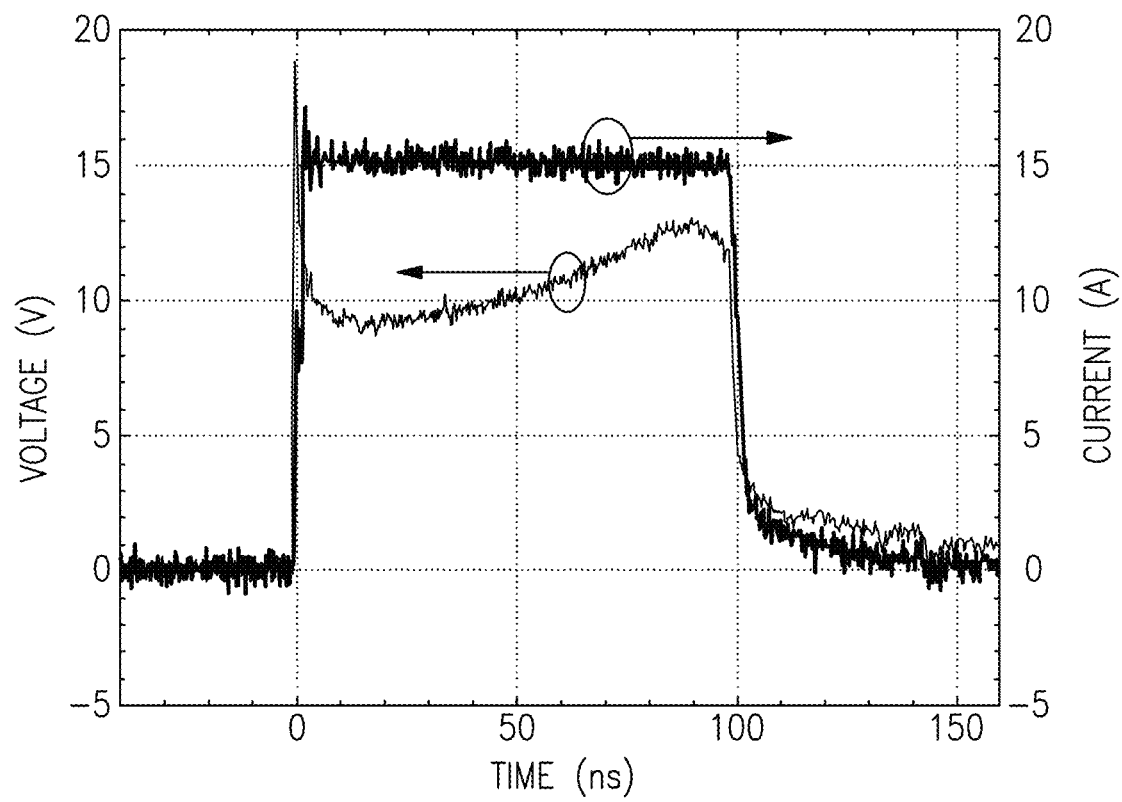
FIG. 6P displays positive waveforms corresponding to the IV curves illustrated in FIG. 6O.
Figure 6Q:
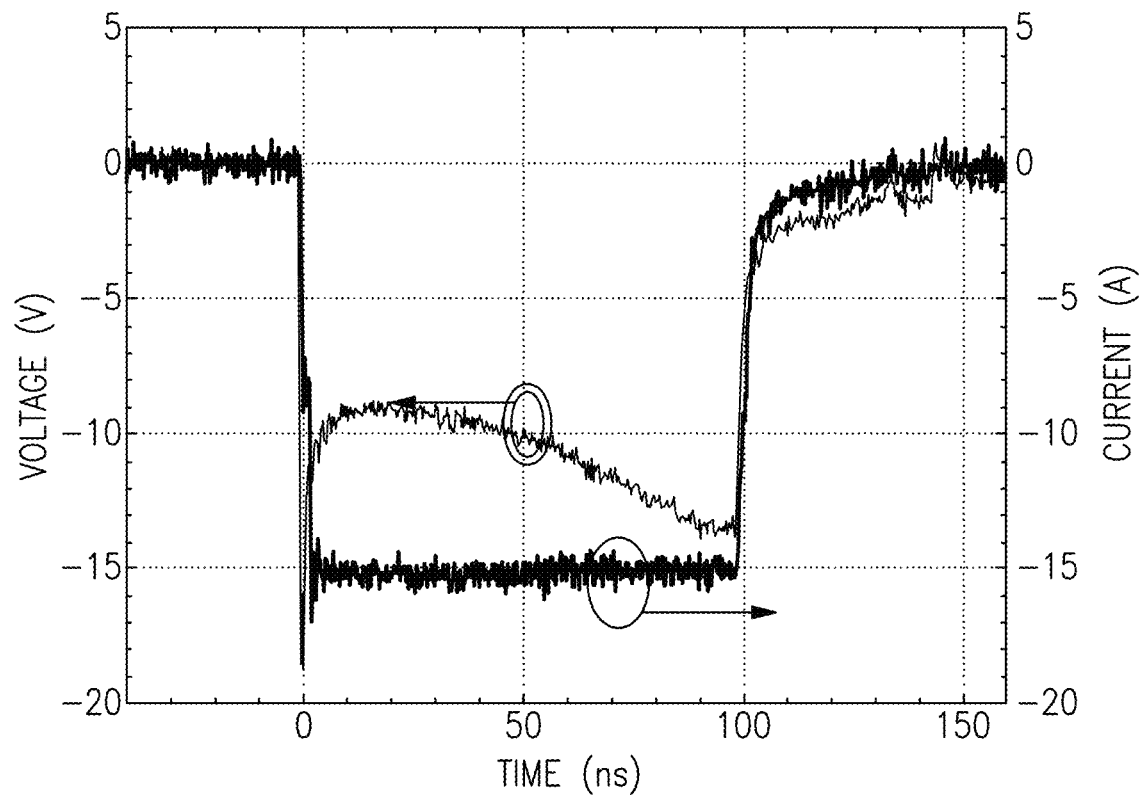
FIG. 6Q displays negative waveforms corresponding to the IV curves illustrated in FIG. 6O.

FIGS. 6K-6Q illustrate experimental measurements obtained from another example implantation of the protection device 600 described above. FIG. 6K displays experimental DC current-voltage (IV) curves obtained at different temperatures, namely at −40° C., 25° C. and 150° C. FIG. 6L displays experimental IV curves obtained under HMM high stress 8 kV equivalent test, and FIGS. 6M and 6N display the corresponding wave forms. FIG. 6O displays experimental IV curves obtained from the protection under transmission line pulse (TLP) testing condition of 100 ns pulse width, and FIGS. 6P and 6Q display the corresponding waveforms.

Figure 7A:
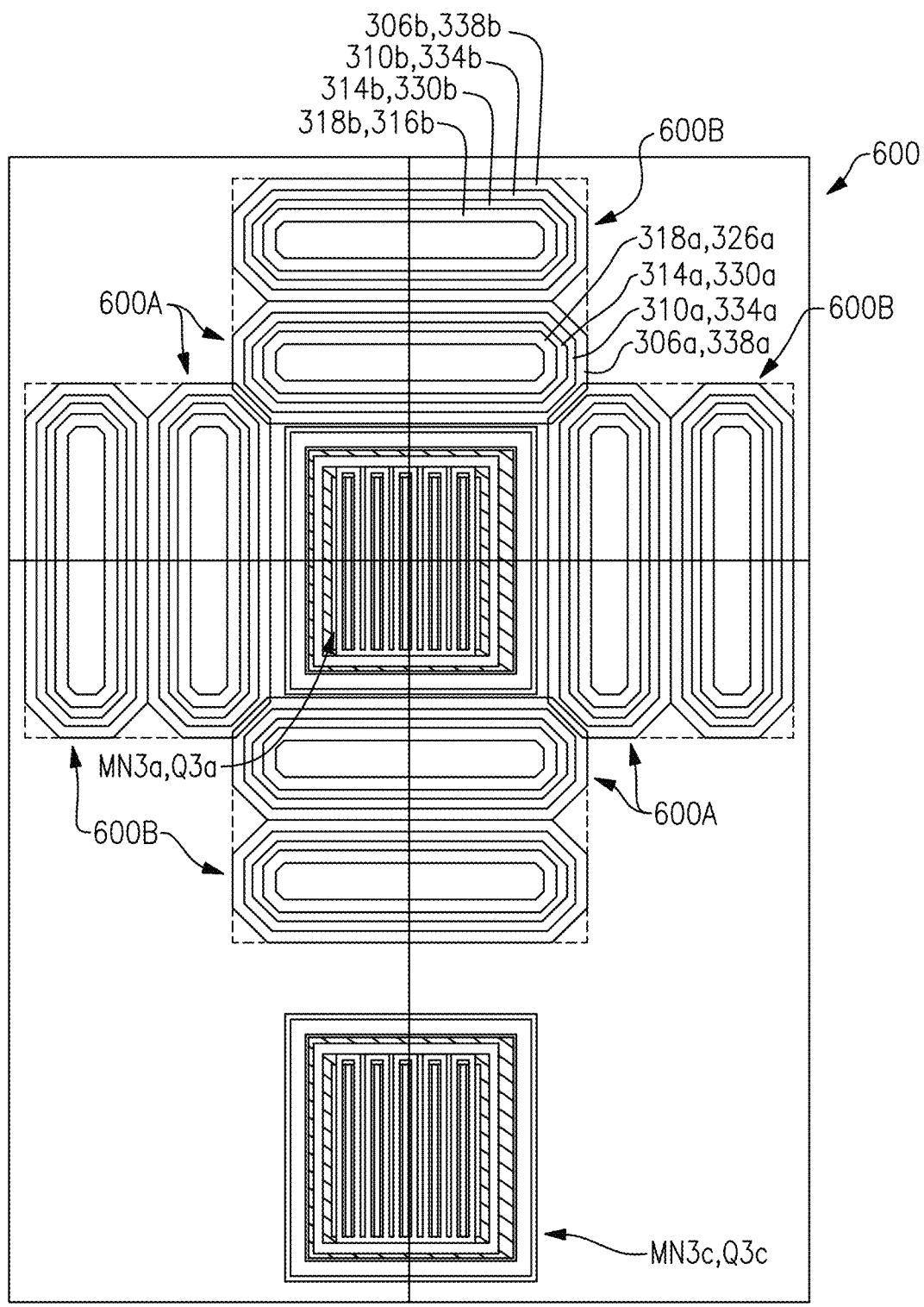
FIG. 7A schematically illustrates a plan view of a bidirectional communication interface protection device having a plurality of first device regions each having well regions arranged in an annular configuration, and a plurality of second device regions each having well regions arranged in an annular configuration, and a plurality of trigger and holding voltage control means, according to embodiments.
Figure 7B:
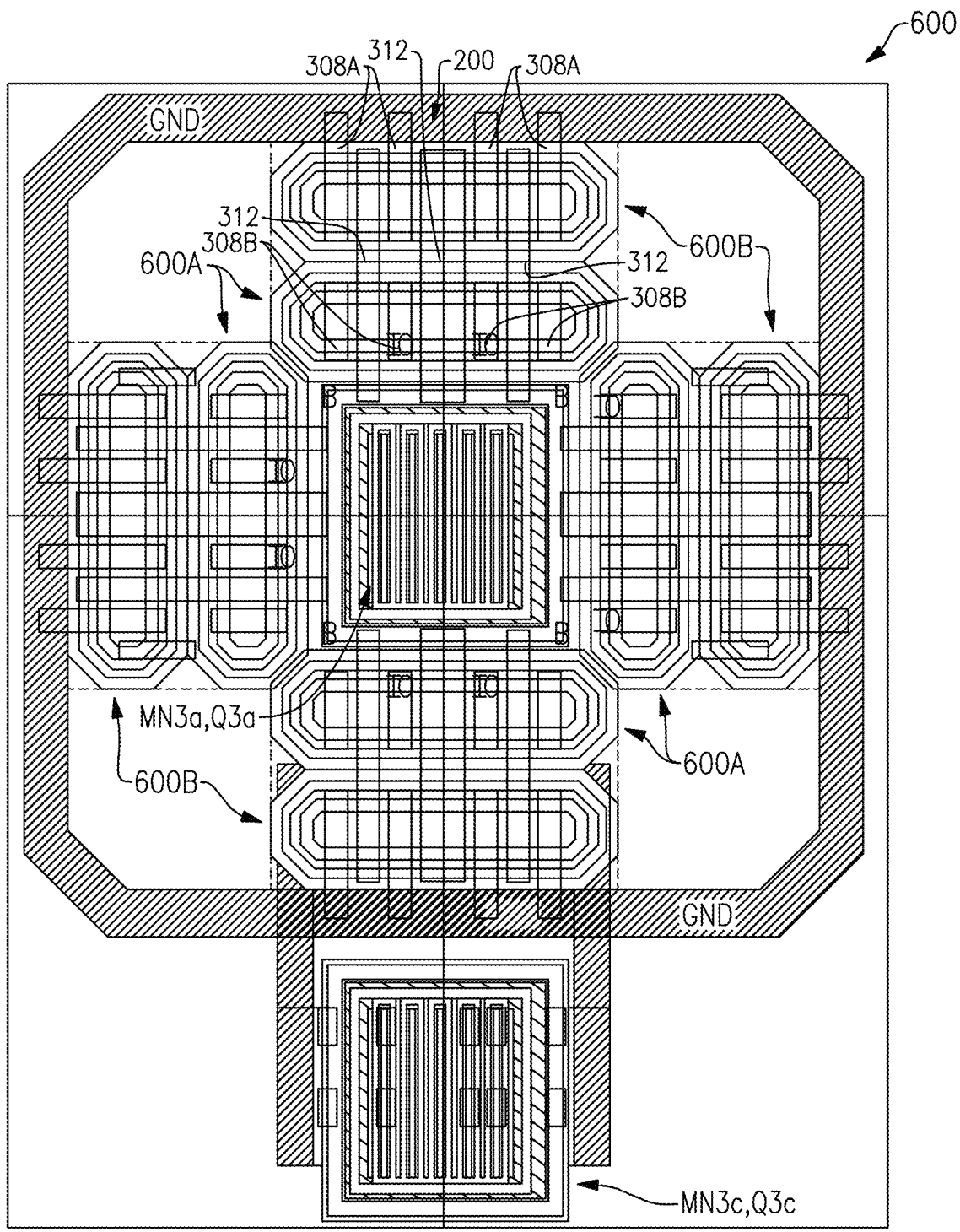
FIG. 7B schematically illustrates a plan view of the bidirectional communication interface protection device illustrated in FIG. 5A including metallization, according to embodiments.

FIGS. 7A and 7B illustrate schematic plan views of a bidirectional communication interface protection device 600, according to some embodiments. In the illustrated embodiment, similar to the protection device 400 described above with respect to FIGS. 5A and 5B, the protection device 700 comprises a plurality of first device regions 600A, which may be arranged as a quadruple annular layout as shown, and a plurality of device regions 600B, which may be arranged as a quadruple layout as shown, where each of the device regions 600A and 600B are arranged to have an annular configuration as described above with respect to FIGS. 2D and 2D. FIG. 7A illustrates a plan view showing PWs and NWs only, of the protection device 600 illustrated in FIGS. 6A-6C, for clarity purposes, and FIG. 7B illustrates the PWs and NWs of protection device 600 along with the first, second, and third metallization paths 308a, 308b and 312. The annular configurations of the PWs, NWs, p+ regions and n+ regions are similar to the corresponding regions described above with respect to FIGS. 2D and 2E, and their detailed description is omitted herein for brevity. In addition, the protection device 700 comprises one of the third or fourth holding voltage adjustment means 620a and 620b that is disposed at a central region of the quadruple annular layout, and the other of the third or fourth holding voltage adjustment means 620a and 620b disposed outside of the quadruple annular layout.

It will be appreciated that in various embodiments described above, bidirectional communication interface protection devices include a first device region and a second device region that may include same or similar features such that they are symmetric. However, embodiments are not so limited, and in other embodiments, the first device region can be configured as any one of first device regions 200A (FIG. 2A), 400A (FIG. 4A) or 600A (FIG. 6A), while the second device region can be configured as a non-corresponding one of second device regions 200B (FIG. 2A), 400B (FIG. 4A) or 600B (FIG. 6A). FIGS. 8A-8D illustrate one such example. FIGS. 8A-8D illustrate a bidirectional communication interface protection device 800, according to some embodiments. The illustrated embodiment is a hybrid between the protection device 400 described above with respect to FIGS. 4A-4C and 5A-5B, and the protection device 600 described above with respect to FIGS. 6A-6C and 7A-7B. In particular, the protection device 800 includes a first device region 800A that is similar to the first device region 600A of the protection device 600, and a second device region 800B that is similar to the second device region 400A of the protection device 400.

Figure 8A:
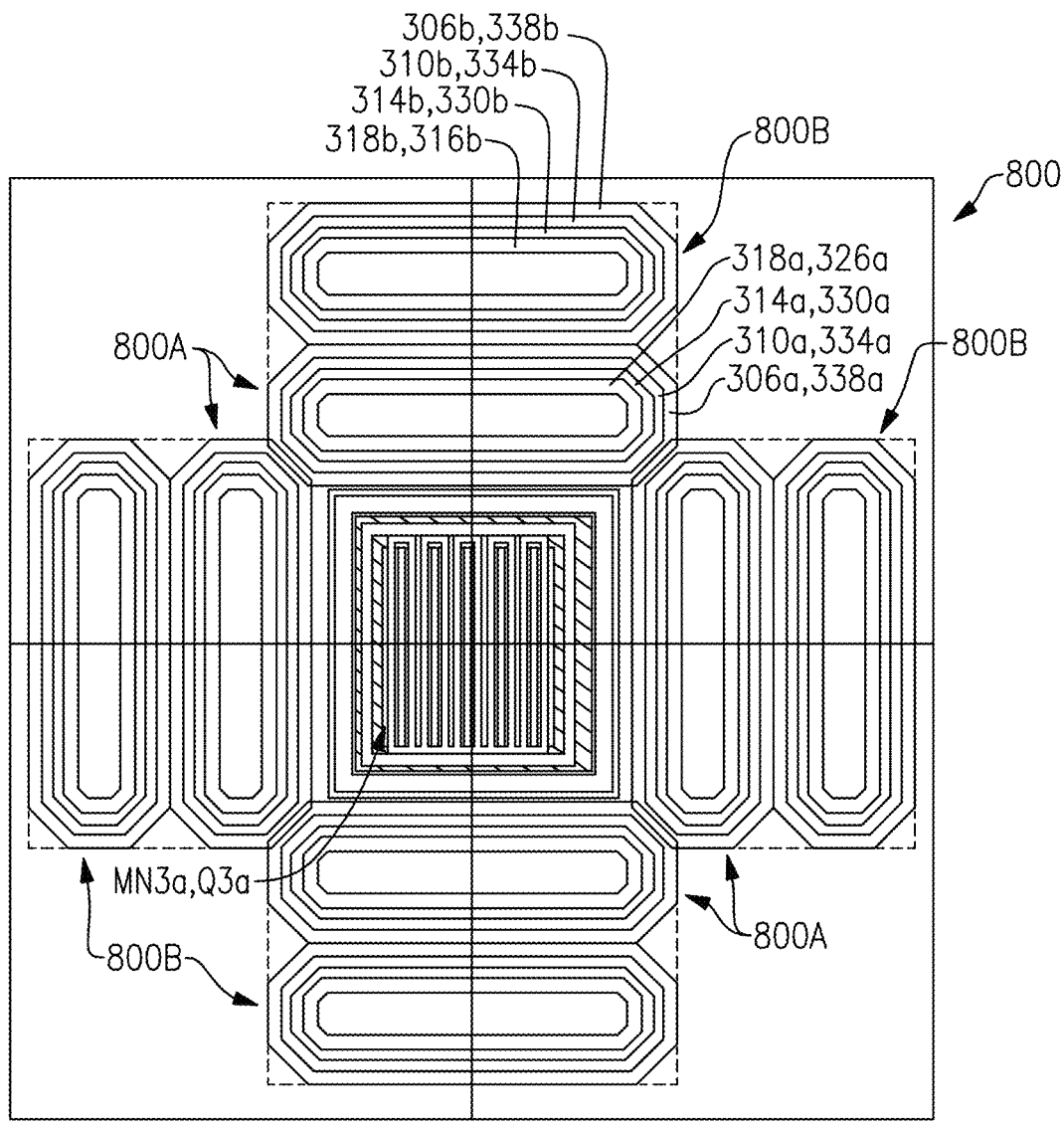
FIG. 8A schematically illustrates a plan view of a bidirectional communication interface protection device having a plurality of first device regions each having well regions arranged in an annular configuration, a plurality of second device regions each having well regions arranged in an annular configuration, and a plurality of trigger and holding voltage control means, according to embodiments.
Figure 8B:
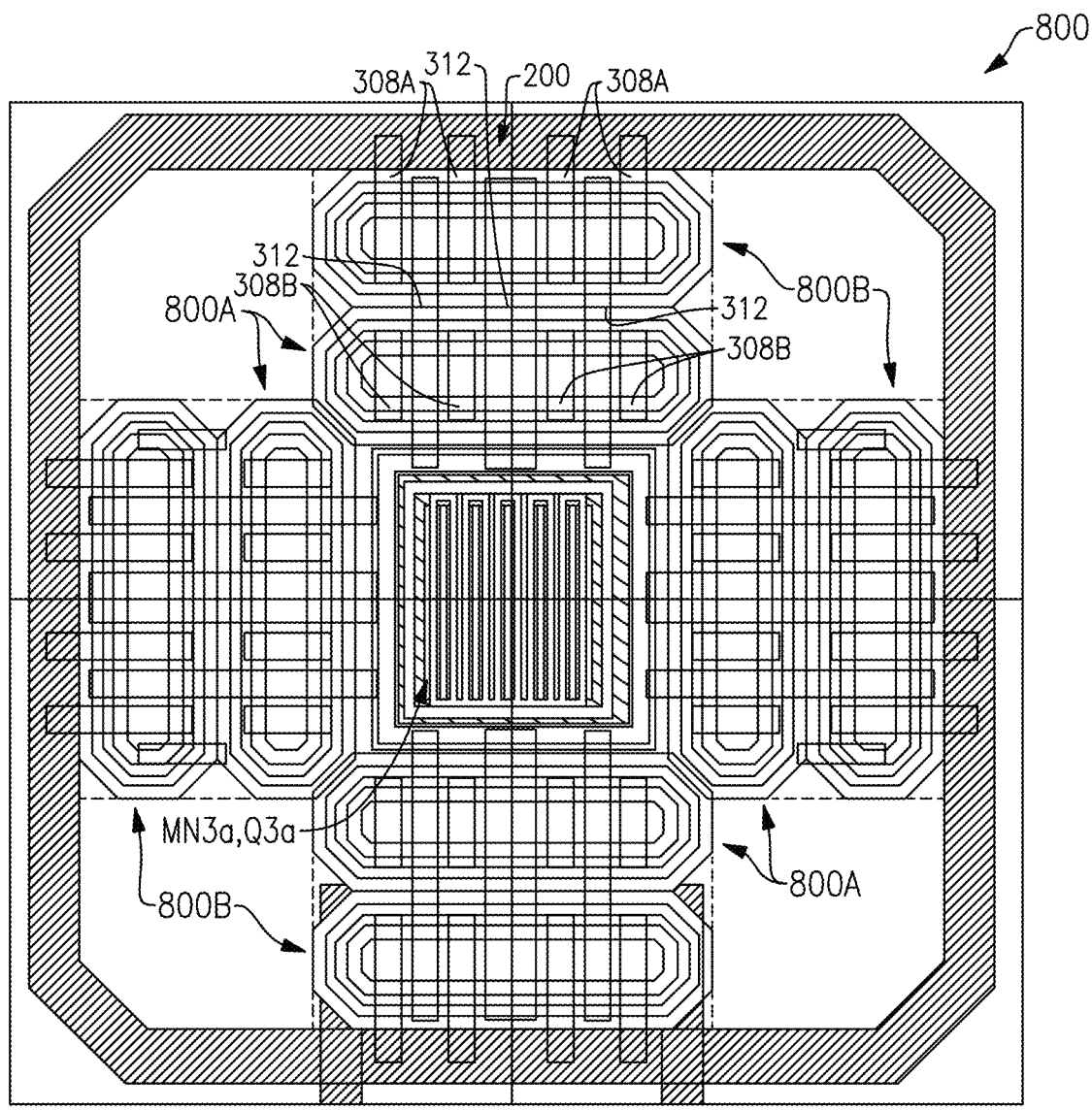
FIG. 8B schematically illustrates a plan view of the bidirectional communication interface protection device illustrated in FIG. 8A including metallization, and a positive-side trigger and holding voltage control means, according to embodiments.

FIGS. 8A and 8B illustrate schematic plan views of the protection device 800, which are similar to the protection device 700 described above with respect to FIGS. 7A and 7B except, one of the third or fourth holding voltage adjustment means 620a and 620b that is disposed outside of the quadruple annular layout is omitted.

Figure 8C:
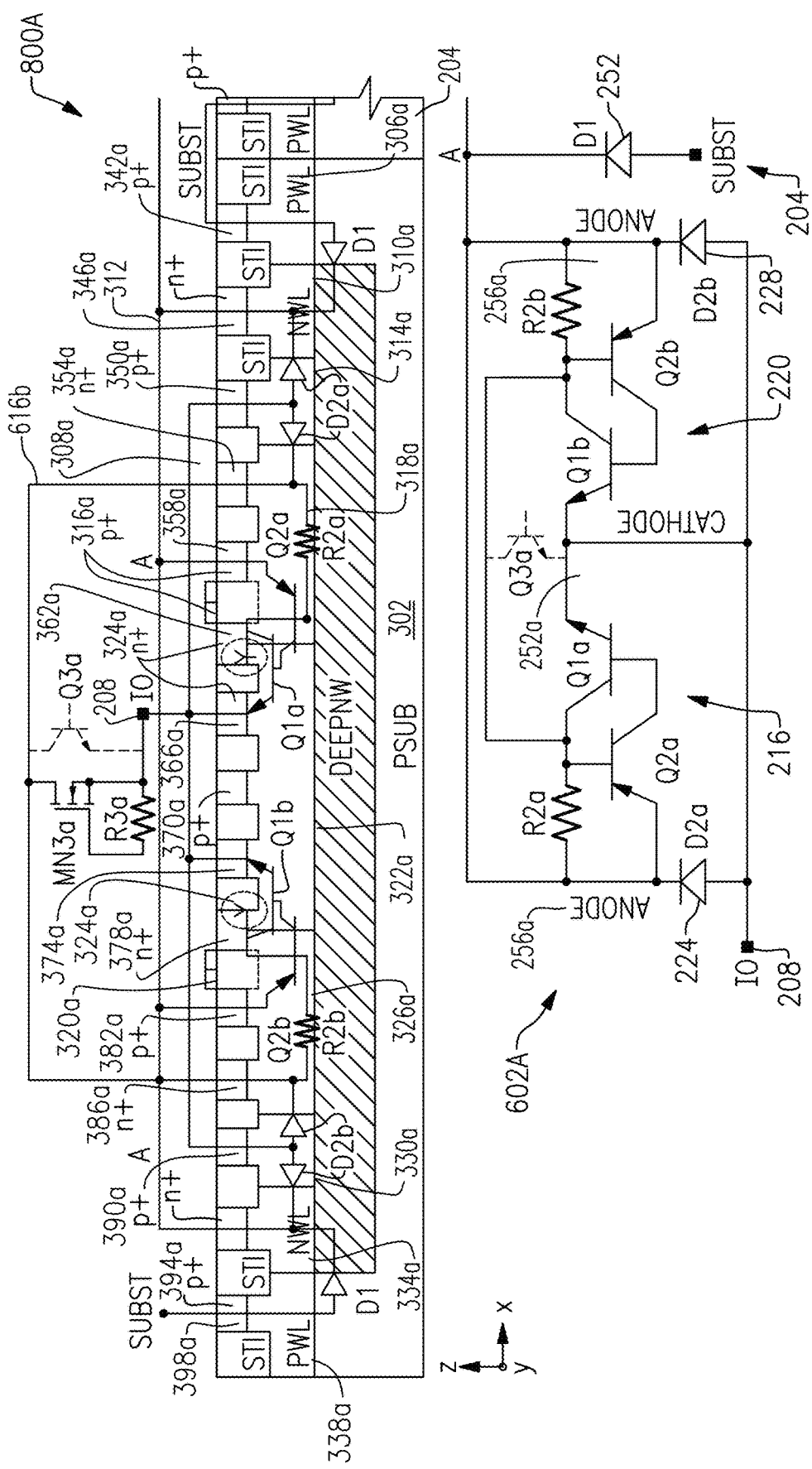
FIG. 8C schematically illustrates a cross-sectional view (top) and a corresponding equivalent circuit diagram (bottom) of a first device region of the bidirectional communication interface protection device illustrated in FIGS. 8A and 8B.
Figure 8D:
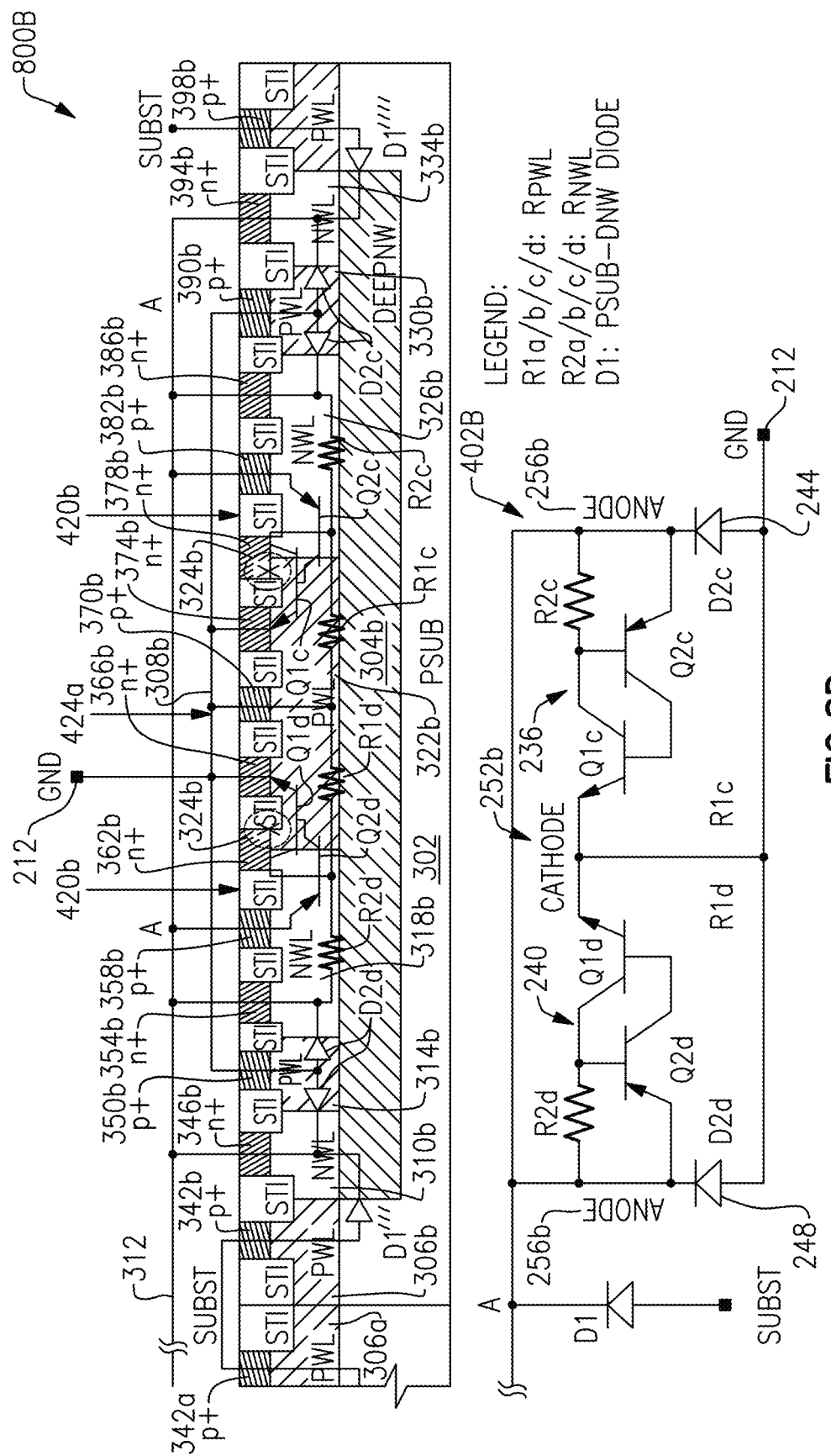
FIG. 8D schematically illustrates a cross-sectional view (top) and a corresponding equivalent circuit diagram (bottom) of a second device region of the bidirectional communication interface protection device illustrated in FIGS. 8A and 8B.

FIGS. 8C and 8D illustrate cross-sectional views of the first and second device regions 800A and 800B, respectively. The first device region 800A illustrated in FIG. 8C is arranged similarly as the first device region 600A illustrated in FIG. 6B, and its detailed description is omitted for brevity. In addition, the second device region 800B illustrated in FIG. 8D is arranged similarly as the second device region 400B illustrated in FIG. 4C, and its detailed description is omitted for brevity.

Figure 8E:
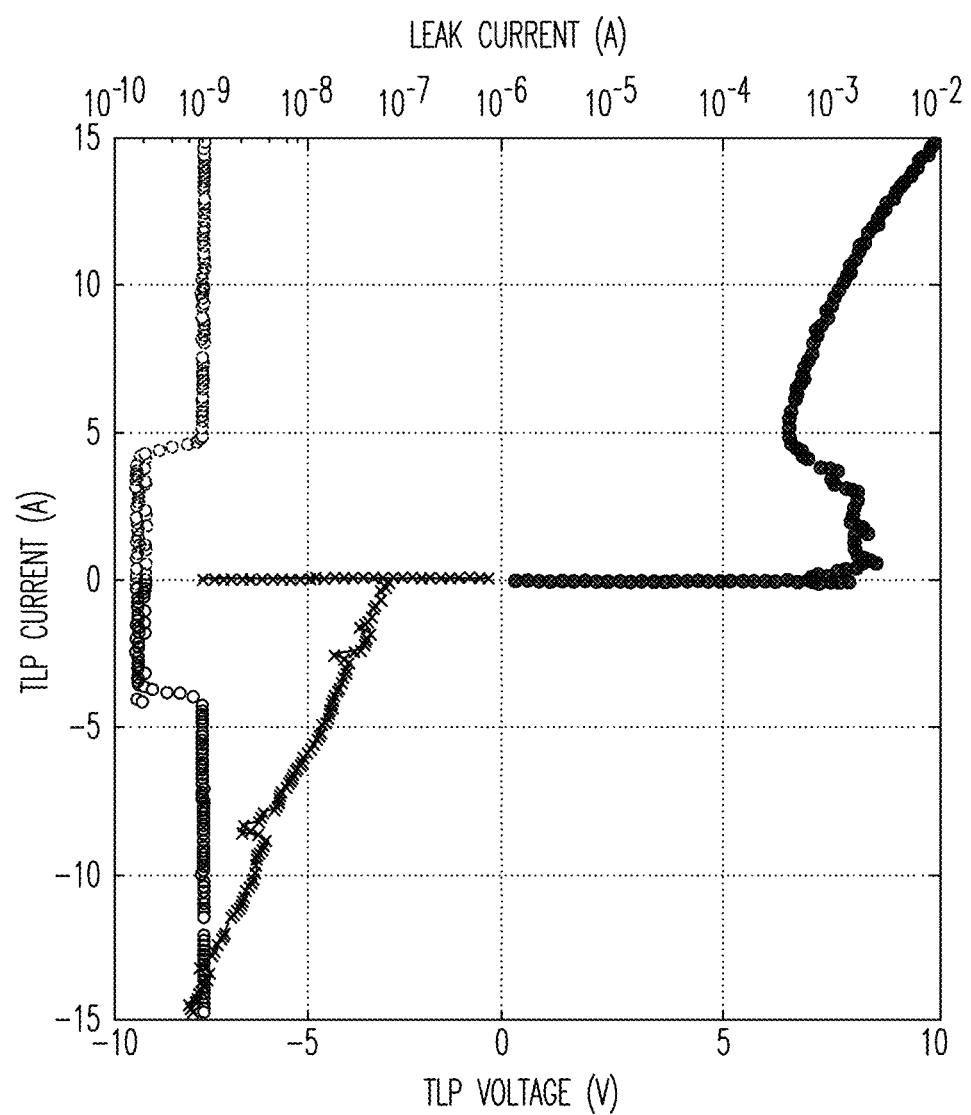
FIG. 8E displays experimental IV curves obtained under 100 ns pulse width transmission line pulse (TLP) testing condition from a bidirectional communication interface protection device illustrated in FIGS. 8A and 8B.

FIG. 8E illustrate experimental IV curves obtained from the protection device 800 under transmission line pulse (TLP) testing condition of 100 ns pulse width.

In the embodiments described above, apparatus, systems, and methods for wear-out monitors are described in connection with particular embodiments. It will be understood, however, that the principles and advantages of the embodiments can be used for any other systems, apparatus, or methods with a need for protection from transient electrical events. In the foregoing, it will be appreciated that any feature of any one of the embodiments can be combined and/or substituted with any other feature of any other one of the embodiments.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," "infra," "supra," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All suitable combinations and subcombinations of features of this disclosure are intended to fall within the scope of this disclosure.

What is claimed is:

1. A communication interface protection device, comprising:
   a first electrical overstress (EOS) protection switch electrically connected to a first terminal and a second EOS protection switch electrically connected to a second terminal,
   wherein each of the first and second EOS protection switches comprises:
      a first semiconductor-controlled rectifier (SCR) and a second SCR, and
      a first diode having a cathode electrically connected to an anode of the first SCR and a second diode having a cathode electrically connected to an anode of the second SCR,
   wherein the first EOS protection device is configured to activate in response to an EOS condition that causes a first bias state between the first and second terminals, and wherein the second EOS protection device is configured to activate in response to an EOS condition that causes a second bias state of opposite polarity to the first bias state between the first and second terminals.

2. The protection device of claim 1, wherein the first EOS protection switch is formed in a first device region formed in a semiconductor substrate, wherein the second EOS protection switch is formed in a second device region formed in the semiconductor substrate, wherein each of the first and second device regions are electrically isolated from the semiconductor substrate by a tub isolation of a first dopant type surrounding a well of a second dopant type.

3. The protection device of claim 1, wherein the first and second SCRs in the first and second EOS protection switches are configured to activate in response to the EOS condition that causes the first and second diodes to be forward-biased.

4. The protection device of claim 3, wherein the anode of the first SCR and the anode of the second SCR are electrically connected through a first metallization path and configured to be at a first potential under the EOS condition.

5. The protection device of claim 4, wherein the cathode of the first SCR and the cathode of the second SCR are electrically connected through a second metallization path and configured to be at a second potential under the EOS condition.

6. The protection device of claim 4, wherein the anodes of the first and second SCRs of the first EOS protection switch and the anodes of the first and second SCRs of the second EOS protection switch are commonly connected through the first metallization path, and wherein a third diode is formed between the first metallization path and a semiconductor substrate that is configured to be reverse-biased under the EOS condition.

7. The protection device of claim 1, wherein each of the first and second SCRs is a PNPN SCR comprising a heavily p-doped ($p^+$) region serving as the anode formed in an n-doped well (NW), and wherein a floating metal layer is formed on the NW adjacent to the $p^+$ region.

8. The protection device of claim 1, wherein each of the first and second SCRs is a PNPN SCR comprising a heavily p-doped ($p^+$) region serving as the anode formed in an n-doped well (NW), and wherein a dielectric isolation region is formed in the NW adjacent to the $p^+$ region.

9. The protection device of claim 1, further comprising an NPN bipolar junction transistor (BJT) electrically connected to one or both of the first and second SCRs.

10. A communication interface protection device, comprising:
a semiconductor substrate having formed therein a first device region and a second device region each electrically isolated from the semiconductor substrate by a tub isolation; and
a first electrical overstress (EOS) protection switch formed in the first device region and a second EOS protection switch formed in the second device region, wherein each of the first and second EOS protection switches comprises:
a first semiconductor-controlled rectifier (SCR) and a second SCR, wherein anodes of the first and second SCRs are commonly connected through a first metallization path and cathodes of the first and second SCRs are commonly connected through a second metallization path,
wherein the second metallization path of the first EOS protection device is connected to a first terminal and the second metallization path of the second EOS protection device is connected to a second terminal, and
wherein the first metallization paths of the first and second EOS protection devices are commonly connected.

11. The protection device of claim 10, wherein the first EOS protection device is configured to be activated in response to an EOS condition that causes a first bias between the first and second terminals, and wherein the second EOS protection device is configured to be activated in response to an EOS condition that causes a second bias between the first and second terminals.

12. The protection device of claim 11, wherein each of the first and second EOS protection devices further comprises a first diode having a cathode electrically connected to the anode of the first SCR and a second diode having a cathode electrically connected to the anode of the second SCR.

13. The protection device of claim 12, wherein cathodes of the first and second diodes of the first EOS protection switch and cathodes of the first and second diodes of the second EOS protection switch are commonly connected through the first metallization path.

14. The protection device of claim 11, wherein each of the first and second SCRs is a PNPN SCR comprising a heavily p-doped ($p^+$) region serving as the anode formed in an n-doped well (NW), wherein a floating metal layer is formed on the NW adjacent to the $p^+$ region.

15. The protection device of claim 11, wherein each of the first and second SCRs is a PNPN SCR comprising a heavily p-doped ($p^+$) region serving as the anode formed in an n-doped well (NW), wherein a dielectric isolation region is formed in the NW adjacent to the $p^+$ region.

16. The protection device of claim 11, further comprising an NPN bipolar junction transistor (BJT) is electrically connected to one or both of the first and second SCRs.

17. The protection device of claim 11, wherein each of the first and second device regions comprise a plurality of p-doped wells and n-doped wells that are arranged in an annular configuration.

18. A communication interface protection device configured to protect an integrated circuit, the protection device comprising:
a first electrical overstress (EOS) protection switch electrically connected to a first terminal and a second EOS protection switch electrically connected to a second terminal,
wherein each of the first and second EOS protection switches comprises:
a first semiconductor-controlled rectifier (SCR) and a second SCR,
a selective activation means for selectively activating the first and second SCRs in response to an EOS condition that causes one but not the other of a positive bias and a negative bias between the first and second terminals, and
a holding voltage adjustment means for adjusting a holding voltage of one or both of the first and SCRs to be lower than an operational voltage of the core circuit.

19. The protection device of claim 18, wherein each of the first and second SCRs is a PNPN SCR comprising a heavily p-doped ($p^+$) region serving as the anode formed in an n-doped well (NW), wherein the holding voltage adjustment means includes one of a floating metal layer formed on the NW adjacent to the $p^+$ region, a dielectric isolation region formed in the NW adjacent to the $p^+$ region, or an NPN open base bipolar junction transistor (BJT) electrically connected to one or both of the first and second SCRs.

20. The protection device of claim 19, wherein the selective activation means comprises a first diode having a cathode electrically connected to an anode of the first SCR and a second diode having a cathode electrically connected to an anode of the second SCR.

21. The protection device of claim 19, further comprising the integrated circuit protected by the protection device, wherein the protection device and the integrated circuit are formed in the same substrate.

22. The protection device of claim 19, further comprising the integrated circuit protected by the protection device, wherein the protection device and the integrated circuit are formed in separate substrates.

* * * * *

UNITED STATES PATENT AND TRADEMARK OFFICE
CERTIFICATE OF CORRECTION

PATENT NO. : 10,700,056 B2  
APPLICATION NO. : 16/125319  
DATED : June 30, 2020  
INVENTOR(S) : Zhao et al.

Page 1 of 1

It is certified that error appears in the above-identified patent and that said Letters Patent is hereby corrected as shown below:

In the Drawings

Figure 2D, sheet 6 of 49, delete the term "316b" and insert --326b--.

Figure 3C, sheet 9 of 49, reference numeral Voltage(V), Line 5, delete "-5" and insert --5--

Figure 4F, sheet 19 of 49, reference numeral Voltage(V), Line 5, delete "-5" and insert --5--.

Figure 5A, sheet 24 of 49, delete the term "316b" and insert --326b--.

Figure 7A, sheet 43 of 49, delete the term "316b" and insert --326b--.

Figure 8A, sheet 45 of 49, delete the term "316b" and insert --326b--.

In the Specification

In Column 4, Line 39, delete "6l." and insert --6L.--.

In Column 6, Line 12, delete "protected" and insert --protected.--.

In Column 7, Line 2, delete "30 A" and insert --30A--.

In Column 10, Line 13, delete "type-region," and insert --p-type region,--.

In Column 17, Line 53, delete "and or" and insert --and/or--.

In Column 24, Line 65, delete "BJT" and insert --BJT.--.

Signed and Sealed this  
Seventeenth Day of November, 2020

Andrei Iancu  
*Director of the United States Patent and Trademark Office*